(12) United States Patent
Huang et al.

(10) Patent No.: US 11,450,653 B2
(45) Date of Patent: Sep. 20, 2022

(54) BONDED THREE-DIMENSIONAL MEMORY DEVICES HAVING BONDING LAYERS

(71) Applicant: YANGTZE MEMORY TECHNOLOGIES CO., LTD., Wuhan (CN)

(72) Inventors: Shiqi Huang, Wuhan (CN); Wei Liu, Wuhan (CN); Bater Chelon, Wuhan (CN); Siping Hu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 147 days.

(21) Appl. No.: 16/739,673

(22) Filed: Jan. 10, 2020

(65) Prior Publication Data
US 2021/0134779 A1    May 6, 2021

Related U.S. Application Data

(63) Continuation of application No. PCT/CN2019/115768, filed on Nov. 5, 2019.

(51) Int. Cl.
*H01L 25/18* (2006.01)
*H01L 23/528* (2006.01)
(Continued)

(52) U.S. Cl.
CPC ............ *H01L 25/18* (2013.01); *H01L 23/528* (2013.01); *H01L 24/03* (2013.01); *H01L 24/08* (2013.01);
(Continued)

(58) Field of Classification Search
CPC ......... H01L 27/11526; H01L 27/11556; H01L 27/11573; H01L 27/11582;
(Continued)

(56) References Cited

U.S. PATENT DOCUMENTS 9,058,856 B2   6/2015 Iwata
10,002,880 B1  6/2018 Nagashima
(Continued)

FOREIGN PATENT DOCUMENTS

CN   108028223 A   5/2018
CN   109155320 A   1/2019
(Continued)

*Primary Examiner* — Khiem D Nguyen
(74) *Attorney, Agent, or Firm* — Baye PLLC

(57) ABSTRACT

Embodiments of bonded 3D memory devices and fabrication methods thereof are disclosed. In an example, a 3D memory device includes a first semiconductor structure and a second semiconductor structure. The first semiconductor structure includes a plurality of first NAND memory strings and a plurality of first BLs. At least one of the first BLs may be conductively connected to a respective one of the first NAND memory strings. The first semiconductor structure also includes a plurality of first conductor layers, and a first bonding layer having a plurality of first bit line bonding contacts conductively connected to the plurality of first BLs and a plurality of first word line bonding contacts conductively connected to the first conductor layers. A second semiconductor structure includes a plurality of second NAND memory strings and a plurality of second BLs.

20 Claims, 24 Drawing Sheets

(51) Int. Cl.
*H01L 23/00* (2006.01)
*H01L 25/065* (2006.01)
*H01L 25/00* (2006.01)
*H01L 27/11526* (2017.01)
*H01L 27/11556* (2017.01)
*H01L 27/11573* (2017.01)
*H01L 27/11582* (2017.01)

(52) U.S. Cl.
CPC .............. *H01L 24/09* (2013.01); *H01L 24/27* (2013.01); *H01L 24/32* (2013.01); *H01L 24/33* (2013.01); *H01L 24/83* (2013.01); *H01L 25/0657* (2013.01); *H01L 25/50* (2013.01); *H01L 27/11526* (2013.01); *H01L 27/11556* (2013.01); *H01L 27/11573* (2013.01); *H01L 27/11582* (2013.01); *H01L 2224/08112* (2013.01); *H01L 2224/08146* (2013.01); *H01L 2224/09181* (2013.01); *H01L 2224/32147* (2013.01); *H01L 2224/33181* (2013.01); *H01L 2224/80895* (2013.01); *H01L 2224/80896* (2013.01); *H01L 2224/83895* (2013.01); *H01L 2224/83896* (2013.01); *H01L 2225/06541* (2013.01); *H01L 2225/06565* (2013.01); *H01L 2924/14511* (2013.01)

(58) Field of Classification Search
CPC ......... H01L 27/11548; H01L 27/11575; H01L 27/11524; H01L 27/1157; H01L 25/18; H01L 25/50; H01L 25/0657; H01L 24/03; H01L 24/08; H01L 24/09; H01L 24/32; H01L 24/33; H01L 24/83; H01L 24/27; H01L 23/528; H01L 23/481; H01L 23/5386
USPC ........................................................ 257/324
See application file for complete search history.

(56) References Cited

U.S. PATENT DOCUMENTS

| | | | |
|---|---|---|---|
| 10,283,493 | B1 | 5/2019 | Nishida |
| 2012/0074466 | A1 | 3/2012 | Setiadi et al. |
| 2012/0088367 | A1 | 4/2012 | Sekar et al. |
| 2012/0307561 | A1 | 12/2012 | Joo et al. |
| 2012/0314468 | A1 | 12/2012 | Siau et al. |
| 2013/0003437 | A1 | 1/2013 | Siau |
| 2013/0134383 | A1 | 5/2013 | Hwang et al. |
| 2014/0241029 | A1 | 8/2014 | Iwata |
| 2016/0336330 | A1 | 11/2016 | Masuoka et al. |
| 2017/0221813 | A1 | 8/2017 | Kim |
| 2018/0047707 | A1 | 2/2018 | Or-Bach et al. |
| 2018/0261623 | A1 | 9/2018 | Higashi et al. |
| 2018/0277497 | A1* | 9/2018 | Matsuo .................. H01L 25/18 |
| 2018/0277517 | A1 | 9/2018 | Kim et al. |
| 2018/0358373 | A1 | 12/2018 | Fukuzumi |
| 2018/0374864 | A1* | 12/2018 | Fukuzumi ............... H01L 24/00 |
| 2019/0051815 | A1 | 2/2019 | Kakinuma et al. |
| 2019/0088676 | A1* | 3/2019 | Tagami ............... H01L 25/0657 |
| 2019/0157288 | A1* | 5/2019 | Huo .................. H01L 27/11529 |
| 2019/0221557 | A1* | 7/2019 | Kim .................. H01L 27/11582 |
| 2019/0296041 | A1 | 9/2019 | Yamasaka et al. |
| 2019/0333927 | A1 | 10/2019 | Fukuzumi et al. |
| 2019/0333929 | A1* | 10/2019 | Lee .................. H01L 27/11565 |
| 2020/0006427 | A1 | 1/2020 | Sato et al. |
| 2020/0321395 | A1 | 10/2020 | Doyle et al. |
| 2020/0357782 | A1 | 11/2020 | Karpov et al. |
| 2021/0082474 | A1 | 3/2021 | Kimura |
| 2021/0104543 | A1 | 4/2021 | Xiao |

FOREIGN PATENT DOCUMENTS

| | | |
|---|---|---|
| CN | 109417075 A | 3/2019 |
| CN | 109768050 A | 5/2019 |
| EP | 3 561 877 A2 | 10/2019 |
| TW | 201931551 A | 8/2019 |

* cited by examiner

BONDED THREE-DIMENSIONAL MEMORY DEVICES HAVING BONDING LAYERS

CROSS-REFERENCE TO RELATED APPLICATIONS

This application is a continuation of International Application No. PCT/CN2019/115768, filed on Nov. 5, 2019, entitled "BONDED THREE-DIMENSIONAL MEMORY DEVICES AND METHODS FOR FORMING THE SAME," which is hereby incorporated by reference in its entirety. This application is also related to U.S. application Ser. No. 16/739,656, filed on Jan. 10, 2020, entitled "BONDED THREE-DIMENSIONAL MEMORY DEVICES AND METHODS FOR FORMING THE SAME," and U.S. application Ser. No. 16/739,666, filed on Jan. 10, 2020, entitled "BONDED THREE-DIMENSIONAL MEMORY DEVICES AND METHODS FOR FORMING THE SAME," all of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a first semiconductor structure and a second semiconductor structure. The first semiconductor structure includes a plurality of first NAND memory strings and a plurality of first bit lines (BLs). At least one of the first BLs may be conductively connected to a respective one of the first NAND memory strings. The first semiconductor structure also includes a plurality of first conductor layers, and a first bonding layer having a plurality of first bit line bonding contacts conductively connected to the plurality of first BLs and a plurality of first word line bonding contacts conductively connected to the first conductor layers. A second semiconductor structure includes a plurality of second NAND memory strings and a plurality of second BLs. At least one of the second BLs may be conductively connected to a respective one of the second NAND memory strings. The second semiconductor structure also includes a plurality of second conductor layers, and a second bonding layer having a plurality of second bit line bonding contacts conductively connected to the plurality of second BLs and a plurality of second word line bonding contacts conductively connected to the second conductor layers. The 3D memory device further includes a bonding interface between the first bonding layer and the second bonding layer. The first bit line bonding contacts may be conductively connected to the second bit line bonding contacts and the first word line bonding contacts are conductively connected to the second word line bonding contacts at the bonding interface.

In another example, a 3D memory device includes a stack structure having a plurality of pairs of bonded semiconductor structures. Each of the pairs includes a first semiconductor structure having a plurality of first NAND memory strings, a plurality of first BLs conductively connected to respective first NAND memory strings, a plurality of first conductor layers, and a first bonding layer having a plurality of first bit line bonding contacts conductively connected to the first BLs and a plurality of first conductor contacts conductively connected to the first conductor layers, respectively. Each of the pairs also includes a second semiconductor structure having a plurality of second NAND memory strings, a plurality of second BLs conductively connected to respective second NAND memory strings, a plurality of second conductor layers, and a second bonding layer having a plurality of second bit line bonding contacts conductively connected to the plurality of second BLs and a plurality of second conductor contacts conductively connected to the second conductor layers, respectively. Each of the pairs also includes a bonding interface between the first bonding layer and the second bonding layer. The first bit line bonding contacts may be in contact with the second bit line bonding contacts and the first word line bonding contacts are in contact with the second word line bonding contacts, respectively. The 3D memory device further includes a third semiconductor structure bonded to and conductively connected to the stack structure. The third semiconductor structure may include a peripheral circuit of at least one pair of bonded semiconductor structures.

In still another example, a method for forming a 3D memory device includes the following operations. First, on a first substrate, a plurality of first NAND memory strings, a plurality of first BLs conductively connected to the first NAND memory strings, a plurality of first conductor layers, and a first bonding layer having a plurality of first bit line bonding contacts are formed conductively connected to the first BLs, and a plurality of first word line bonding contacts are formed conductively connected to the first conductor layers, to form a first semiconductor structure. On a second substrate, a plurality of second NAND memory strings, a plurality of second BLs conductively connected to the second NAND memory strings, a plurality of second conductor layers, and a second bonding layer having a plurality of second bit line bonding contacts are formed conductively connected to the second BLs, and a plurality of second word line bonding contacts are formed conductively connected to the second conductor layers, to form a second semiconductor structure. The first semiconductor structure and the second semiconductor structure are bonded in a face-to-face manner, such that (i) the first semiconductor structure is bonded to the second semiconductor structure, (ii) the first BLs are respectively conductively connected to the second BLs through the bonded first and the second bit line bonding contacts at a bonding interface, and (iii) the first conductor layers are conductively connected to the second conductor layers through the bonded first and second bit line bonding contacts at the bonding interface.

In yet another example, a method for forming a 3D memory device includes alternatingly bonding a plurality of first semiconductor structures and a plurality of second semiconductor structures to form a stack structure having a plurality of pairs of bonded semiconductor structures. BL and conductor layers of at least one pair of bonded semiconductor structures may be conductively connected through bonding. Forming the plurality of bonded semiconductor structures may include bonding a second semiconductor structure with a first semiconductor in a face-to-face manner to form a pair of bonded semiconductor structures, the second semiconductor structure being above the first semiconductor structure. Forming the plurality of bonded semiconductor structures may also include bonding another first semiconductor structure with the pair of bonded semiconductor structures, the another first semiconductor structure facing up. Forming the plurality of bonded semiconductor structures may also include bonding another second semiconductor structure with the another first semiconductor structure in a face-to-face manner to form another pair of bonded semiconductor structures, the pair and the another pair being bonded in a back-to-back manner.

In yet another example, a 3D memory device includes a first semiconductor structure having a plurality of first NAND memory strings, a plurality of first BLs, at least one of the first BLs being conductively connected to a respective one of the first NAND memory strings, a plurality of first conductor layers, and a first bonding layer having a plurality of first bit line bonding contacts conductively connected to the plurality of first BLs and a plurality of first word line bonding contacts conductively connected to the first conductor layers. The 3D memory device also includes a second semiconductor structure having a plurality of second NAND memory strings, a plurality of second BLs, at least one of the second BLs being conductively connected to a respective one of the second NAND memory strings, a plurality of second conductor layers, and a second bonding layer having a plurality of second bit line bonding contacts conductively connected to the plurality of second BLs, and a plurality of second word line bonding contacts conductively connected to the second conductor layers. The 3D memory device also includes a third semiconductor structure between the first and second bonding layers and having a peripheral circuit of the first and second NAND memory strings, the first bit line bonding contacts being conductively connected to the second bit line bonding contacts, and the first word line bonding contacts being conductively connected to the second word line bonding contacts through and to the third semiconductor structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
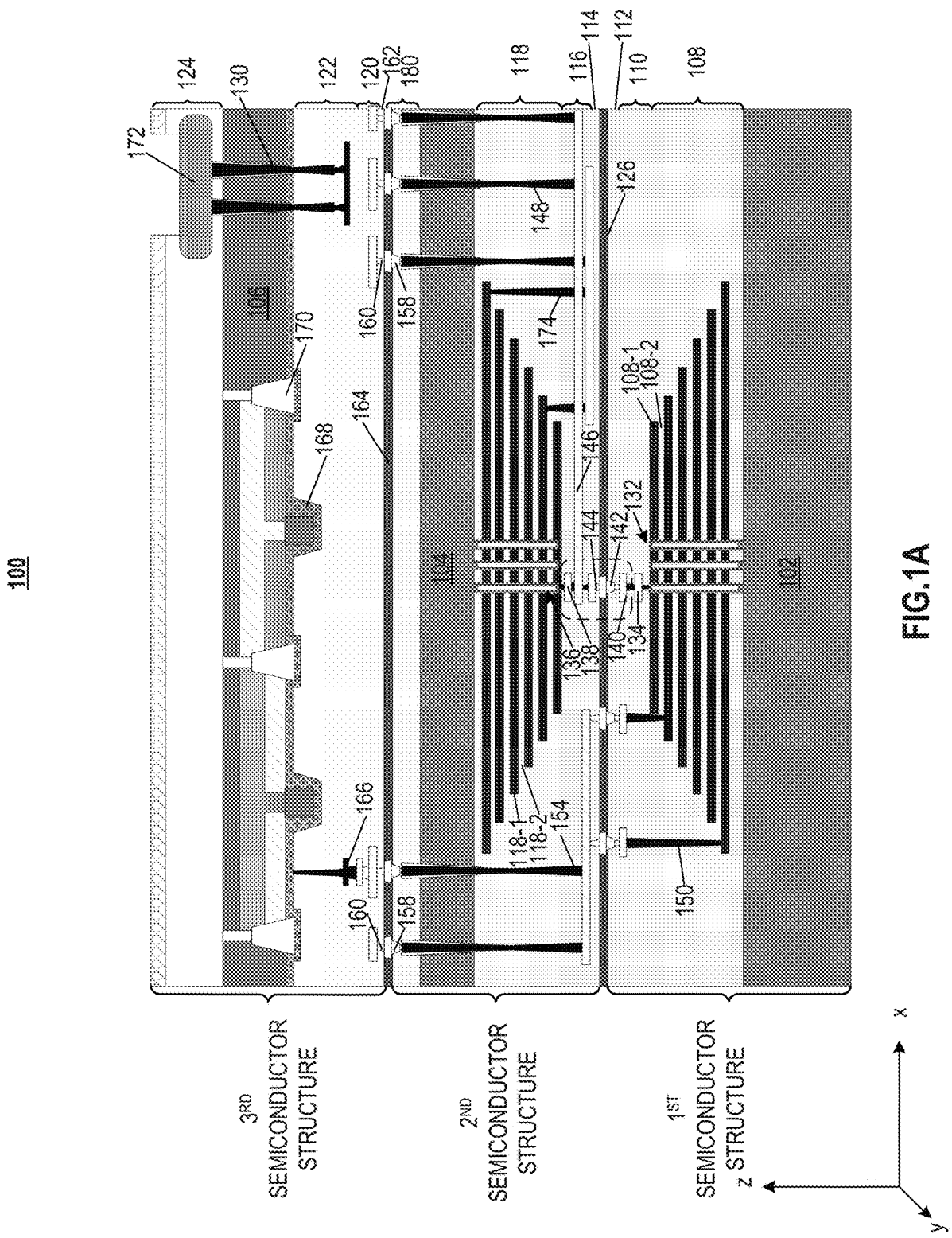
FIG. 1A illustrates a schematic view of a cross-section of an exemplary bonded 3D memory device having bit lines (BLs) routed and conductively connected through bonding, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, a "wafer" is a piece of a semiconductor material for semiconductor devices to build in and/or on it and that can undergo various fabrication processes before being separated into dies.

As 3D NAND memory devices continue to scale up vertically (e.g., having 96-layers or more), it may not be feasible to enable one-step etching of high aspect ratio structures, such as channel holes and gate line slits (GLSs), due to dry etching challenges. Especially, for small-size patterns like channel holes, critical dimension (CD) control can be challenging. On the other hand, higher voltages are desired to program and erase memory cells due to limited carrier transport rate in semiconductor channels with increases lengths. Currently, reducing the thicknesses of conductor/dielectric pairs and stacking multiple decks in a memory stack have been used to increase the number of WLs (conductor layers). However, reducing the thicknesses of conductor/dielectric pairs can result in undesirable coupling between adjacent memory cells.

Stacking multiple decks often includes corresponding parts of the decks to be aligned with one another vertically to form direct bonding at the bonding interface. For example, in related art, each memory string in one deck is aligned and bonded with the corresponding memory string in another deck at the bonding interface so that the memory strings in the bonded decks can be conductively connected. The bit line bonding contacts conductively connected to the BLs (e.g., also memory strings) are vertically aligned with the respective memory strings. In another example, the conductive connection of WLs in the two decks require direct aligning and bonding of WLs in the two decks, and word line bonding contacts conductively connected to and vertically aligned with the WLs can be bonded at the bonding interface. The direct alignment and bonding of the memory strings and WLs require high alignment precision to control the overlay between the memory strings and between the WLs in adjacent decks. The distribution and/or layout of the bonding contacts are limited by the dimensions of the memory strings/WLs and/or spacing between adjacent memory strings/WLs, making it challenging to achieve high yield in the fabrication. The existing alignment and bonding methods for forming multi-deck bonded semiconductor device can impair product yield and thus need to be improved.

Various embodiments in accordance with the present disclosure provide bonded 3D memory devices having one or more pairs of bonded semiconductor structures. In each pair, corresponding parts in the two semiconductor structures (e.g., a first semiconductor structure and a second semiconductor structure) are routed to a desired bonding region to be bonded, instead of being directly aligned and bonded at the bonding interface in related art. In each pair, the two semiconductor structures are bonded in a face-to-face manner. The corresponding parts in the two semiconductor structures can be conductively connected to respective conductive routings, which route/extend the parts to the bonding region. Bonding contacts of the two semiconductor structures, conductively connect the respective conductive routings, can be bonded at a bonding interface. Accordingly, the corresponding parts in the two semiconductor structures can be conductively connected through conductive routings and bonding contacts at the bonding region. The conductive connection of the corresponding parts in the two semiconductor structures thus does not require direct aligning and bonding the corresponding parts at the bonding interface. The peripheral circuits and any logic process-compatible devices for controlling the operations of each pair of bonded semiconductor structures, can be integrated into another semiconductor structure, e.g., a third semiconductor structure, that is bonded to the one or more pairs.

The layouts of the conductive routings and bonding contacts can be flexibly determined to accommodate the layouts of other structures/devices in the semiconductor structures and facilitate easier bonding at the bonding interface. Compared to existing bonding and stacking processes that require direct aligning and bonding of corresponding parts in the semiconductor structures, in the present disclosure, the bonding of the semiconductor structures only requires the alignment of bonding contacts at the bonding interface. The alignment precision required for bonding can be lower. The location, distribution, and/or dimensions of bonding contacts are less limited by the space and location of the corresponding structures in the semiconductor structures and can be optimized to facilitate easy alignment and bonding. The two semiconductor structures can be formed using any suitable fabrication processes, e.g., existing fabrication processes, to maintain the yield and desirable material/electrical properties. In some embodiments, bonding the semiconductor structures in a face-to-face manner can minimize the number and complexity of conductive routings. The fabrication of the pair of bonded semiconductor structures can be easier while maintaining a desirable yield.

In the examples of the present disclosure, the two semiconductor structures that are bonded as a pair each include a memory stack. BLs and/or WLs, in the two semiconductor structures, are respectively routed and bonded at the bonding interface in a desired bonding region. The bonding of BLs can conductively connect memory strings in the two semiconductor structures, and the bonding of WLs can conductively connect the WLs (e.g., conductor layers) in the two semiconductor structures. The memory strings in the two semiconductor structures can be formed using any suitable etching process such as one-step etching to form the channel holes, followed by filling up the channel holes with suitable channel-forming materials. The fabrication of the memory strings in the pair can maintain yield, and carrier transport rate in the semiconductor channels can maintain the desirable transport rate.

In some examples, more than one pairs of bonded semiconductor structures are bonded in a back-to-back manner in a bonded 3D memory device. In each pair, BLs and/or WLs of the two semiconductor structures are bonded. The peripheral circuits (or other logic process-compatible devices) of all the semiconductor structures in the bonded 3D memory device can be integrated into one semiconductor structure that is formed on one side of the bonded 3D memory device. The chip size of the bonded 3D memory device can be reduced.

Figure 1B:
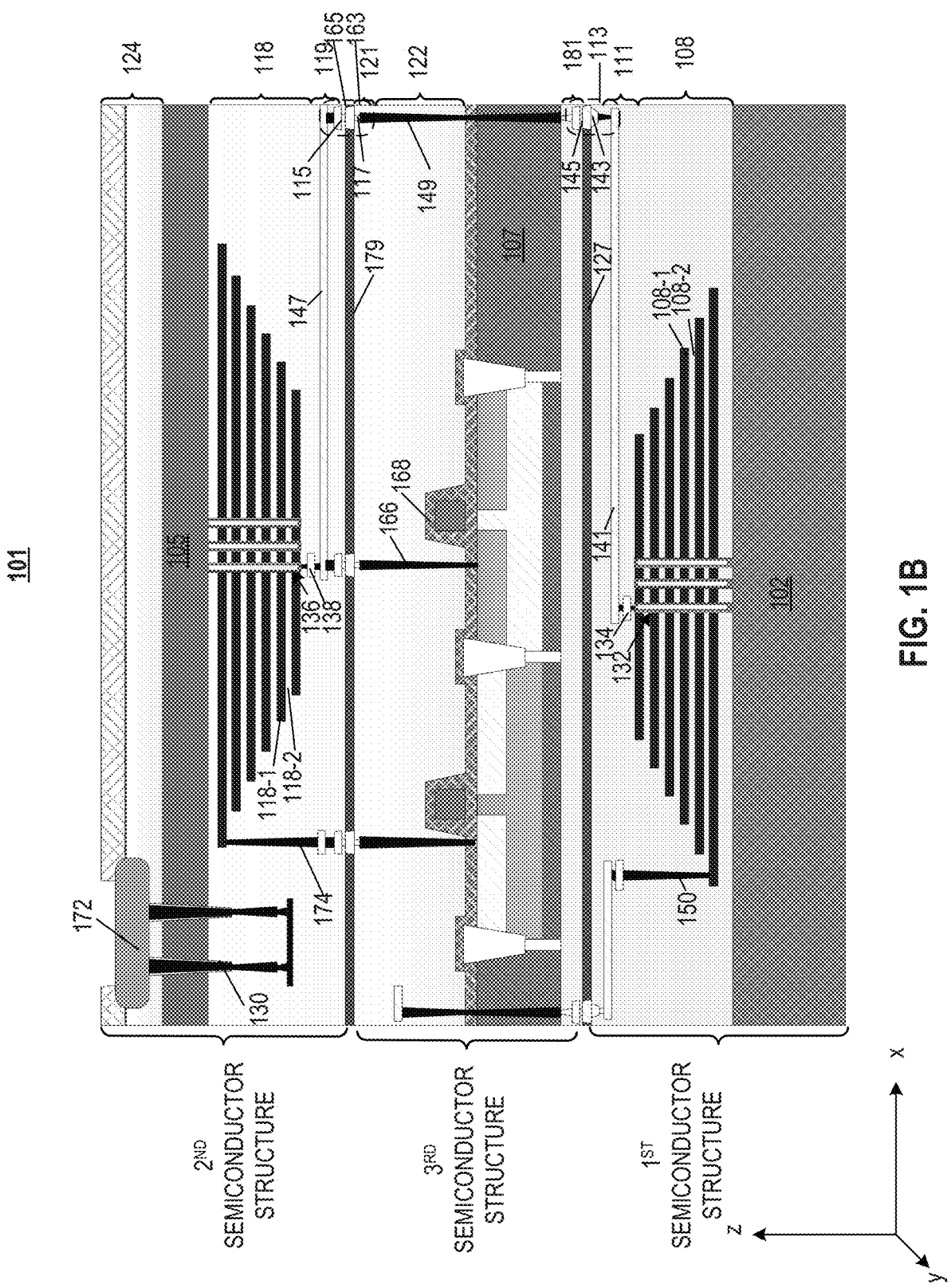
FIG. 1B illustrates a schematic view of a cross-section of another exemplary bonded 3D memory device having BLs routed and conductively connected through bonding, according to some embodiments.
Figure 2A:
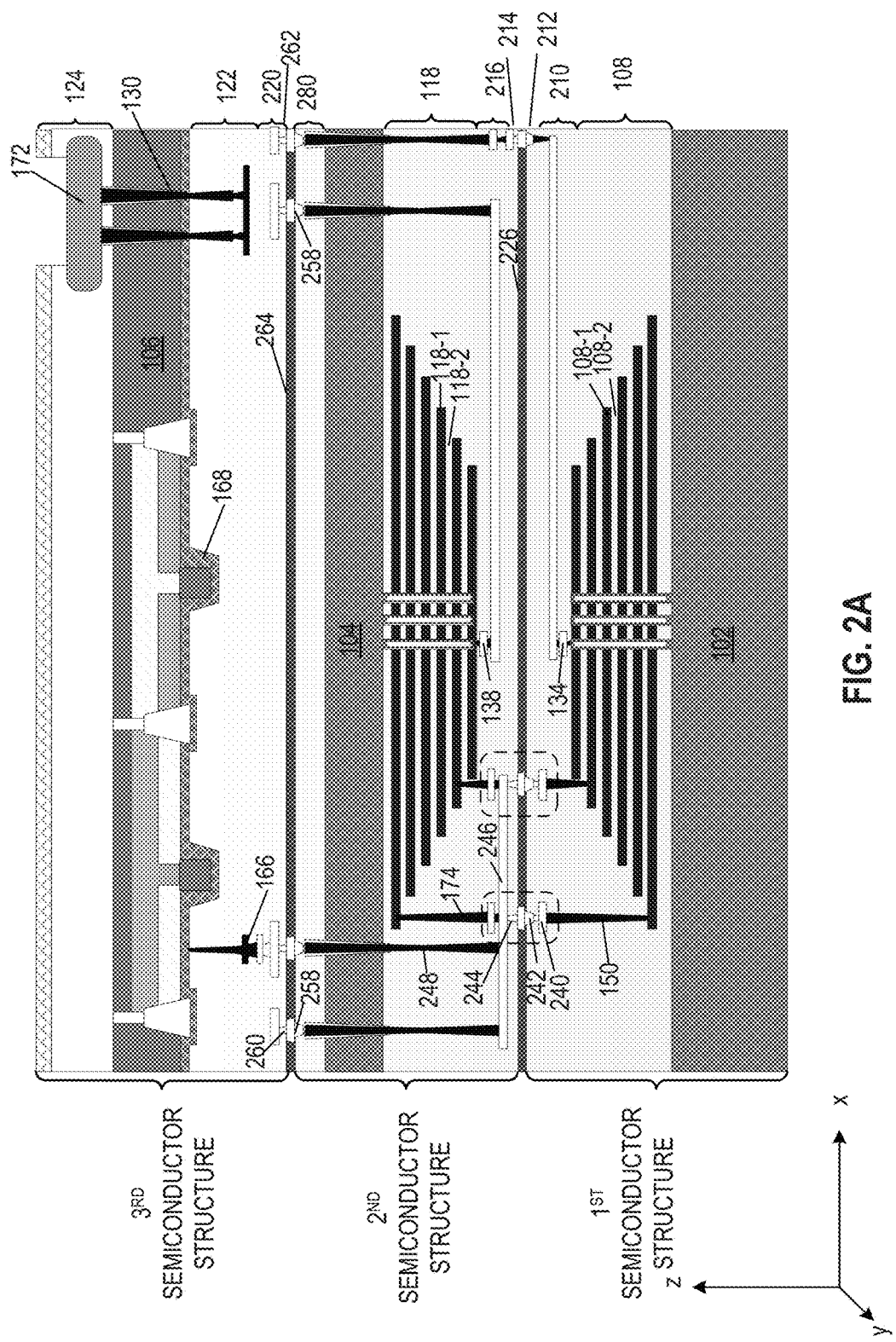
FIG. 2A illustrates a schematic view of a cross-section of an exemplary bonded 3D memory device having word lines (WLs) routed and conductively connected through bonding, according to some embodiments.
Figure 2B:
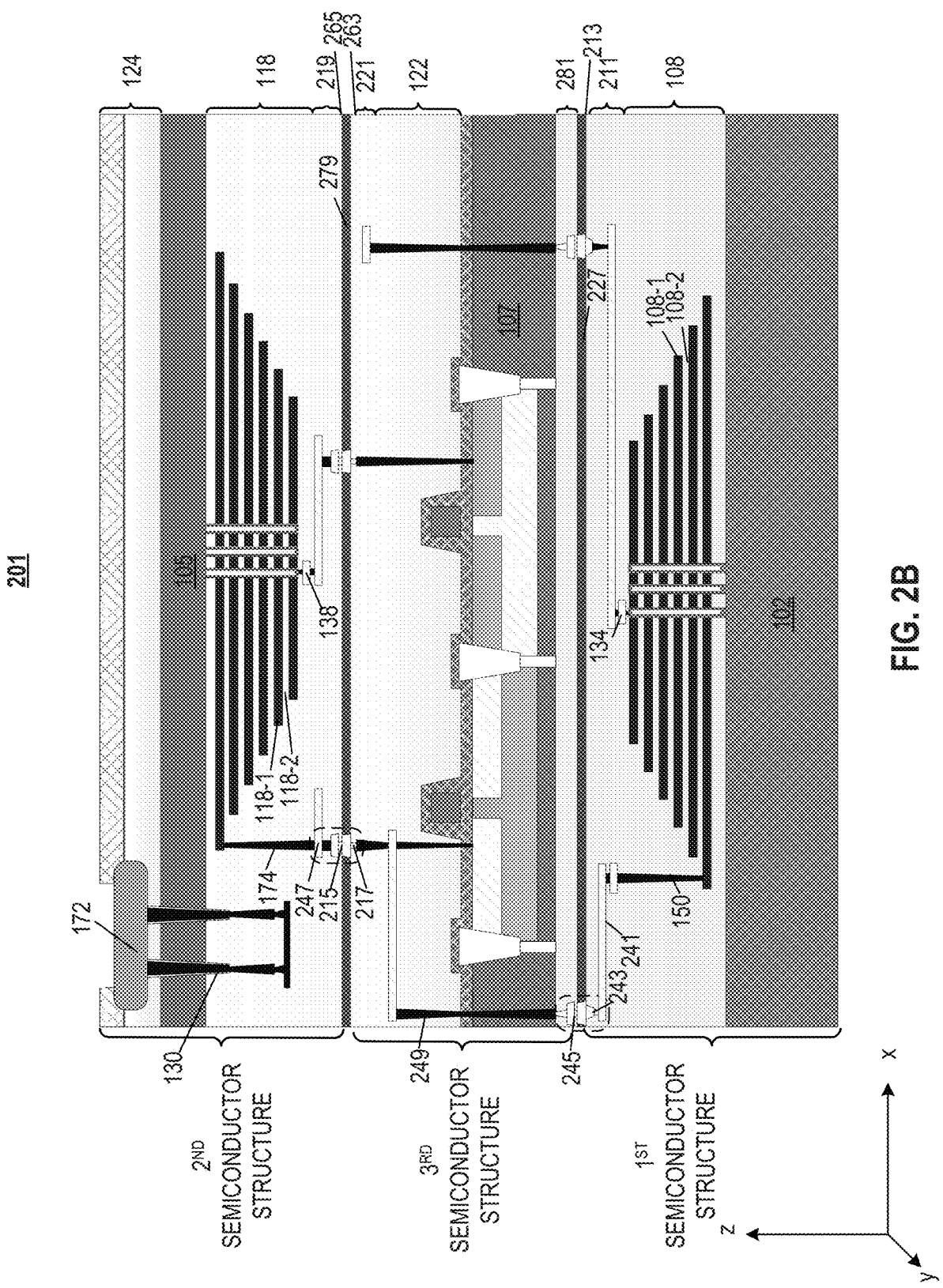
FIG. 2B illustrates a schematic view of a cross-section of another exemplary bonded 3D memory device having WLs routed and conductively connected through bonding, according to some embodiments.
Figure 3A:
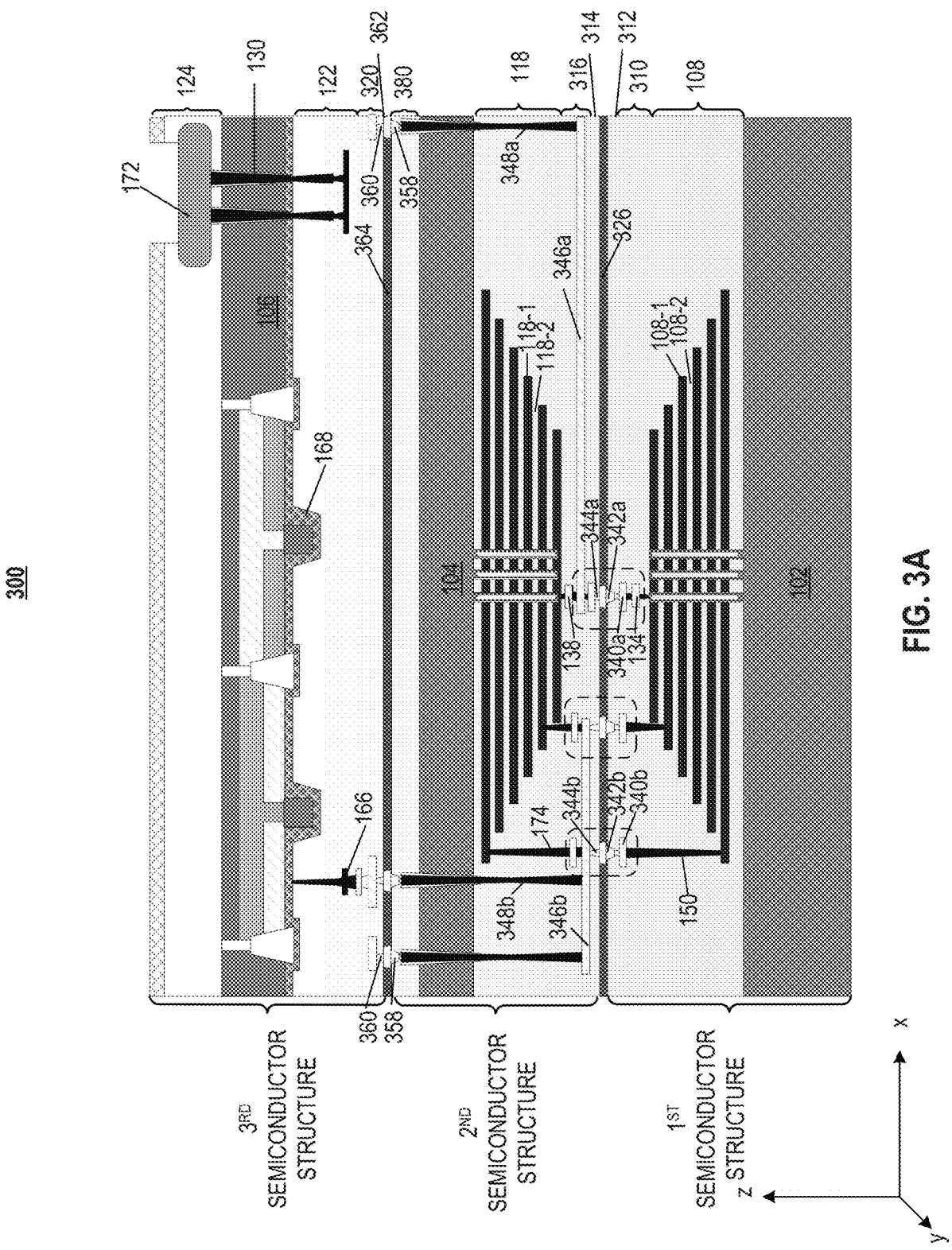
FIG. 3A illustrates a schematic view of a cross-section of an exemplary bonded 3D memory device having BLs and WLs respectively routed and conductively connected through bonding, according to some embodiments.
Figure 3B:
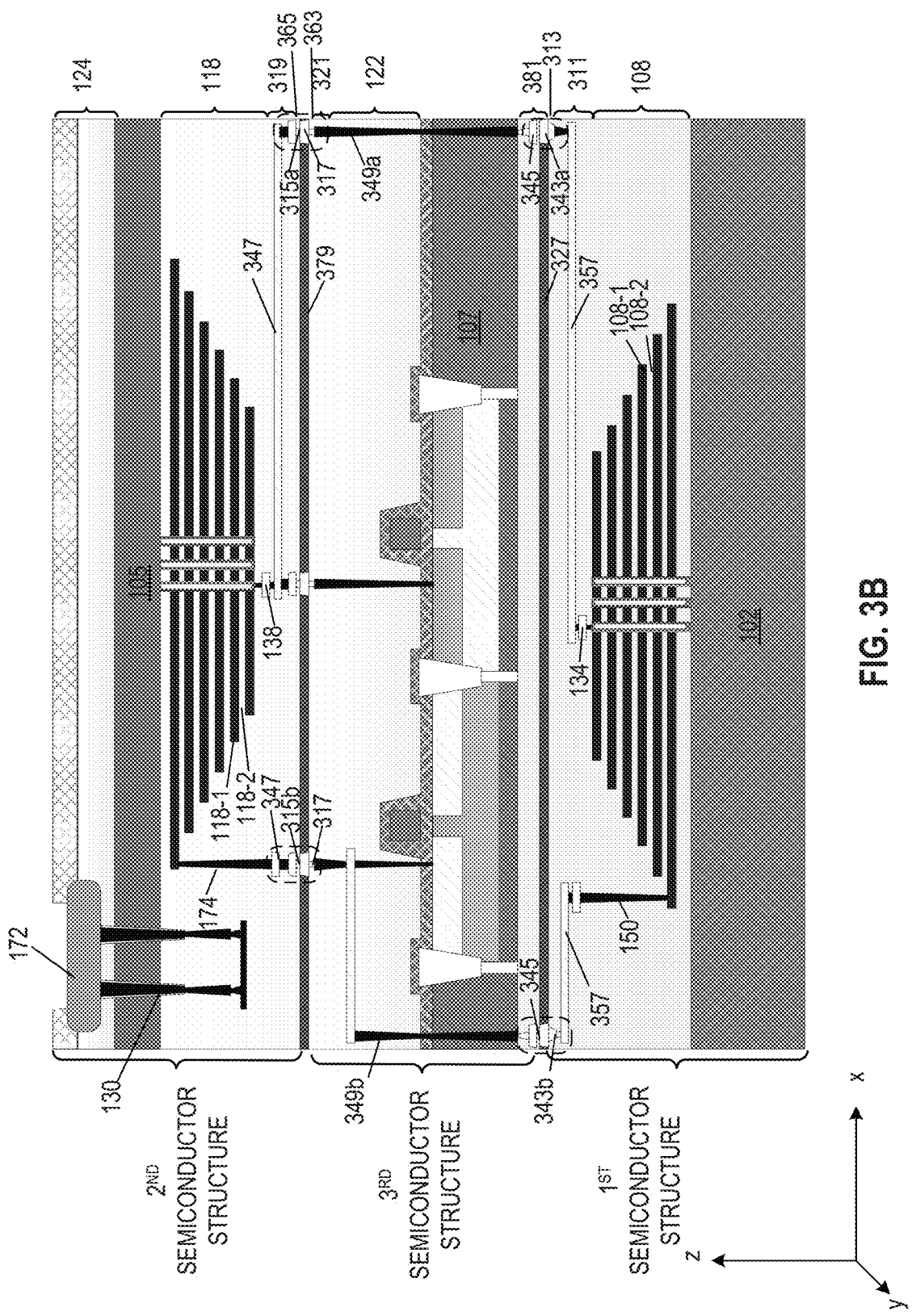
FIG. 3B illustrates a schematic view of a cross-section of another exemplary bonded 3D memory device having BLs and WLs respectively routed and conductively connected through bonding, according to some embodiments.
Figure 4:
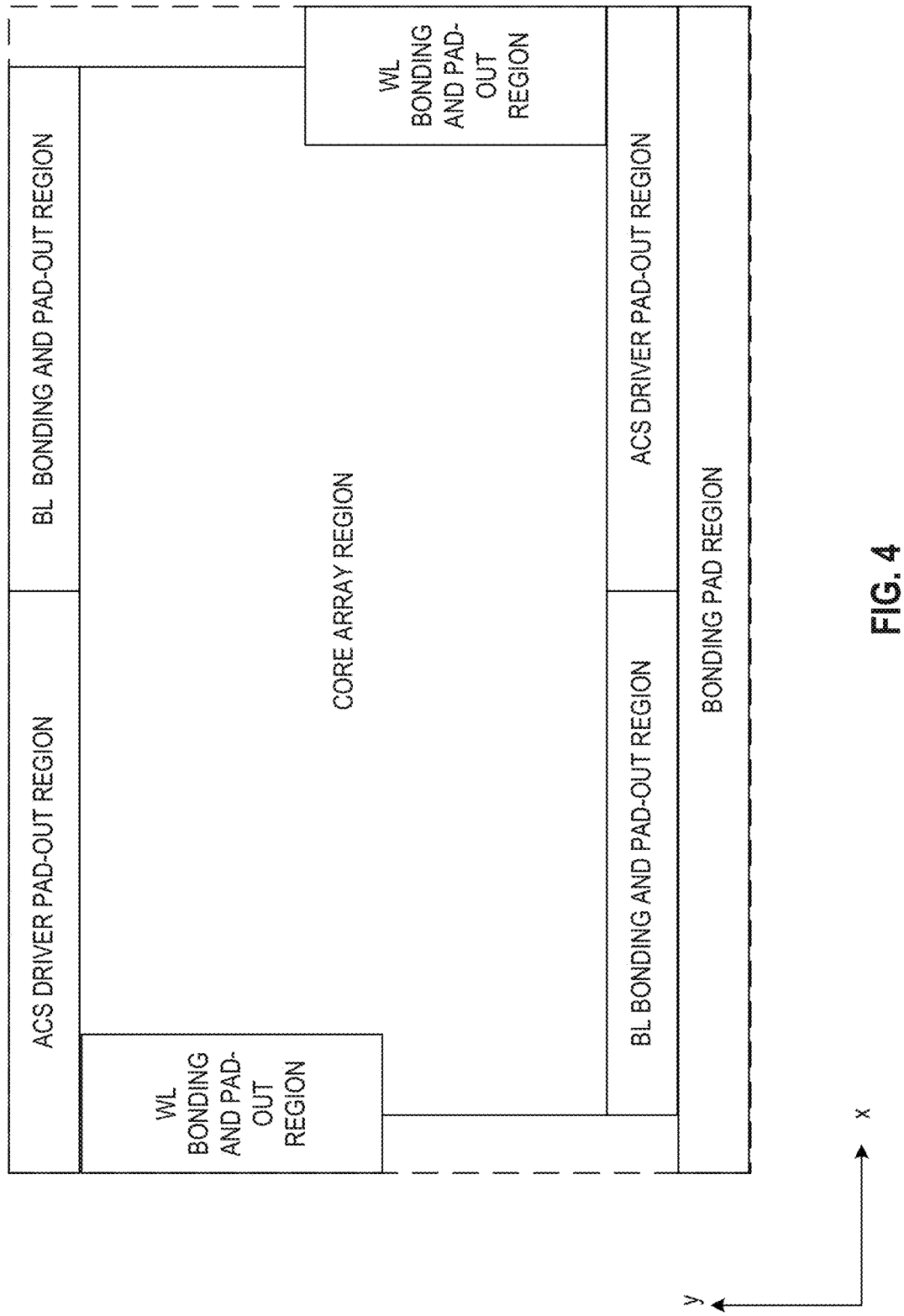
FIG. 4 illustrates a plan view of an exemplary bonded 3D memory device, according to some embodiments.

FIGS. 1-3 illustrate various ways to bond and conductively connect parts in semiconductor structures. FIG. 4 illustrates a plan view of the bonded 3D memory devices in FIGS. 1-3. FIGS. 1A and 1B illustrate bonded 3D memory devices 100 an 101 in which BLs of the bonded semiconductor structures are routed and bonded, according to some embodiments. FIGS. 2A and 2B illustrate bonded 3D memory devices 200 and 201 in which WLs of the bonded semiconductor structures are routed and bonded, according to some embodiments. FIGS. 3A and 3B illustrate bonded 3D memory devices 300 and 301 in which BLs and WLs of the bonded semiconductor structures are both routed and bonded, according to some embodiments. In bonded 3D memory devices 100, 200, and 300, the semiconductor structure embedded with the peripheral circuits of the memory arrays is located at one end (e.g., an upper end) of the respective bonded 3D memory device. In bonded 3D memory devices 101, 201, and 301, the semiconductor structure embedded with the peripheral circuits is located between the pair of semiconductor structures.

In the present disclosure, for the simplicity of illustration, similar or same objects are labeled with the same numerals in FIGS. 1-3 and FIGS. 5-8, respectively. It should be noted that objects depicted in the figures of the present disclosure are for illustrative purposes only. The positions, dimensions, shapes, and numbers of any object do not reflect the actual position, dimensions, shape, and number of the object. The illustrated locations of the bonding contacts in the figures do not reflect the actual locations where the bonding contacts are located. It is noted that x-, y-, and z-axes are added in FIGS. 1-3 and 5-12, to further illustrate the spatial relationship of the components in bonded 3D memory devices. It is noted that x and y axes are included in these figures to illustrate two orthogonal directions in the plane of a semiconductor structure. The x-direction is the word line direction (e.g., the direction along which the WLs/conductor layers extend), and the y-direction is the bit line direction (e.g., the direction along which the BLs extend). The substrate of a semiconductor structure (e.g., the first/second/third semiconductor structure) or a 3D NAND memory device (e.g., 3D memory devices 100, 101, 200, 201, 300, and 301) includes two lateral surfaces extending laterally in the x-y plane: a top surface on the front side of the semiconductor structure/3D NAND memory device, and a bottom surface on the backside opposite to the front side. The z axis is perpendicular to both the x and y axes. As used herein, whether one component (e.g., a layer or a device) is "on," "above," or "below" another component (e.g., a layer or a device) of a semiconductor structure/3D NAND memory device is determined relative to the substrate of the semiconductor device in the z-direction (the vertical direction perpendicular to the x-y plane) when the substrate is positioned in the lowest plane of the semiconductor device in the z-direction. The same notion for describing the spatial relationship is applied throughout the present disclosure.

In the present disclosure, for ease of description, "conductively-connected BLs" refer to the BLs that are routed and conductively connected through bonding, "conductively-connected WLs" refer to the WLs that are routed and conductively connected through bonding, and "conductively-connected 3D memory strings" refer to the 3D memory strings that are routed and conductively connected through bonding.

In FIGS. 1-3, bonded 3D memory devices 100, 101, 200, 201, 300, and 301 may include a first ($1^{ST}$) semiconductor structure, a second ($2^{ND}$) semiconductor structure, and a third ($3^{RD}$) semiconductor structure. In FIGS. 1A, 2A, and 3A, the first and second semiconductor structures may be directly bonded in a face-to-face manner, and the third semiconductor structure is bonded to one of the first and second semiconductor structures at one end of the bonded 3D memory device. For illustrative purposes, the second semiconductor structure is above the first semiconductor structure, and the third semiconductor structure, above the second semiconductor structure, is bonded to the second semiconductor structure in a face-down manner. In FIGS. 1B, 2B, and 3B, the first and second semiconductor structures may be bonded in a face-to-face manner with the third semiconductor structure in between in a face-up manner.

In some embodiments, the first and second semiconductor structures each include a memory stack, facing each other. The third semiconductor structure may include peripheral circuits for the memory stacks in both first and second semiconductor structures. In the present disclosure, semiconductor structures may be bonded by a suitable bonding method, such as hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. Unless specified otherwise, the bonding between any two of the first, second, and third semiconductor structures include hybrid bonding.

As shown in FIG. 1A, bonded 3D memory device 100 further includes a bonding interface 126 where the first semiconductor structure and the second semiconductor structure are bonded, and a bonding interface 164 where the second semiconductor structure and the third semiconductor structure are bonded. As described below in detail, the first, second, and third semiconductor structures can be fabricated separately (and in parallel in some embodiments) such that the thermal budget of fabricating one of the first, second, and third semiconductor structures does not limit the processes of fabricating another one of the first, second, and third semiconductor structures. Moreover, a large number of bonding contacts can be formed through bonding interfaces 126 and 164 to make electrical connections between the first semiconductor structure and the second semiconductor structure, and between the second semiconductor structure and the third semiconductor structure, respectively. The bonding contacts, conductively connected to corresponding structures (e.g., BLs and/or WLs) in respective semiconductor structures, can be formed in a desired bonding region away from the memory stacks. Data transfer between the NAND memory (e.g., the memory stacks) in the pair of bonded semiconductor structures and the peripheral circuits (and any other logic process-compatible devices) can be performed through the bonding contacts and conductive routings across bonding interfaces 126 and 164. By vertically integrating the first, second, and third semiconductor structures, the chip size can be reduced, and the memory cell density can be increased. Furthermore, as a "unified" chip, by integrating multiple discrete chips (e.g., various processors, controllers, and memories) into a single bonded chip (e.g., bonded 3D memory device 100), faster system speed and smaller PCB size can be achieved as well. The details of each semiconductor structure in bonded 3D memory device 100 are now described below.

The first semiconductor structure, as a part of bonded 3D memory device 100, can include a substrate 102, which can include silicon (e.g., single crystalline silicon, c-Si), silicon germanium (SiGe), gallium arsenide (GaAs), germanium (Ge), silicon on insulator (SOD), or any other suitable materials.

The first semiconductor structure can include a memory stack 108 above substrate 102. Substrate 102 may include two lateral surfaces (e.g., a top surface and a bottom surface) extending laterally in the x-axis (the lateral direction or width direction). As used herein, whether one component (e.g., a layer or a device) is "on," "above," or "below" another component (e.g., a layer or a device) of a bonded 3D memory device (e.g., bonded 3D memory device 100) is determined relative to the substrate of the bonded 3D memory device (e.g., substrate 102) in the y-axis (the vertical direction or thickness direction) when the substrate is positioned in the lowest plane of the bonded 3D memory device in the y-axis. The same notion for describing the spatial relationship is applied throughout the present disclosure.

In some embodiments, the first semiconductor structure of bonded 3D memory device 100 includes a NAND flash bonded 3D memory device in which memory cells are provided in the form of an array of 3D NAND memory strings 132. Each 3D NAND memory string 132 extends vertically through a plurality of pairs each including a conductor layer 108-1 and a dielectric layer 108-2, according to some embodiments. The stacked and interleaved conductor layers 108-1 and dielectric layer 108-2 are also referred to herein as a memory stack 108. Interleaved conductor layers 108-1 and dielectric layers 108-2 in memory stack 108 alternate in the vertical direction, according to some embodiments. In other words, except for the ones at the top or bottom of memory stack 108, each conductor layer 108-1 can be adjoined by two dielectric layers 108-2 on both sides, and each dielectric layer 108-2 can be adjoined by two conductor layers 108-1 on both sides. Conductor layers 108-1 can each have the same thickness or different thicknesses. Similarly, dielectric layers 108-2 can each have the same thickness or different thicknesses. Conductor layers 108-1 can include conductor materials including, but not limited to, W, Co, Cu, Al, doped silicon, silicides, or any combination thereof. Dielectric layers 108-2 can include dielectric materials including, but not limited to, silicon oxide, silicon nitride, silicon oxynitride, or any combination thereof. Conductor layers 108-1 may be a part of a WL. Unless specified otherwise, in the present disclosure, "WL" and "conductor layer" are used interchangeably. That is, the bonding of WLs may be equivalent to the bonding of conductor layers in bonded semiconductor structures. In some embodiments, each conductor layer 108-1 is in contact with and conductively connected to one or more word line contacts 150, which is in contact with and conductively connected to an interconnect layer of the first semiconductor structure.

In some embodiments, each 3D NAND memory string 132 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 132 can have a cylinder shape (e.g., a pillar shape). The semiconductor channel, the tunneling layer, the storage layer, and the blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 132 further include a plurality of control gates (each being part of a WL). Each conductor layer 108-1 in memory stack 108 can act as a control gate for each memory cell of 3D NAND memory string 132. In some embodiments, each 3D NAND memory string 132 includes two plugs at a respective end in the vertical direction. As used herein, the "upper end" of a component (e.g., 3D NAND memory string 132) is the end farther away from substrate 102 in the y-axis, and the "lower end" of the component (e.g., 3D NAND memory string 132) is the end closer to substrate 102 in the y-axis when substrate 102 is positioned in the lowest plane of bonded 3D memory device 100. The plug at the lower end of 3D NAND memory string 132 and in contact with the semiconductor channel can include a semiconductor material, such as single-crystal silicon, that is epitaxially grown from substrate 102. This plug can function as the channel controlled by a source select gate of 3D NAND memory string 132. The other plug at the upper end and in contact with the semiconductor channel can include semiconductor materials (e.g., polysilicon). By covering the upper end of 3D NAND memory string 132 during the fabrication of the first semiconductor structure, the plug at the other end can function as an etch stop layer to prevent etching of dielectrics filled in 3D NAND memory string 132, such as silicon oxide and silicon nitride. In some embodiments, the plug at the upper end functions as the drain of 3D NAND memory string 132.

It is understood that 3D NAND memory strings 132 are not limited to the "charge trap" type of 3D NAND memory strings and may be "floating gate" type of 3D NAND memory strings in other embodiments. Substrate 102 may include polysilicon as the source plate of the "floating gate" type of 3D NAND memory strings. In some embodiments, memory stack 108 includes a plurality of 2D NAND memory strings.

In some embodiments, the first semiconductor structure of bonded 3D memory device 100 further includes an interconnect layer 110 above memory stack 108 to transfer electrical signals. Interconnect layer 110 can include a plurality of interconnects. As used herein, the term "interconnects" can broadly include any suitable types of interconnects, such as middle-end-of-line (MEOL) interconnects and back-end-of-line (BEOL) interconnects. In some embodiments, the interconnects in interconnect layer 110 also include local interconnects, such as bit line contacts and word line contacts. Interconnect layer 110 can further include one or more interlayer dielectric (ILD) layers in which the interconnects and via contacts can form. The interconnects and via contacts in interconnect layer 110 can include conductive materials including, but not limited to W, Co, Cu, Al, silicides, or any combination thereof. ILD layers in interconnect layer 110 can include dielectric materials including, but not limited to, silicon oxide, silicon nitride, silicon oxynitride, low-k dielectrics, or any combination thereof.

The first semiconductor structure may include a plurality of BLs 134 in contact with and conductively connected to the other plugs at the other ends of 3D NAND memory strings 132. BLs 134 may be a part of interconnect layer 110 and conductively connected to 3D NAND memory strings 132 through the bit line contacts. In some embodiments, BLs 134 are at a lower end of interconnect layer 110 and above 3D NAND memory strings 132.

Interconnect layer 110 may also include a plurality of first conductive routings 140, disposed at any suitable locations in interconnect layer 110. For example, first conductive routings 140 may be above and/or around BLs 134. First conductive routings 140 may be conductively connected to BLs 134 through any suitable electrical connection means such as vias. First conductive routings 140 may be designed to route BLs 134 (e.g., route the electrical signals of BLs) flexibly to desired locations (e.g., bonding regions) at bonding interface 126. In some embodiments, first conductive routings 140 route BLs 134 to be in contact with and/or conductively connected to a plurality of first bit line bonding contacts in a first bonding layer 112 of the first semiconductor structure at bonding interface 126.

First bonding layer 112, as a part of the first semiconductor structure, may be located above interconnect layer 110 and at bonding interface 126. In some embodiments, first bonding layer 112 may be a part of interconnect layer 110. First bonding layer 112 may include the plurality of first bit line bonding contacts 142 in contact with and/or conductively connected to first conductive routings 140 so that electrical signals from/to BLs 134 may be transmitted to first bit line bonding contacts 142 through first conductive routings 140. First bonding layer 112 may include a dielectric layer in which first bit line bonding contacts 142 are positioned. In some embodiments, first bit line bonding contacts 142 may be located at a suitable bonding region of the first semiconductor structure to be bonded with a plurality of second bit line bonding contacts 144 of the second semiconductor structure. The locations and distribution of first and second bit line bonding contacts 142 and 144 may be determined based on factors such as the layouts of devices/structures of the chip, the available space for placing first and second bit line bonding contacts 142 and 144, the spacing between adjacent bit line bonding contacts, and/or the fabrication process to form, align, and bond first and second bit line bonding contacts 142 and 144. In some embodiments, first bonding layer 112 may include a plurality of bonding contacts which are conductively connected to word line contacts 150 through any suitable interconnects and/or routings (e.g., in interconnect layer 110) so that WLs (e.g., conductor layers 108-1) may be conductively connected to peripheral circuits and/or other logic process-compatible devices in the third semiconductor structure through bonding.

First conductive routings 140, first bit line bonding contacts 142, word line contacts 150, word line bonding contacts, and the interconnects in interconnect layer 110 can include conductive materials including, but not limited to W, Co, Cu, Al, silicides, or any combination thereof. Any ILD layers in interconnect layer 110 and dielectric layers in first bonding layer 112 can include dielectric materials including, but not limited to, silicon oxide, silicon nitride, silicon oxynitride, low-k dielectrics, or any combination thereof. Unless specified otherwise, the conductive structures (e.g., interconnects and bonding contacts) in the interconnect layers and bonding layers of the present disclosure may include, but not limited to, W, Co, Cu, Al, silicides, or any combination thereof, and the dielectric structures (e.g., ILD and dielectric layers) in the interconnect layers and bonding layers of the present disclosure may include, but not limited to, silicon oxide, silicon nitride, silicon oxynitride, low-k dielectrics, or any combination thereof.

The second semiconductor structure may have a semiconductor layer 104 above and in contact with a memory stack 118, which includes a plurality of interleaved conductor layers 118-1 and dielectric layers 118-2. Conductor layers 118-1 may each be in contact with and conductively connected to one or more word line contacts 174, which may be conductively connected to a plurality of bonding contacts that are conductively connected to peripheral circuits and/or other logic process-compatible devices in the third semiconductor structure through bonding. Semiconductor layer 104 may be formed from a thinned substrate, on which memory stack 118 is formed. Semiconductor layer 104 may include similar or the same materials as substrate 102. The second semiconductor structure may also include a plurality of 3D NAND memory strings 136 extending vertically through memory stack 118 and in contact with semiconductor layer 104. The second semiconductor structure may also include a plurality of BLs 138 in contact with and/or conductively connected to 3D NAND memory strings 136 and conductive routings 146 in an interconnect layer 116. In some embodiments, interconnect layer 116 may be under BLs 138 and above a second bonding layer 114, which includes a plurality of second bit line bonding contacts 144 that are in contact with and conductively connected to first bit line bonding contacts 142. In some embodiments, memory stack 118, 3D NAND memory strings 136, BLs 138, word line contacts 174, interconnect layer 116, second bonding layer 114 are respectively similar to memory stack 108, 3D NAND memory strings 132, BLs 134, word line contacts 150, interconnect layer 110, and first bonding layer 112, and the detailed descriptions of these components are not repeated. However, the specific number of staircases/memory cells in each memory stack, the patterns and distribution of conductive routings in each interconnect layer may be the same or different, e.g., subjected to the design and fabrication of the respective semiconductor structures, and are thus not limited by the embodiments of the present disclosure.

The first semiconductor structure and the second semiconductor structure may be bonded at bonding interface 126. In some embodiments, each first bit line bonding contact 142 is aligned and bonded with a respective second bit line bonding contact 144 at bonding interface 126, and dielectric layers of first and second bonding layers 112 and 114 are bonded together.

The bonding of the first and second semiconductor structures may include the bonding of first and second bit line bonding contacts 142 and 144, which conductively connect each 3D NAND memory string 132 with a respective 3D NAND memory string 136. Memory cells in memory stacks 108 and 188 may be conductively connected through the bonding of BLs 134 and 138. In some embodiments, the bonding of the first and second semiconductor structures requires only the alignment of first and second bit line bonding contacts 142 and 144 along the vertical direction. In some embodiments, to facilitate easier bonding, first and second bit line bonding contacts 142 and 144 may be formed at a desired bonding region, such that the placement/layout of memory stacks 108 and 118, as well as other structures in the chip, may be optimized. In some embodiments, the spacing between adjacent first bit line bonding contacts 142 and adjacent second bit line bonding contacts 144, and the contact area between each first bit line bonding contact 142 and the respective second bit line bonding contact 144 may be sufficiently large to tolerate higher overlay error during alignment. The bonding may then be less limited by the dimensions of and/or the spacing between 3D NAND memory strings 136 and 134. Compared to conventional direct bonding of first and second semiconductor structures, in which 3D NAND memory strings in different memory stacks are directly aligned and bonded together, the alignment and bonding of bit line bonding contacts, which facilitates the conductive connection of 3D NAND memory strings in different memory stacks, may require lower overlay alignment precision and contribute higher yield.

In some embodiments, first and second bit line bonding contacts 142 and 144 may be formed at a BL bonding region. The location of the BL bonding region may be determined based on the factors aforementioned and may or may not be located between BLs 134 and 138. In some embodiments, the BL bonding region may be away from BLs 134 and 138 in the x-y plane. The bonded first and second bit line bonding contacts 142 and 144 may be conductively connected to the peripheral circuits and any other logic process-compatible devices in the third semiconductor structure through the same interconnect or conductive routing in interconnect layer 110 or 116. For illustrative purposes, in FIG. 1A, second conductive routings 146 and a through-silicon via (TSV) 148 may be depicted as transmitting the electrical signals between the conductively-connected BLs 134 and 138 (i.e., conductively-connected 3D NAND memory strings 136 and 132) and the third semiconductor structure. In other words, BLs 134 and 138 (i.e., 3D NAND memory strings 136 and 132) share the same interconnect for transmission of electrical signals. In some embodiments, as shown in FIG. 1A, electrical signals between WLs (or conductor layers 108-1 and 118-1) of memory stacks 108 and 118 may be transmitted separately to the peripheral circuits and any other logic process-compatible devices through respective interconnects, e.g., TSVs 154, and bonding contacts 158.

In some embodiments, the second semiconductor structure includes a bonding layer 180 that has the plurality of bonding contacts 158 distributed at bonding interface 164 and above semiconductor layer 104, insulated by dielectric materials. Bonding contacts 158 may include various bonding contacts that are respectively and conductively connected to different devices/structures in the first and second semiconductor structures. For example, bonding contacts 158 may include bonding contacts that are respectively and conductively connected to TSVs 148 and 154, to transmit electrical signals for the conductively-connected BLs (i.e., 134 and 138) and separated WLs (i.e., 108-1 and 118-1).

The third semiconductor structure may include the peripheral circuits for memory stacks 108 and 118 (and any other logic process-compatible devices) and be bonded with the pair of bonded semiconductor structures at bonding interface 164. The third semiconductor structure may include a semiconductor layer 106 above a device layer 122 and under a pad-out interconnect layer 124. Device layer 122 may include a plurality of transistors 168 formed "on" semiconductor layer 106, in which the entirety or part of transistors 168 are formed under semiconductor layer 106 (e.g., above the bottom surface of semiconductor layer 106) and/or directly under semiconductor layer 106. Semiconductor layer 106 may be formed from a thinned substrate, similar to semiconductor layer 104. Isolation regions (e.g., shallow trench isolations (STIs)) 170 and doped regions (e.g., source regions and drain regions of transistors 168) can be formed in semiconductor layer 106 as well. Isolation regions 170 may include any suitable dielectric materials such as silicon oxide, silicon nitride, and/or silicon oxynitride. Transistors 168 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments.

Transistors 168 may form or be part of various devices in device layer 122. In some embodiments, device layer 122 includes peripheral circuits formed entirely or partially by transistors 168. The peripheral circuits may be part or the entirety of the peripheral circuits for controlling and sensing the NAND memory of bonded 3D memory device 100. In some embodiments, transistors 168 form peripheral circuit, i.e., any suitable digital, analog, and/or mixed-signal control and sensing circuits used for facilitating the operation of the NAND memory including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

In some embodiments, the third semiconductor structure further includes an interconnect layer 120 under device layer 122 and above bonding interface 164 to transfer electrical signals from/to the peripheral circuits. Interconnect layer 120 can include a plurality of interconnects 166, including lateral interconnect lines and vertical interconnect access (via) contacts. Interconnect layer 120 can further include one or more interlayer dielectric ILD layers in which the interconnect lines and via contacts can form. That is, interconnect layer 120 can include interconnects and via contacts in multiple ILD layers. In some embodiments, the devices in device layer 122 are electrically connected to one another through the interconnects in interconnect layer 120.

Pad-out interconnect layer 124 can include interconnects, e.g., contact pads 172, in one or more ILD layers. Pad-out interconnect layer 124 and interconnect layer 120 can be formed at opposite sides of semiconductor layer 106. In some embodiments, interconnects 130 in pad-out interconnect layer 124 can extend into the third semiconductor structure and transfer electrical signals between bonded 3D memory device 100 and outside circuits, e.g., for pad-out purposes. Unless specified otherwise, the contact pads and interconnects in the pad-out interconnect layers of the present disclosure may include, but not limited to, W, Co, Cu, Al, silicides, or any combination thereof, and the dielectric structures (e.g., ILD and dielectric layers) in the pad-out interconnect layers of the present disclosure may include, but not limited to, silicon oxide, silicon nitride, silicon oxynitride, low-k dielectrics, or any combination thereof.

The third semiconductor structure can further include a bonding layer 162 at bonding interface 164 and under interconnect layer 120. Bonding layer 162 can include a plurality of bonding contacts 160 and dielectrics electrically isolating bonding contacts 160. Bonding contacts 160 may respectively be aligned, in contact with, and conductively connected to bonding contacts 158 at bonding interface 164 to transmit electrical signals between peripheral circuits (and other logic process-compatible devices) and devices/structures in the first and second semiconductor structures, e.g., conductively-connected BLs and separate WLs. Bonding contacts 160 and 158 and surrounding dielectrics in bonding layers 162 and 180 can be used for hybrid bonding.

It is understood that the relative positions of the first, second, and third semiconductor structures are not limited. FIG. 1B illustrates a schematic view of another exemplary bonded 3D memory device 101, according to some embodiments. Different from bonded 3D memory device 100 in FIG. 1A in which the third semiconductor structure is bonded with the first and second semiconductor structures from above, forming bonding with only the second semiconductor structure, in bonded 3D memory device 101, the third semiconductor structure is between the first and second semiconductor structures, forming bonding with both the first and second semiconductor structures. The pad-out interconnect layer may be formed as a part of the second semiconductor structure. In some embodiments, the third semiconductor structure is bonded to the first and second semiconductor structures in a face-up manner.

As shown in FIG. 1B, the third and first semiconductor structures may be bonded at a bonding interface 127, and the second and third semiconductor structures may be bonded at a bonding interface 179. Because the stacking order of the first, second, and third semiconductor structures in bonded 3D memory device 101 is different from that of bonded 3D memory device 100, in some embodiments, the interconnect layers and bonding layers of the first, second, and third semiconductor structures in bonded 3D memory device 101 may be different from those in bonded 3D memory device 100.

In some embodiments, the first semiconductor structure may include an interconnect layer 111 above memory stack 108 and a first bonding layer 113 above interconnect layer 111. First bonding layer 113 may be bonded with a bonding layer 181 of the third semiconductor structure at bonding interface 127. In some embodiments, the third semiconductor structure may include a semiconductor layer 107 above bonding layer 181 and under device layer 122. The third semiconductor structure may also include an interconnect layer 121 above device layer 122 and a bonding layer 163 above device layer 122. Bonding layer 163 may be bonded with a second bonding layer 165 of the second semiconductor structure at bonding interface 179. In some embodiments, the second semiconductor structure may include an interconnect layer 119 above second bonding layer 165 and under memory stack 118. The second semiconductor structure may also include a semiconductor layer 105 above and in contact with memory stack 118. The pad-out interconnect layer 124 may be formed above semiconductor layer 105. Pad-out interconnect layer 124 may include contact pads 172 and interconnect 130 extending into the second semiconductor structure for transmitting electrical signals between bonded 3D memory device 101 and the outside circuits. In some embodiments, semiconductor layers 105 and 107 may be similar to semiconductor layers 106 and 104, and the detailed descriptions are not repeated herein.

First bonding layer 113 may include a plurality of first bit line bonding contacts 143 distributed at bonding interface 127, aligned and bonded with bonding contacts 145 of the third semiconductor structure. Second bonding layer 165 may include a plurality of second bit line bonding contacts 115 distributed at bonding interface 179, aligned and bonded with bonding contacts 117 of the third semiconductor structure. First bit line bonding contacts 143 may be conductively connected to BLs 134 through first conductive routings 141, and second bit line bonding contacts 115 may be conductively connected to BLs 138 through second conductive routings 147. First and second bit line bonding contacts 143 and 115 may be conductively connected through bonding contacts 117 (in bonding layer 163) and 145 (in bonding layer 181), and one or more interconnects such as a TSV 149 extending in the third semiconductor structure. BLs 134 and 138, and 3D NAND memory strings 132 and 136 may thus be conductively connected. Suitable interconnects in interconnect layer 121 of the third semiconductor structure may conductively connect BLs 134 and 138 and conductively connected 3D NAND memory strings 132 and 136 (or TSV 149) to the peripheral circuits (or other logic process-compatible devices).

The distribution and/or location of first and second bit line bonding contacts 143 and 115 in the respective bonding layer may be the same as or different from the distribution and/or location of first and second bit line bonding contacts 142 and 144. Depending on the distribution of first and second bit line bonding contacts 143 and 115, the distribution of first and second conductive routings 141 and 147 may be determined/adjusted accordingly to conductively connect first and second bit line bonding contacts 143 and 115 respectively to BLs 134 and 138. In some embodiments, conductor layers 108-1 and 118-1 are conductively connected to the third semiconductor structure through respective word line contacts 150 and 174, and separate interconnects in interconnect layer 121. Thus, conductively-connected 3D NAND memory strings 132 and 136 may be conductively connected to the peripheral circuits (and/or other logic process-compatible devices) in the third semiconductor structure through the same interconnect, and WLs 108-1 and 118-2 may be conductively connected to the peripheral circuits (and/or other logic process-compatible devices) in the third semiconductor structure through separate interconnects.

Although not shown in the figures, in some embodiments, the third semiconductor may be located at the lower end of the respective bonded 3D memory device and conductively connected to the bonded pair of semiconductor structures from below. In this case, the substrate of the third semiconductor structure may function as the substrate of the bonded 3D memory device. If the semiconductor layer of the second semiconductor structure is facing up, a pad-out interconnect layer may be formed above the semiconductor layer. The placement of the first, second, and third semiconductor structures along the vertical direction may be flexibly determined based on the overall layout/placement of devices/structures in the bonded 3D memory device/chip, and should not be limited by the embodiments of the present disclosure.

FIG. 2A illustrates a bonded 3D memory device 200 in which WLs (or conductor layers) of the pair of bonded semiconductor structures are bonded together to conductively connect the memory stacks (and memory cells) in the pair of bonded semiconductor structures, according to some embodiments. In some embodiments, the conductively-connected WLs share the same interconnect that transmits electrical signals from/to the peripheral circuits (or other logic process-compatible devices). In bonded 3D memory device 200, electrical signals from/to the peripheral circuits (or other logic process-compatible devices) are transmitted separately for the BLs. As shown in FIG. 2A, the first and second semiconductor structures are bonded at a bonding interface 226, and the third and second semiconductor structures are bonded at a bonding interface 264. The first semiconductor structure may include an interconnect layer 210 above memory stack 108 and under bonding interface 226, and a first bonding layer 212 at bonding interface 226. The second semiconductor structure may include an interconnect layer 216 under memory stack 118 and above bonding interface 226, and a second bonding layer 214 at bonding interface 226. The second semiconductor structure may also include a bonding layer 280 above semiconductor layer 104 and at bonding interface 264. The third semiconductor structure may include a bonding layer 262 at bonding interface 264 and an interconnect layer 220 between bonding layer 262 and device layer 122.

In some embodiments, first bonding layer 212 includes a plurality of first word line bonding contacts 242 distributed on bonding interface 226, and second bonding layer 214 includes a plurality of second word line bonding contacts 244 distributed on bonding interface 226. Each of first word line bonding contacts 242 may be conductively connected to a respective WL 108-1 (or conductor layer 108-1) of the first semiconductor structure, and each of second word line bonding contacts 244 may be conductively connected to a respective WL 118-1 (or conductor layer 118-1) of the second semiconductor structure. In some embodiments, each WL is conductively connected to the respective bonding contact through respective conductive routings and/or interconnects in respective interconnect layer (e.g., 210 or 216). For example, first conductive routings 240 may be conductively connected to WLs 108-1 (or conductor layers 108-1) through word line contacts 150 and other necessary vias/interconnects, and second conductive routings 246 may be conductively connected to WLs 118-1 (or conductor layers 118-1) through word line contacts 174 and other necessary vias/interconnects. Similar to first and second conductive routings 140 and 146, first and second conductive routings 246 and 240 may be flexibly designed to route the electrical signals from/to the respective WLs to the respective word line bonding contacts, which are positioned at a desired bonding region at interface 126. First word line bonding contacts 242 and second word line bonding contacts 244 may then be aligned with each other and bonded at interface 126, and WLs 108-1 and 118-1 may be conductively connected.

Interconnects in interconnect layer 210 or 216 may conductively connect the conductively-connected WLs to the peripheral circuits (and/or other logic process-compatible devices) in the third semiconductor structure. For ease of illustration, second conductive routings 246 and a TSV 248 are depicted to conductively connected the conductively-connected WLs to a bonding contact 258 in bonding layer 280. Bonding contact 258 may be bonded with a bonding contact 260 in bonding layer 262 of the third semiconductor structure at bonding interface 264. Suitable interconnects in interconnect layer 220 may conductively connect the bonded bonding contacts 258 and 260 to the peripheral circuits (and/or other logic process-compatible devices) in the third semiconductor structure. The conductively-connected WLs may then be conductively connected to the peripheral circuits (and/or other logic process-compatible devices). In some embodiments, bonding contacts 258 also includes other bonding contacts to conductively connect other structures/devices to the third semiconductor structure. In some embodiments, BLs 134 and 138 are conductively connected to the third semiconductor structure separately, e.g., through separate interconnects and bonding contacts 258.

FIG. 2B illustrates another bonded 3D memory device 201 in which WLs (or conductor layers) of the pair of bonded semiconductor structures are bonded together to conductively connect the memory stacks (and memory cells) in the pair of bonded semiconductor structures, according to some embodiments. Different from bonded 3D memory device 200, the third semiconductor structure, positioned between the first and second semiconductor structures, may be bonded to both the first and second semiconductor structures. As shown in FIG. 2B, the first and third semiconductor structures may be bonded at a bonding interface 227, and the third and second semiconductor structures may be bonded at a bonding interface 279. The pad-out interconnect layer may be formed above the second semiconductor structure. In some embodiments, the third semiconductor structure is bonded to the first and second semiconductor structures in a face-up manner Because the stacking order of the first, second, and third semiconductor structures in bonded 3D memory device 201 is different from that of bonded 3D memory device 200, in some embodiments, the interconnect layers and bonding layers of the first, second, and third semiconductor structures in bonded 3D memory device 201 may be different from those of bonded 3D memory device 200.

In some embodiments, the first semiconductor structure may include an interconnect layer 211 above memory stack 108 and a first bonding layer 213 above interconnect layer 211. First bonding layer 213 may be bonded with a bonding layer 281 of the third semiconductor structure at bonding interface 227. The third semiconductor structure may also include an interconnect layer 221 above device layer 122 and a bonding layer 263 bonded with a second bonding layer 265 of the second semiconductor structure at bonding interface 279. In some embodiments, the second semiconductor structure may include an interconnect layer 219 above second bonding layer 265 and under memory stack 118. The pad-out interconnect layer 124 may be formed above semiconductor layer 105.

First bonding layer 213 may include a plurality of first word line bonding contacts 243 distributed at bonding interface 227, aligned and bonded with bonding contacts 245 of the third semiconductor structure. Second bonding layer 265 may include a plurality of second word line bonding contacts 215 distributed at bonding interface 279, aligned and bonded with bonding contacts 217 of the third semiconductor structure. First word line bonding contacts 243 may be conductively connected to WLs 108-1 (or conductor layers 108-1) through first conductive routings 241, and second word line bonding contacts 215 may be conductively connected to WLs 118-1 (or conductor layers 118-1) through second conductive routings 247. First and second word line bonding contacts 243 and 215 may be conductively connected through bonding contacts 217 (in bonding layer 263) and 245 (in bonding layer 281), and an interconnect 249, e.g., a TSV, that extends in the third semiconductor structure. WLs 108-1 and 118-1 (or conductor layers 108-1 and 118-1 may thus be conductively connected. Suitable interconnects in interconnect layer 221 of the third semiconductor structure may conductively connect conductively-connected WLs 108-1 and 118-1 (or interconnect 249) to the peripheral circuits (or other logic process-compatible devices).

The distribution and/or location of first and second word line bonding contacts 243 and 215 in the respective bonding layer may be the same as or different from the distribution and/or location of first and second word line contacts 242 and 244. Depending on the distribution of first and second word line bonding contacts 243 and 215, the distribution of first and second conductive routings 241 and 247 may be determined/adjusted accordingly to conductively connect first and second word line bonding contacts 243 and 215 respectively with WLs 108-1 and 118-1. In some embodiments, BLs 134 and 138 are conductively connected to the third semiconductor structure through separate interconnects in interconnect layer 221. Thus, the conductively-connected WLs 108-1 and 118-1 may be conductively connected to the peripheral circuits (and/or other logic process-compatible devices) in the third semiconductor structure through the same interconnect, and BLs 134 and 138 may be conductively connected to the peripheral circuits (and/or other logic process-compatible devices) in the third semiconductor structure through separate interconnects.

FIG. 3A illustrates a bonded 3D memory device 300 in which both BLs and WLs (or conductor layers) of the pair of bonded semiconductor structures are bonded together to conductively connect the memory stacks (and memory cells) in the pair of bonded semiconductor structures, according to some embodiments. In some embodiments, the conductively-connected WLs and BLs respectively share the same interconnect that transmits electrical signals from/to the peripheral circuits (or other logic process-compatible devices). As shown in FIG. 3A, the first and second semiconductor structures are bonded at a bonding interface 326, and the third and second semiconductor structures are bonded at a bonding interface 364. The first semiconductor structure may include an interconnect layer 310 above memory stack 108 and under bonding interface 326, and a first bonding layer 312 at bonding interface 326. The second semiconductor structure may include an interconnect layer 316 under memory stack 118 and above bonding interface 326, and a second bonding layer 314 at bonding interface 326. The second semiconductor structure may also include a bonding layer 380 above semiconductor layer 104 and at bonding interface 364. The third semiconductor structure may include a bonding layer 362 at bonding interface 364 and an interconnect layer 320 between bonding layer 362 and device layer 122.

In some embodiments, first bonding layer 312 includes a plurality of first bit line bonding contacts 342*a* and a plurality of first word line bonding contacts 342*b* distributed on bonding interface 326, and second bonding layer 314 includes a plurality of second bit line bonding contacts 344*a* and a plurality of second word line bonding contacts 344*b* distributed on bonding interface 326. Each of first bit line bonding contacts 342*a* may be conductively connected to respective BL 134, and each first word line bonding contacts 342*b* may be conductively connected to a respective WL 108-1 (i.e., conductor layer 108-1), of the first semiconductor structure. Each of second bit line bonding contacts 344*a* may be conductively connected to a respective bit line 138 and each of second word line bonding contacts 344*b* may be conductively connected to a respective WL 118-1 (i.e., conductor layer 118-1), of the second semiconductor structure. In some embodiments, BLs and WLs are each conductively connected to the respective bonding contact through suitable vias and/or interconnects in the respective interconnect layer (e.g., 310 or 316). For example, first conductive routings 340*a* and 340*b* (and other necessary interconnects/vias) may conductively connect BLs 134 and WLs 108-1 (or conductor layers 108-1) to respective first bit line bonding contacts 342*a* and first word line bonding contacts 342*b*, and second conductive routings 346*a* and 346*b* may conductively connect BLs 138 and WLs 118-1 (or conductor layers 118-1) to respective second bit line bonding contacts 344*a* and second word line bonding contacts 344*b*. First and second conductive routings 340 (i.e., 340*a* and 340*b*) and 346 (i.e., 346*a* and 346*b*) may be flexibly designed to route the electrical signals from/to the respective BLs and WLs to the respective bit line bonding contacts and word line bonding contacts, which are positioned at desired locations (e.g., bonding regions) at interface 326. At interface 126, first and second bit line bonding contacts 342*a* and 344*a* may then be aligned bonded with each other, and first and second word line bonding contacts 342b and 344b may be aligned bonded with each other. Accordingly, 3D NAND memory strings 132 and 136, and WLs 108-1 and 118-1, may be conductively connected.

Interconnects in interconnect layer 310 or 316 may conductively connect the conductively-connected BLs (i.e., 134 and 138) and conductively-connected WLs (e.g., 108-1 and 118-1) to the peripheral circuits (and/or other logic process-compatible devices) in the third semiconductor structure. For ease of illustration, second conductive routings 346a and 346b, and TSVs 348a and 348b are depicted to conductively connected the conductively-connected BLs and conductively-connected WLs to respective bonding contacts 358 in bonding layer 380. Bonding contacts 358 may be bonded with bonding contacts 360 in bonding layer 362 of the third semiconductor structure. Suitable interconnects in interconnect layer 320 may conductively connect the bonded bonding contacts 358 and 360 to the peripheral circuits (and/or other logic process-compatible devices) in the third semiconductor structure. Conductively-connected BLs 134 and 138 and conductively-connected WLs 108-1 and 118-1, as well as conductively-connected 3D NAND memory strings 132 and 136, may then be conductively connected to the peripheral circuits (and/or other logic process-compatible devices).

FIG. 3B illustrates another bonded 3D memory device 301 in which BLs and WLs (or conductor layers) of the pair of bonded semiconductor structures are bonded together to conductively connect the memory stacks (and memory cells) in the pair of bonded semiconductor structures, according to some embodiments. Different from bonded 3D memory device 300, the third semiconductor structure, positioned between the first and second semiconductor structures, may be bonded to both the first and second semiconductor structures. As shown in FIG. 3B, the first and third semiconductor structures may be bonded at a bonding interface 327, and the third and second semiconductor structures may be bonded at a bonding interface 379. The pad-out interconnect layer may be formed above the second semiconductor structure. In some embodiments, the third semiconductor structure is bonded to the first and second semiconductor structures in a face-up manner Because the stacking order of the first, second, and third semiconductor structures in bonded 3D memory device 301 is different from that of bonded 3D memory device 300, in some embodiments, the interconnect layers and bonding layers of the first, second, and third semiconductor structures in bonded 3D memory device 301 may be different from those of bonded 3D memory device 300.

In some embodiments, the first semiconductor structure may include an interconnect layer 311 above memory stack 108 and a first bonding layer 313 above interconnect layer 311. First bonding layer 313 may be bonded with a bonding layer 381 of the third semiconductor structure at bonding interface 327. The third semiconductor structure may also include an interconnect layer 321 above device layer 122 and a bonding layer 363 bonded with a second bonding layer 365 of the second semiconductor structure at bonding interface 379. Bonding layers 381 and 363 may each include a plurality of bonding contacts, e.g., 345 and 317, for conductively connect bit line bonding contacts and word line bonding contacts in the first and second semiconductor structures. For example, bonding contacts 345 may include a plurality of bonding contacts for conductively connect first bit line bonding contacts 343a and another plurality of bonding contacts for conductively connect first word line bonding contacts 343b, and bonding contacts 317 may include a plurality of bonding contacts for conductively connect second bit line bonding contacts 315a and another plurality of bonding contacts for conductively connect first word line bonding contacts 315b. In some embodiments, the second semiconductor structure may include an interconnect layer 319 above second bonding layer 365 and under memory stack 118. The pad-out interconnect layer 124 may be formed above semiconductor layer 105.

First bonding layer 313 may include a plurality of first bit line bonding contacts 343a and a plurality of first word line bonding contacts 343b distributed at bonding interface 327 and bonded with bonding contacts 345 of the third semiconductor structure. Second bonding layer 365 may include a plurality of second bit line bonding contacts 315a and a plurality of second word line bonding contacts 315b distributed at bonding interface 379 and bonded with bonding contacts 317 of the third semiconductor structure. First bit line bonding contacts 343a may be conductively connected to BLs 134 through first conductive routings 357, and second bit line bonding contacts 315a may be conductively connected to BLs 138 through second conductive routings 347. First word line bonding contacts 343b may be conductively connected to WLs 108-1 (or conductor layers 108-1) through first conductive routings 357, and second word line bonding contacts 315b may be conductively connected to WLs 118-1 (or conductor layers 118-1) through second conductive routings 347. First and second bit line bonding contacts 343a and 315a may be conductively connected through bonding contacts 317 (in bonding layer 363) and 345 (in bonding layer 381) in the third semiconductor structure, and an interconnect 349a, e.g., a TSV, that extends in the third semiconductor structure. First and second word line bonding contacts 343b and 315b may be conductively connected through bonding contacts 317 (in bonding layer 363) and 345 (in bonding layer 381), and an interconnect 349b, e.g., a TSV, that extends in the third semiconductor structure. BLs 134 and 138, WLs 108-1 and 118-1 (or conductor layers 108-1 and 118-1), and memory stacks 108 and 118 may thus be conductively connected.

The distribution and/or location of first and second bit line bonding contacts 343a and 315a may be the same as or different from the distribution and/or location of first and second bit line bonding contacts 342a and 344a. The distribution and/or location of first and second word line bonding contacts 343b and 315b may be the same as or different from the distribution and/or location of first and second word line bonding contacts 342b and 344b. Depending on the distribution of these bonding contacts, the distribution of first and second conductive routings 357 and 347 may be determined/adjusted accordingly to conductively connect first and second bit line bonding contacts 343a and 315a respectively to BLs 134 and 138, and conductively connect first and second word line bonding contacts 343b and 315b respectively to WLs 108-1 and 118-1. Thus, the conductively-connected WLs 108-1 and 118-1 may be conductively connected to the peripheral circuits (and/or other logic process-compatible devices) in the third semiconductor structure through the same interconnects, and BLs 134 and 138 may be conductively connected to the peripheral circuits (and/or other logic process-compatible devices) in the third semiconductor structure through the same interconnects. 3D NAND memory strings 132 and 136 in the bonded memory stacks 108 and 118 and WLs (or conductor layers 108-1 and 118-1) may then be conductively connected.

FIG. 4 illustrates a schematic plan view 400 of a bonded 3D memory device having conductively-connected BLs and/or conductively-connected WLs, according to some embodiments. The plan view may illustrate the layout/location of conductively-connected BLs and/or conductively-connected WLs in bonded 3D memory devices 100, 101, 200, 201, 300, and 301. As shown in FIG. 4, plan view 400 may include a core array region, one or more (e.g., a pair) of array common source (ACS) driver pad-out regions, one or more (e.g., a pair) of BL bonding and pad-out regions, one or more (e.g., a pair) of WL bonding and pad-out regions, and a bonding pad region. The core array region may represent a region that memory arrays are placed. The ACS driver pad-out regions may represent regions where contact pads conductively connecting the ACS of the memory arrays and the peripheral circuits are located. The bonding pad region may represent a region that contact pads for the overall chip (e.g., peripheral circuits) are located. The BL bonding and pad-out regions may represent regions in which the BLs of the bonded memory stacks are conductively connected through bonding and interconnects conductively connected to the conductively-connected BLs are located. The WL bonding and pad-out regions may represent regions in which the WLs of the bonded memory stacks are conductively connected through bonding and interconnects conductively connected to the conductively-connected WLs are located. In some embodiments, the number, locations, and/or area of the BL and WL bonding and pad-out regions are determined (e.g., optimized), e.g., to accommodate the layout and/or arrangement of the overall chip.

In various embodiments, each of the memory stacks (e.g., 108 and 118) of the pair of bonded semiconductor structures may be flexibly placed in the core array region at a respective desired location, e.g., at a center of the chip, to optimize the overall arrangement of structures/devices in the chip. The memory stacks (e.g., 108 and 118) may or may not be aligned with each other vertically (e.g., along the z-axis). In some embodiments, the memory stacks may be arranged in a staggered manner vertically. That is, the memory stacks are not aligned with one another along the z-axis, e.g., to optimize the overall arrangement/routing for the chip. The conductive routings (e.g., 140, 146, 141, 147, 240, 246, 241, 247, 340a, 340b, 346a, and/or 346b) in the respective semiconductor structure may be designed to conductively connect and route the respective WLs and/or BLs to the respective bonding and pad-out regions to be conductively connected to respective bonding contacts. That is, one end of each conductive routing may be in contact with and/or conductively connected to the respective BL/WL, and the other end of the conductively routing may be in contact with and/or conductively connected to the respective bonding contact. The arrangement of the conductive routing between the two ends may be subjected to the layout of structures/devices in the respective semiconductor structure. In various embodiments, the arrangement of conductive routings in each semiconductor structure may be the same or different.

The bonding contacts, in contact with or conductively connected to the respective conductive routing, may be distributed in the respective bonding layer at the respective bonding and pad-out region, bonded with respective bonding contacts in the other bonding layer. Depending on factors such as the total number of bonding contacts and/or the locations of the memory stacks, in some embodiments, bonding contacts of the pair of bonded semiconductor structures are divided into more than one portions, which are respectively located in the respective bonding and pad-out region. The division of bonding contacts may allow the arrangement of the conductive routings and/or interconnects to be optimized. For example, the lengths and complexity of the conductive routings may be minimized by routing the BLs and/WLs to a respective bonding and pad-out region that is closer to the BLs and/or WLs. In some embodiments, memory stacks 108 and 118 may be placed in the core array region.

In an example, for bonded 3D memory devices 100 and 101, first and second bit line bonding contacts (e.g., 142 and 144 in bonded 3D memory device 100, and 143 and 145 in bonded 3D memory device 101) may be bonded in the BL bonding and pad-out regions. In some embodiments, depending on the distances from the BLs of each semiconductor structure to each BL bonding and pad-out region, the total bonded first and second bit line bonding contacts are divided into a plurality of portions (e.g., two portions) so each BL bonding and pad-out region includes a portion of the bonded first and second bit line bonding contacts. For example, the bonded first and second bit line bonding contacts may be evenly divided to distribute in the two BL bonding and pad-out regions. Meanwhile, a portion of WLs 108-1 (or conductor layers 108-1) and a portion of WLs 118-1 (or conductor layers 118-1) may be separately routed to one of the WL bonding and pad-out regions by respective word line contacts 150 and 174 and any suitable interconnects and/or bonding contacts. The other portion of WLs 108-1 (or conductor layers 108-1) and the other portion of WLs 118-1 (or conductor layers 118-1) may be separately routed to the other one of the WL bonding and pad-out regions by respective word line contacts 150 and 174 and any suitable interconnects and/or bonding contacts. In some embodiments, the WLs are evenly divided into two portions, each being routed to the closer WL bonding and pad-out region.

In this example, in the BL bonding and pad-out regions, the bonded first and second bit line bonding contacts may further be conductively connected to peripheral circuits and/or contact pads (e.g., 172) through suitable interconnects (e.g., 148 or 149) and bonding contacts (e.g., 158 and 160). In the WL bonding and pad-out regions, word line contacts 150 and 174 may, separately, be conductively connected to peripheral circuits and/or contact pads (e.g., 172) through suitable interconnects (e.g., 154) and bonding contacts (e.g., 158 and 160).

In another example, for bonded 3D memory devices 200 and 201, first and second word line bonding contacts (e.g., 242 and 244 in bonded 3D memory device 200, and 243 and 245 in bonded 3D memory device 201) may be bonded respectively in the WL bonding and pad-out regions. In some embodiments, depending on the distances from the WLs of each semiconductor structure each WL bonding and pad-out region, the bonded first and second word line bonding contacts are divided, such that each WL bonding and pad-out region includes a portion of the total bonded first and second word line bonding contacts. For example, the bonded first and second word line bonding contacts may be evenly divided to distribute in the two WL bonding and pad-out regions. Meanwhile, a portion of BLs 134 and a portion of BLs 138 may be separately routed to one of the BL bonding and pad-out regions by respective interconnects and/or bonding contacts. The other portion of BLs 134 and the other portion of BLs 138 may be separately routed to the other one of the BL bonding and pad-out regions by respective interconnects and/or bonding contacts. In some embodiments, BLs 134 and 138 are evenly divided into two portions, each being routed to the closer BL bonding and pad-out region.

In this example, in the WL bonding and pad-out regions, the bonded first and second word line bonding contacts may further be conductively connected to peripheral circuits and/or contact pads (e.g., 172) through suitable interconnects (e.g., 248 or 249) and bonding contacts (e.g., 258 and 260). In the BL bonding and pad-out regions, bonding contacts (e.g., 258) separately and conductively connected to BLs 134 and 138 may be conductively connected to peripheral circuits and/or contact pads (e.g., 172) through suitable interconnects and bonding contacts (e.g., 258 and 260).

In a third example, for bonded 3D memory devices 300 and 301, first and second bit line bonding contacts (e.g., 342a and 344a in bonded 3D memory device 300, and 343a and 315a in bonded 3D memory device 301) may be aligned and bonded respectively in the BL bonding and pad-out regions, and first and second word line bonding contacts (e.g., 342b and 344b in bonded 3D memory device 300, and 343b and 315b in bonded 3D memory device 301) may be aligned and bonded respectively in the WL bonding and pad-out regions. In some embodiments, depending on the distances from the BLs of each semiconductor structure to each BL bonding and pad-out region, and/or from the WLs of each semiconductor structure to each WL bonding and pad-out region, the bonded first and second bit line bonding contacts and the bonded first and second word line bonding contacts are each divided, such that each BL bonding and pad-out region has a portion of the total bonded first and second bit line bonding contacts, and each WL bonding and pad-out region has a portion of the total bonded first and second word line bonding contacts. For example, the bonded first and second word line bonding contacts may be evenly divided to distribute in the two WL bonding and pad-out regions. Meanwhile, the bonded first and second bit line bonding contacts may be evenly divided to distribute in the two BL bonding and pad-out regions. In this example, in the WL bonding and pad-out regions, the bonded first and second word line bonding contacts may further be conductively connected to peripheral circuits and/or contact pads (e.g., 172) through suitable interconnects (e.g., 348b or 349b) and bonding contacts (e.g., 358 and 360 in bonded 3D memory device 300, and 315b, 317, 345, and 343b in bonded 3D memory device 301). In the BL bonding and pad-out regions, the bonded first and second bit line bonding contacts may further be conductively connected to peripheral circuits and/or contact pads (e.g., 172) through suitable interconnects (e.g., 348a or 349a) and bonding contacts (e.g., 358 and 360 in bonded 3D memory device 300, and 315a, 317, 345, and 343a in bonded 3D memory device 301).

Figure 5A:
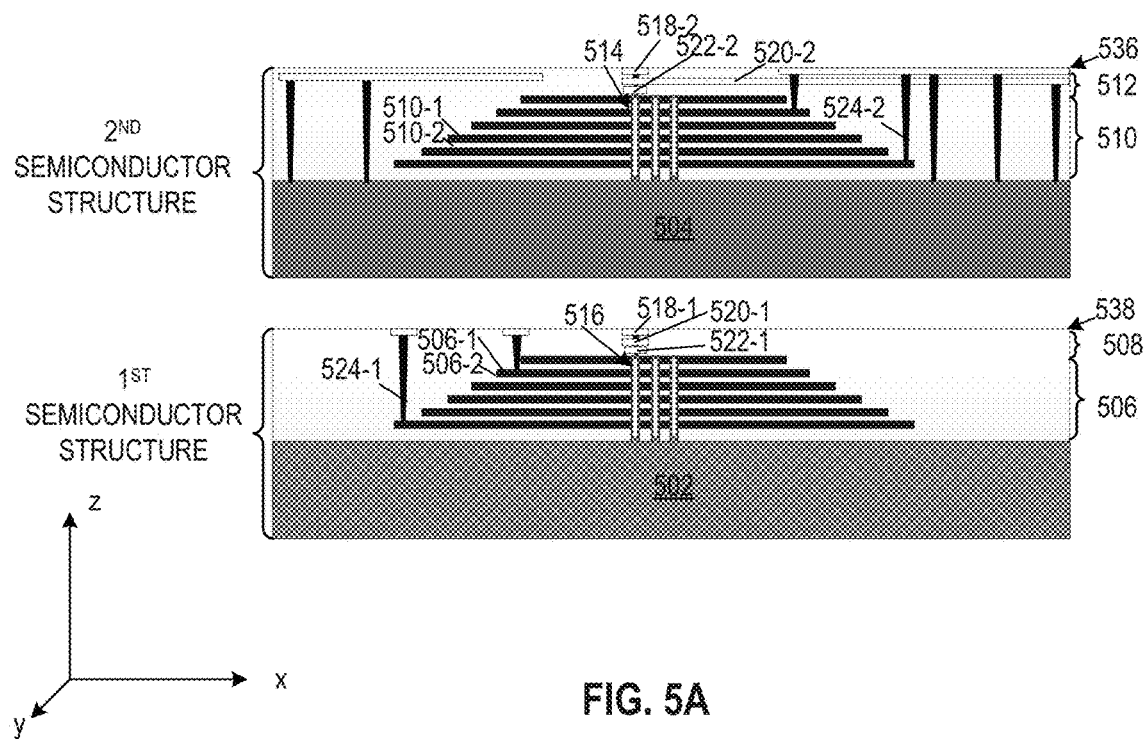
FIGS. 5A-5F illustrate an exemplary fabrication process to form a bonded 3D memory device having a pair of bonded semiconductor structures with BLs routed and conductively connected through bonding, according to some embodiments.
Figure 5B:
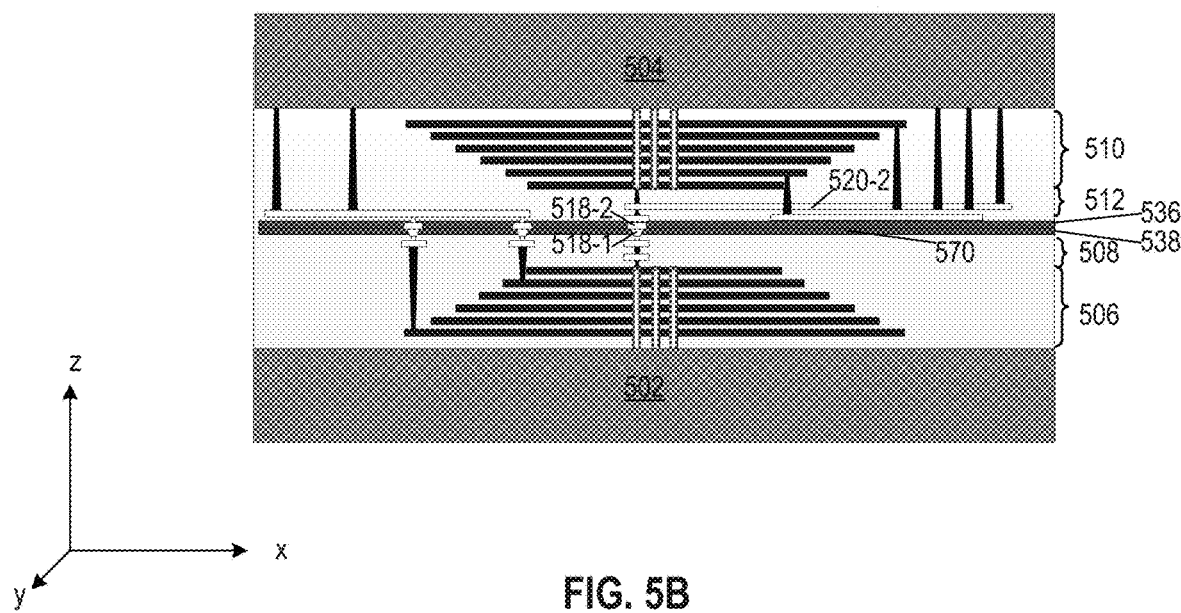
Figure 5C:
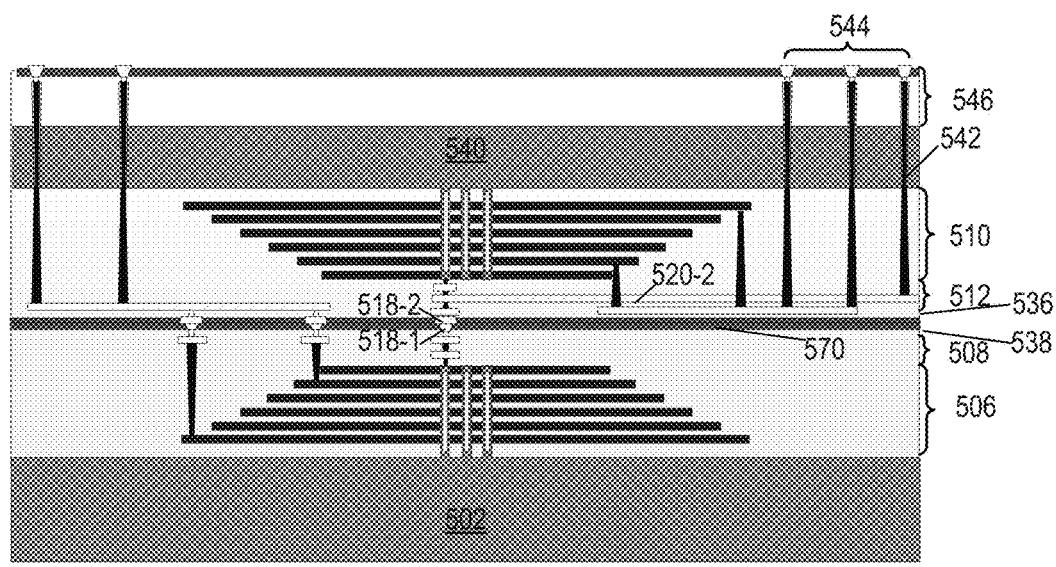
Figure 5C:
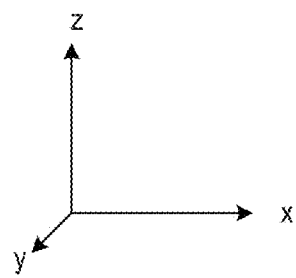
Figure 5D:
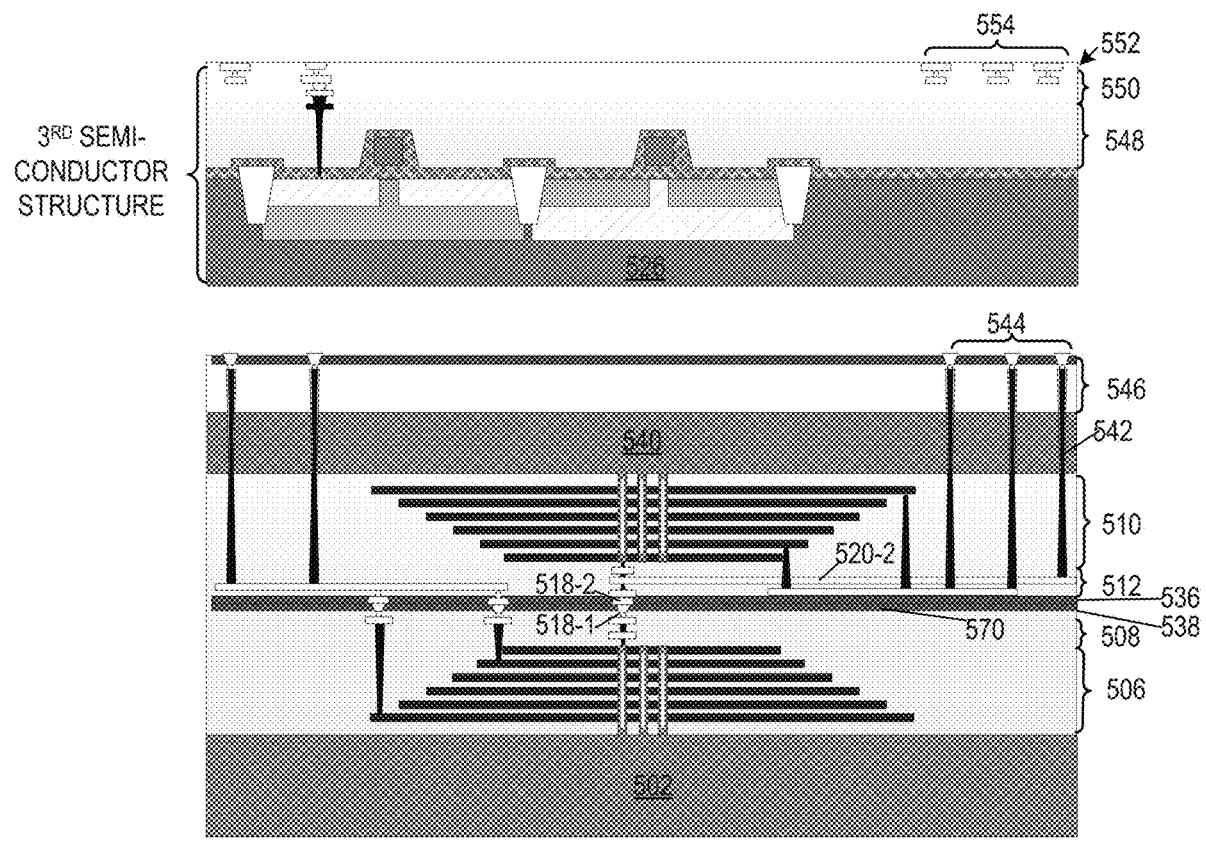
Figure 5E:
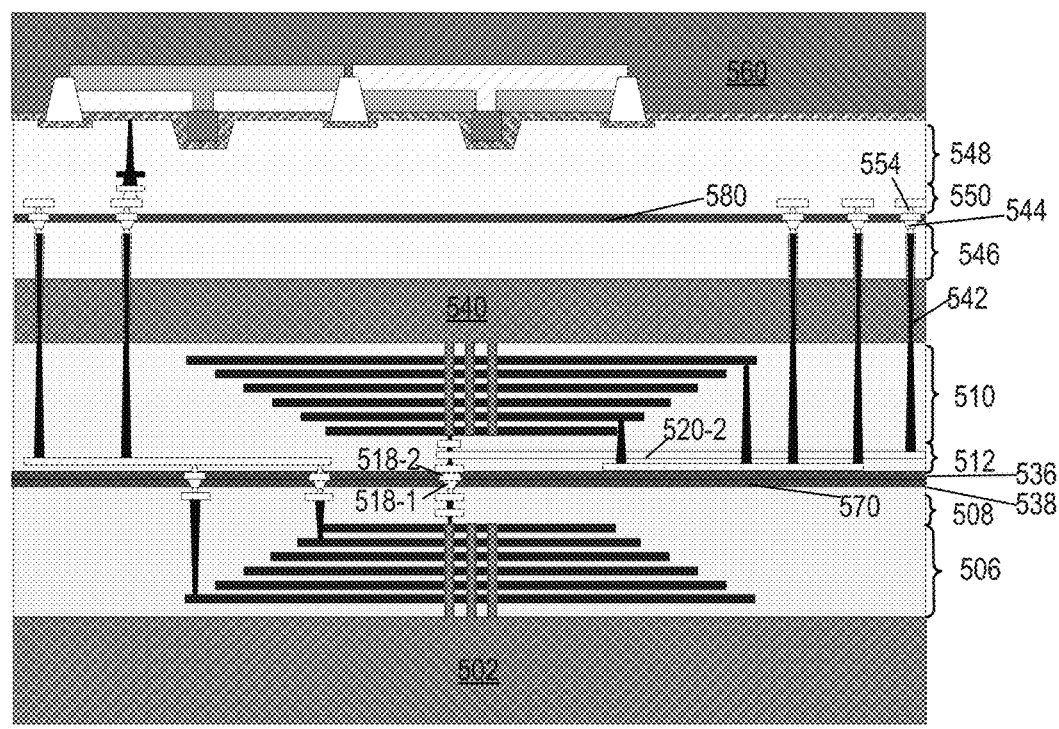
Figure 5F:
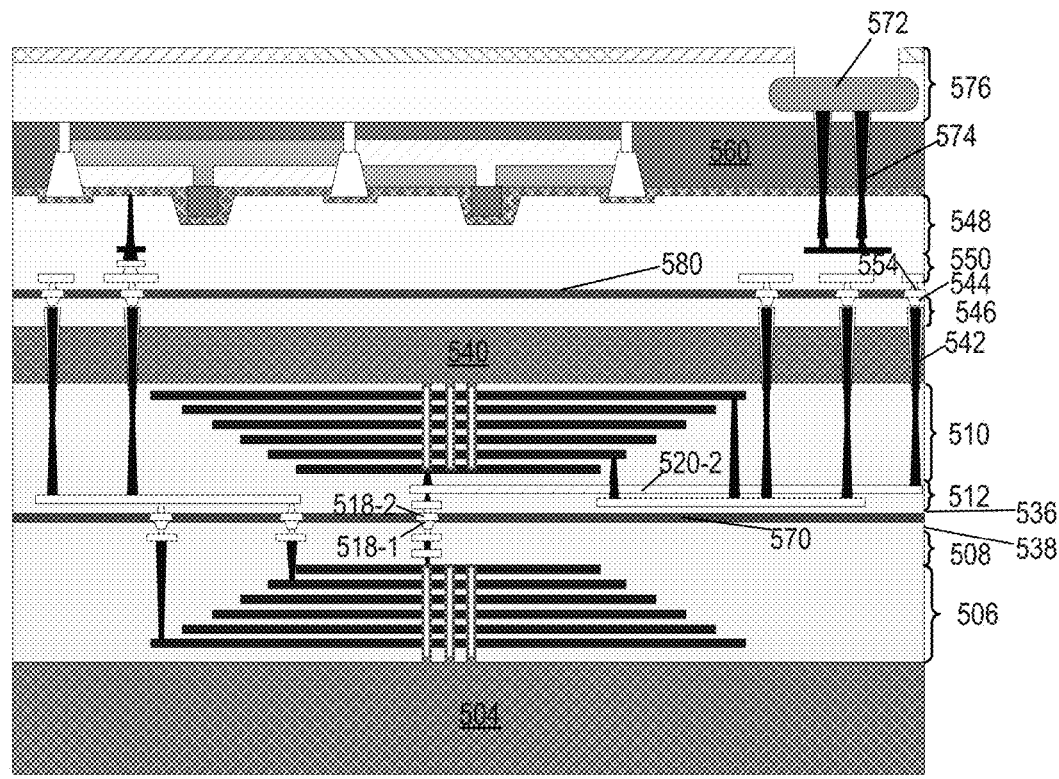
Figure 6A:
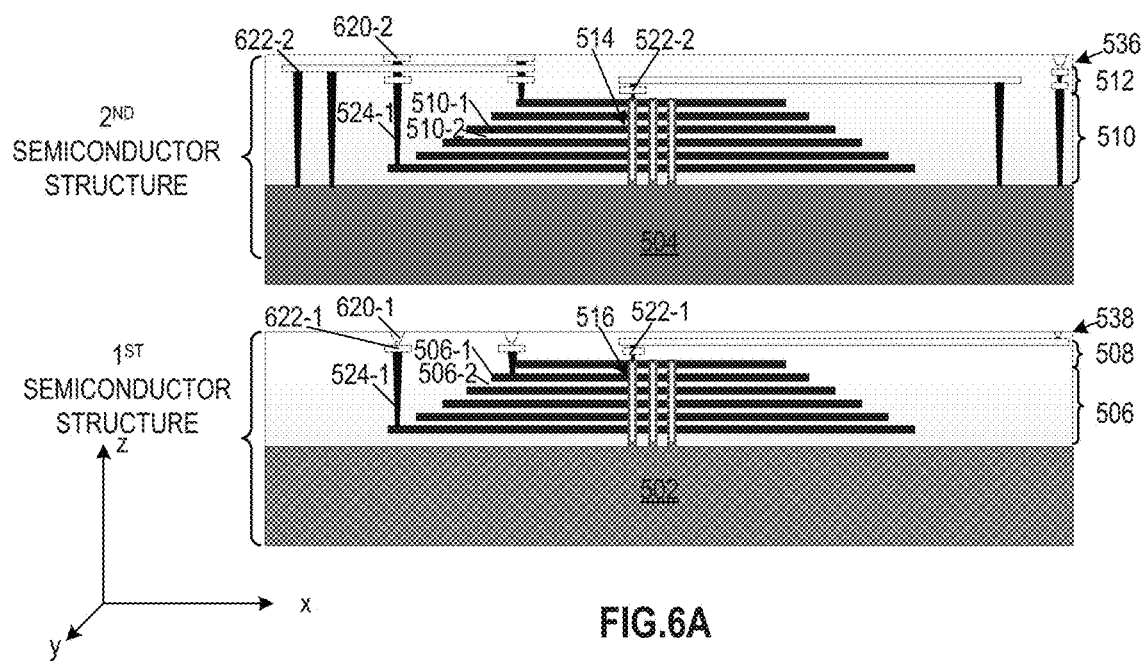
FIGS. 6A and 6B illustrate a part of an exemplary fabrication process to form a bonded 3D memory device having a pair of bonded semiconductor structures with WLs routed and conductively connected through bonding, according to some embodiments.
Figure 6B:
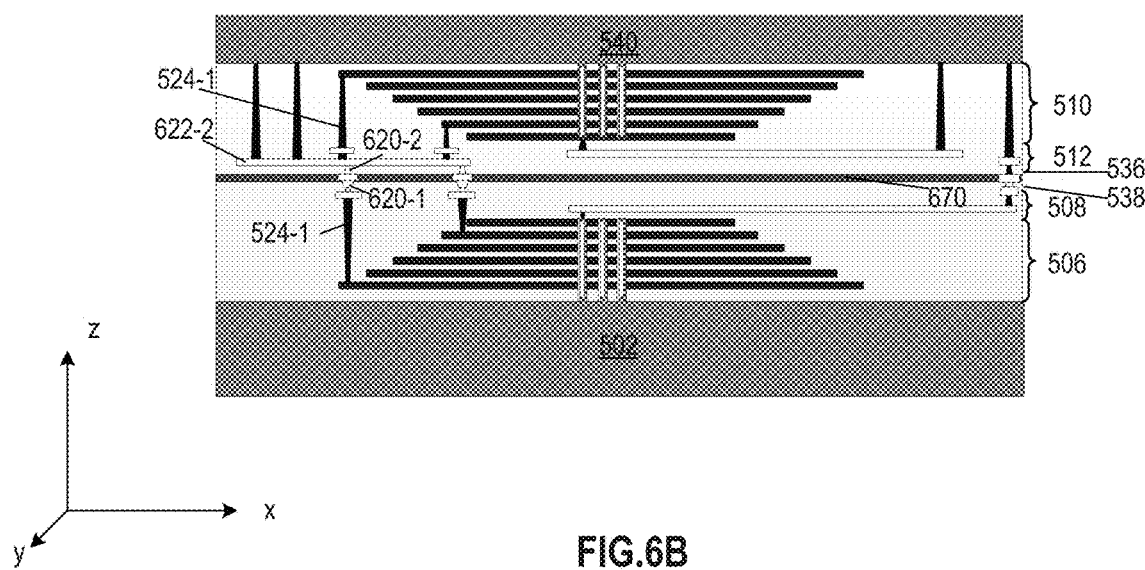
Figure 7A:
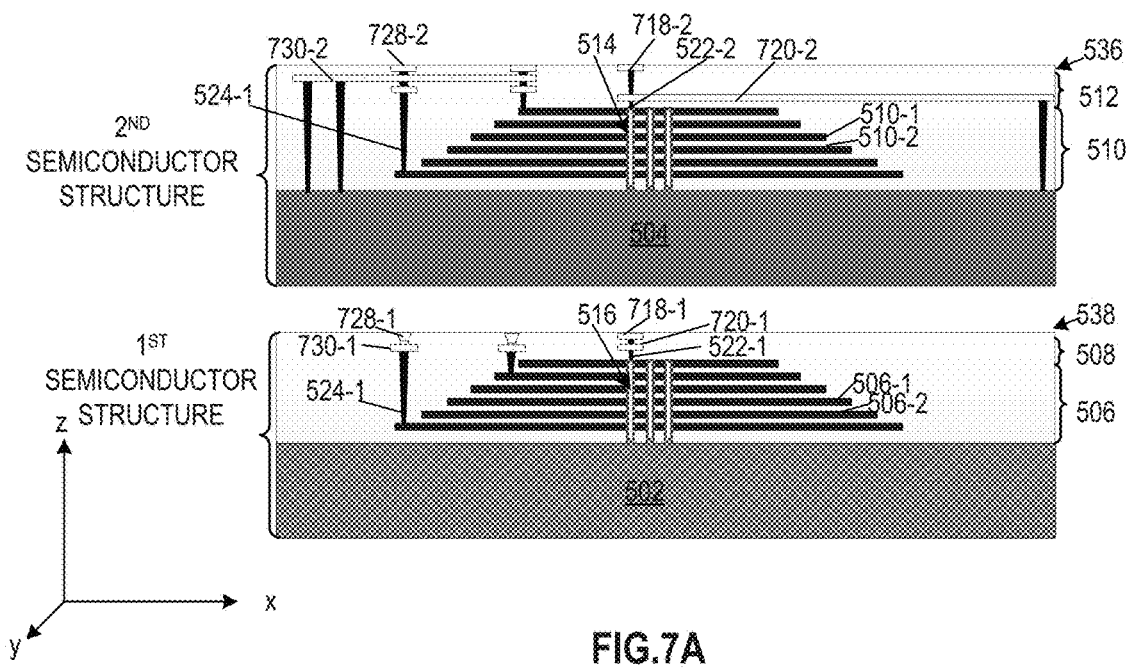
FIGS. 7A and 7B illustrate a part of an exemplary fabrication process to form a bonded 3D memory device having a pair of bonded semiconductor structures with BLs and WLs respectively routed and conductively connected through bonding, according to some embodiments.
Figure 7B:
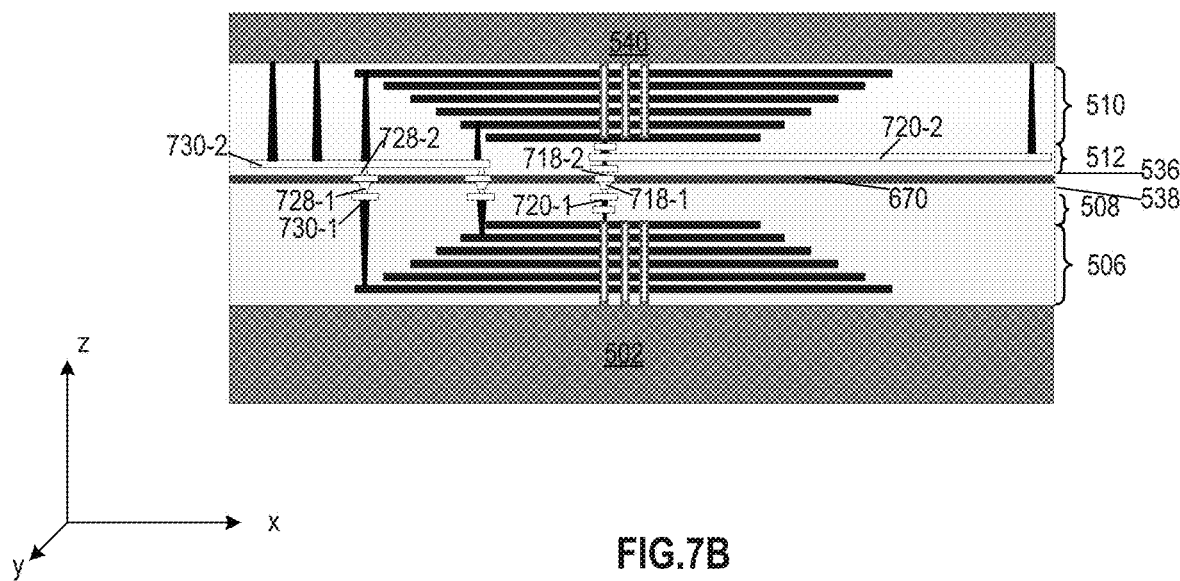
Figure 13:
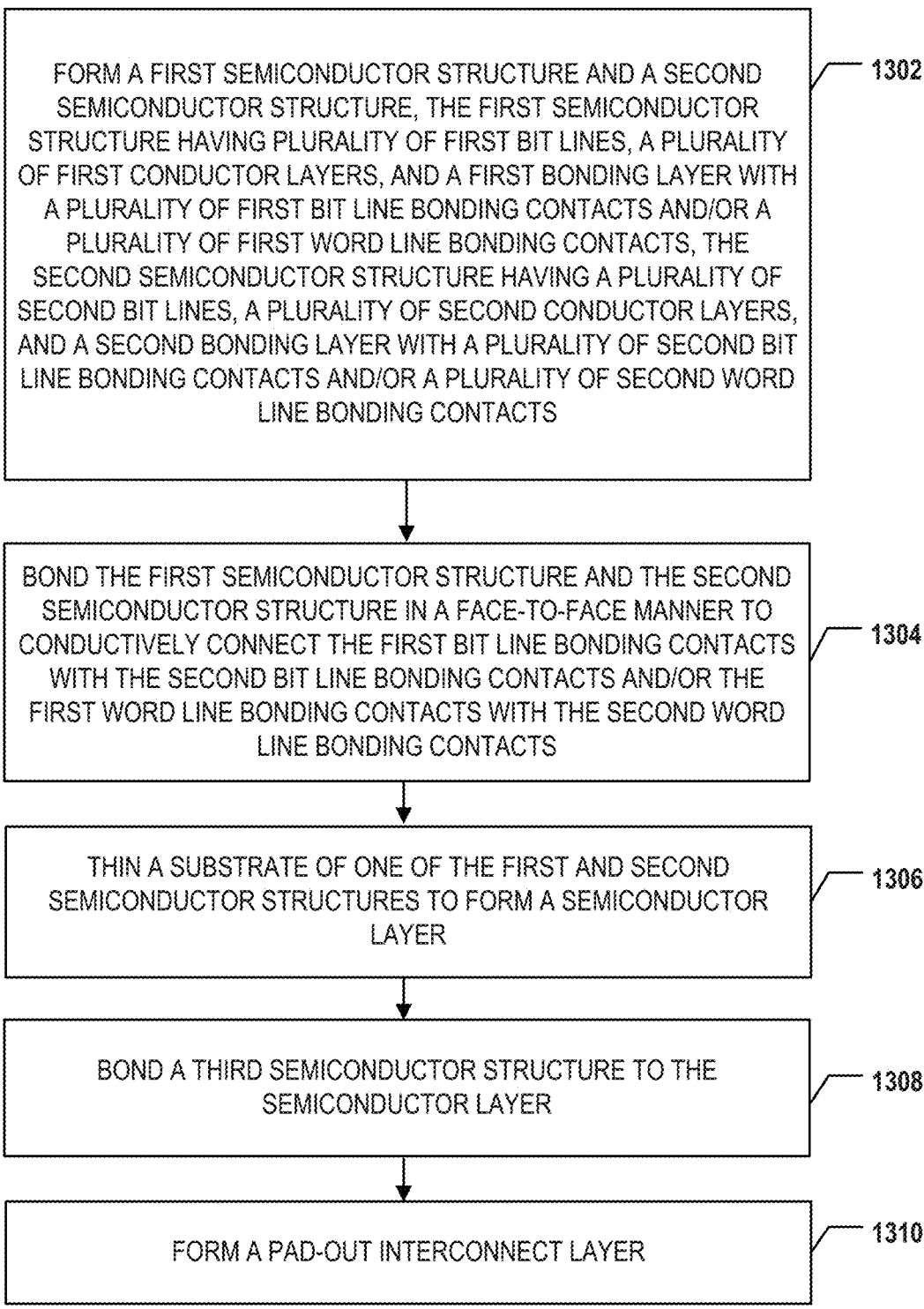
FIG. 13 illustrates a flowchart of an exemplary fabrication process to form a bonded 3D memory device having a pair of bonded semiconductor structures, according to some embodiments.

FIGS. 5A-5F illustrate an exemplary fabrication process to form a bonded 3D memory device having a pair of bonded semiconductor structures with BLs conductively connected, according to some embodiments. FIGS. 6A and 6B illustrate a part of an exemplary fabrication process to form a bonded 3D memory device having a pair of bonded semiconductor structures with WLs bonded together, according to some embodiments. FIGS. 7A and 7B illustrate a part of an exemplary fabrication process to form a bonded 3D memory device having a pair of bonded semiconductor structures with both BLs and WLs conductively connected, respectively, according to some embodiments. FIG. 13 is a flowchart of an exemplary method 1300 for forming the bonded 3D memory device, according to some embodiments. It is understood that the operations shown in method 1300 are not exhaustive and that other operations can be performed as well before, after, or between any of the illustrated operations. Further, some of the operations may be performed simultaneously, or in a different order than shown in FIG. 13. Method 1300 may be employed to form bonded 3D memory devices shown in FIGS. 1A, 2A, and 3B.

Referring to FIG. 13, method 1300 starts at operation 1302, in which a first semiconductor structure and a second semiconductor structure are formed. The first semiconductor structure includes a plurality of first BLs, a plurality of first conductor layers, and a first bonding layer with a plurality of first bit line bonding contacts and/or a plurality of first word line bonding contacts. The second semiconductor structure includes a plurality of second BLs, a plurality of second conductor layers, and a second bonding layer with a plurality of second bit line bonding contacts and/or a plurality of second word line bonding contacts. FIGS. 5A, 6A, and 7A illustrate corresponding structures.

FIG. 5A illustrates the first and second semiconductor structures each having a bonding layer with a plurality of bit line bonding contacts. As shown in FIG. 5A, the first and second semiconductor structures may be formed. The first semiconductor structure may include a substrate 502, a memory stack 506 above substrate 502, a plurality of 3D NAND memory strings 516 extending vertically through memory stack 506, a plurality of first BLs 522-1 conductively connected to 3D NAND memory strings 516. Memory stack 506 may include a plurality of interleaved conductor layers 506-1 and dielectric layers 506-2. Conductor layers 506-1 may each be a part of a WL, conductively connected to one or more word line contacts 524-1. The first semiconductor structure may also include an interconnect layer 508 above memory stack 506 and a first bonding layer 538 above or as a part of interconnect layer 508. First bonding layer 538 may include a plurality of first bit line bonding contacts 518-1, which are conductively connected to first BLs 522-1 through a plurality of first conductive routings 520-1 in interconnect layer 508.

The second semiconductor structure may be similar to the first semiconductor structure. As shown in FIG. 5A, the second semiconductor structure may include a substrate 504, a memory stack 510 above substrate 504, a plurality of 3D NAND memory strings 514 extending vertically through memory stack 510, a plurality of second BLs 522-2 conductively connected to 3D NAND memory strings 514. Memory stack 510 may include a plurality of interleaved conductor layers 510-1 and dielectric layers 510-2. Conductor layers 510-1 may each be a part of a WL, conductively connected to one or more word line contacts 524-2. The first semiconductor structure may also include an interconnect layer 512 above memory stack 510 and a second bonding layer 536 above or as a part of interconnect layer 512. Second bonding layer 536 may include a plurality of second bit line bonding contacts 518-2, which are conductively connected to second BLs 522-2 through a plurality of second conductive routings 520-2 in interconnect layer 512. Memory stacks 506 and 510 may have the same or different levels/number of staircases. In some embodiments, each first bit line bonding contact 518-1 corresponds to respective second bit line bonding contact 518-2.

FIG. 6A illustrates the first and semiconductor structures each having a bonding layer with a plurality of word line bonding contacts. Different from the first and second semiconductor structures shown in FIG. 5A, in FIG. 6A, first bonding layer 538 of the first semiconductor structure includes a plurality of first word line bonding contacts 620-1, which are conductively connected to WLs 506-1 (or conductor layers 506-1) through a plurality of first conductive routings 622-1 that are conductively connected to word line contacts 524-1. Second bonding layer 536 of the second semiconductor structure includes a plurality of second word line bonding contacts 620-2, which are conductively connected to WLs 510-1 (or conductor layers 510-1) through a plurality of second conductive routings 622-2 that are conductively connected to word line contacts 524-1. In some embodiments, first and second conductive routings 622-1 and 622-2 are respectively in interconnect layers 508 and 512. In some embodiments, each first word line bonding contact 620-1 corresponds to a respective second word line bonding contact 620-2.

FIG. 7A illustrates the first and semiconductor structures each having a bonding layer with a plurality of bit line bonding contacts and a plurality of word line bonding contacts. Different from the first and second semiconductor structures shown in FIGS. 5A and 6A, in FIG. 7A, first bonding layer 538 of the first semiconductor structure includes a plurality of first bit line bonding contacts 718-1 and a plurality of first word line bonding contacts 728-1. First bit line bonding contacts 718-1 may be conductively connected to first BLs 522-1 through a plurality of first conductive routings 720-1, and first word line bonding contacts 728-1 may be conductively connected to WLs 506-1 (or conductor layers 506-1) through a plurality of first conductive routings 730-1 that are conductively connected to word line contacts 524-1. Second bonding layer 536 of the second semiconductor structure includes a plurality of second bit line bonding contacts 718-2 and a plurality of second word line bonding contacts 728-2. Second bit line bonding contacts 718-2 may be conductively connected to second BLs 522-2 through a plurality of second conductive routings 720-2, and second word line bonding contacts 728-2 may be conductively connected to WLs 510-1 (or conductor layers 510-1) through a plurality of second conductive routings 730-2 that are conductively connected to word line contacts 524-2. In some embodiments, each first bit line bonding contact 718-1 corresponds to a respective second bit line bonding contact 718-2, and each first word line bonding contact 728-1 corresponds to a respective second word line bonding contact 728-2.

The first and second semiconductor structures may be formed by similar methods/processes. In some embodiments, a memory stack is formed above a substrate, and an array of 3D NAND memory strings extending vertically through the memory stack are formed. As illustrated in FIGS. 5A, 6A, and 7A, interleaved sacrificial layers (not shown) and dielectric layers (e.g., 506-2 or 510-2) are formed above the substrate (e.g., 502 or 504). The interleaved sacrificial layers and dielectric layers can form a dielectric stack (not shown). In some embodiments, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layered deposition (ALD), or any combination thereof. In some embodiments, a memory stack (e.g., 506 or 510) can be formed by a gate replacement process, e.g., replacing the sacrificial layers with a plurality of conductor layers (e.g., 506-1 or 510-1) using wet/dry etch of the sacrificial layers selective to the dielectric layers and filling the resulting recesses with the conductor layers. As a result, the memory stack (e.g., 506 or 510) can include interleaved conductor layers (e.g., 506-1 or 510-1) and dielectric layers (e.g., 506-2 or 510-2). In some embodiments, each conductor layer includes a metal layer, such as a layer of tungsten. It is understood that the memory stack may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between the memory stack and the substrate.

A plurality of 3D NAND memory strings (e.g., 516 or 514) may be formed above the substrate, each extending vertically through interleaved conductor layers and dielectric layers of the memory stack. In some embodiments, fabrication processes to form 3D NAND memory strings include forming a channel hole through the memory stack and into the substrate using dry etching/and or wet etching, such as deep reactive-ion etching (DRIE), followed by epitaxially growing a plug in the lower portion of the channel hole from the substrate. In some embodiments, the fabrication processes to form the 3D NAND memory strings also include subsequently filling the channel holes each with a plurality of layers, such as a memory film (e.g., a tunneling layer, a storage layer, and a blocking layer) and a semiconductor layer, using thin film deposition processes such as ALD, CVD, PVD, or any combination thereof. In some embodiments, the fabrication processes to form the 3D NAND memory strings further include forming another plug in the upper portion of each channel hole by etching a recess at the upper ends of the 3D NAND memory strings, followed by filling the recess with a semiconductor material using thin film deposition processes such as ALD, CVD, PVD, or any combination thereof.

An interconnect layer (e.g., 508 or 512) may be formed above the memory stack (e.g., 506 or 510) and the array of 3D NAND memory strings. The interconnect layer can include interconnects of MEOL and/or BEOL in a plurality of ILD layers to make electrical connections with the array of 3D NAND memory strings. In some embodiments, the interconnect layer includes multiple ILD layers and interconnects therein formed in multiple processes. For example, the interconnects in the interconnect layer can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof.

In some embodiments, the formation of the interconnect layer (e.g., 508 or 512) also includes forming a plurality of BLs (e.g., 522-1 or 522-2) conductively connected to the 3D NAND memory strings (e.g., 516 or 514) and a plurality of conductive routings (e.g., 520-1, 520-1, 720-1, and 720-2) conductively connected to the BLs. In some embodiments, the formation of the interconnect layer also includes forming a plurality of conductive routings (e.g., 622-1, 622-2, 730-1, and 730-2) conductively connected to the WLs (e.g., 506-1 and 510-1). Suitable vias and/or interconnects may be formed between the BLs and the conductive routings to make electrical connections. The formation of the BLs and the conductive routings may be a part of the formation of the interconnects, and the detailed description is thus not repeated.

A bonding layer (e.g., 538 or 536) may be formed above the interconnect layer. The bonding layer can include a plurality of bit line bonding contacts (e.g., 518-1, 518-2, 718-1, and 718-2) and/or a plurality of word line bonding contacts (e.g., 620-1, 620-2, 728-1, and 728-2), surrounded by dielectrics. In some embodiments, a dielectric layer is deposited on the top surface of the interconnect layer (e.g., 508 or 512) by one or more thin film deposition processes including, but not limited to, CVD, PVD, ALD, or any combination thereof. The bonding contacts then can be formed through the dielectric layer and in contact with the interconnects in the interconnect layer by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor. In some embodiments, the bit line bonding contacts (e.g., 518-1, 518-2, 718-1, and 718-2) are conductively connected to and/or in contact with respective conductive routings (e.g., 520-1, 520-2, 720-1, and 720-2) to be conductively connected to the BLs (e.g., 522-1 and 522-2). In some embodiments, the word line bonding contacts (e.g., 620-1, 620-2, 728-1, and 728-2) are conductively connected to and/or in contact with respective conductive routings (e.g., 622-1, 622-2, 730-1, and 730-2).

Referring back to FIG. 13, after the formation of the first and second semiconductor structures, method 1300 proceeds to operation 1304, in which the first and second semiconductor structures are bonded in a face-to-face manner to conductively connect the first bit line bonding contacts with the second bit line bonding contacts and/or the first word line bonding contacts with the second word line bonding contacts. FIGS. 5B, 6B, and 7B illustrate corresponding structures.

As shown in FIGS. 5B, 6B, and 7B, the first and second semiconductor structures may be bonded in a face-to-face manner, thereby forming a bonding interface. In some embodiments, the second semiconductor structure is flipped to be up-side-down and the first semiconductor structure is facing up. The second semiconductor structure may then be above the first semiconductor structure with substrate 504 facing up. In some embodiments, bonding interfaces 570, 670, and 770 are respectively formed between the first and second semiconductor structures in FIGS. 5B, 6B, and 7B. In some embodiments, a treatment process, e.g., a plasma treatment, a wet treatment, and/or a thermal treatment, is applied to the bonding surfaces prior to the bonding. The bonding can include hybrid bonding. In some embodiments, each first bit line bonding contact (e.g., 518-1 or 718-1) is aligned with and bonded to a respective second bit line bonding contact (e.g., 518-2 or 718-2), as shown in FIGS. 5B and 7B. In some embodiments, each first word line bonding contact (e.g., 620-1 or 728-1) is aligned with and bonded to a respective second word line bonding contact (e.g., 620-2 or 728-2), as shown in FIGS. 6B and 7B. The bonding may include hybrid bonding.

Figure 15:
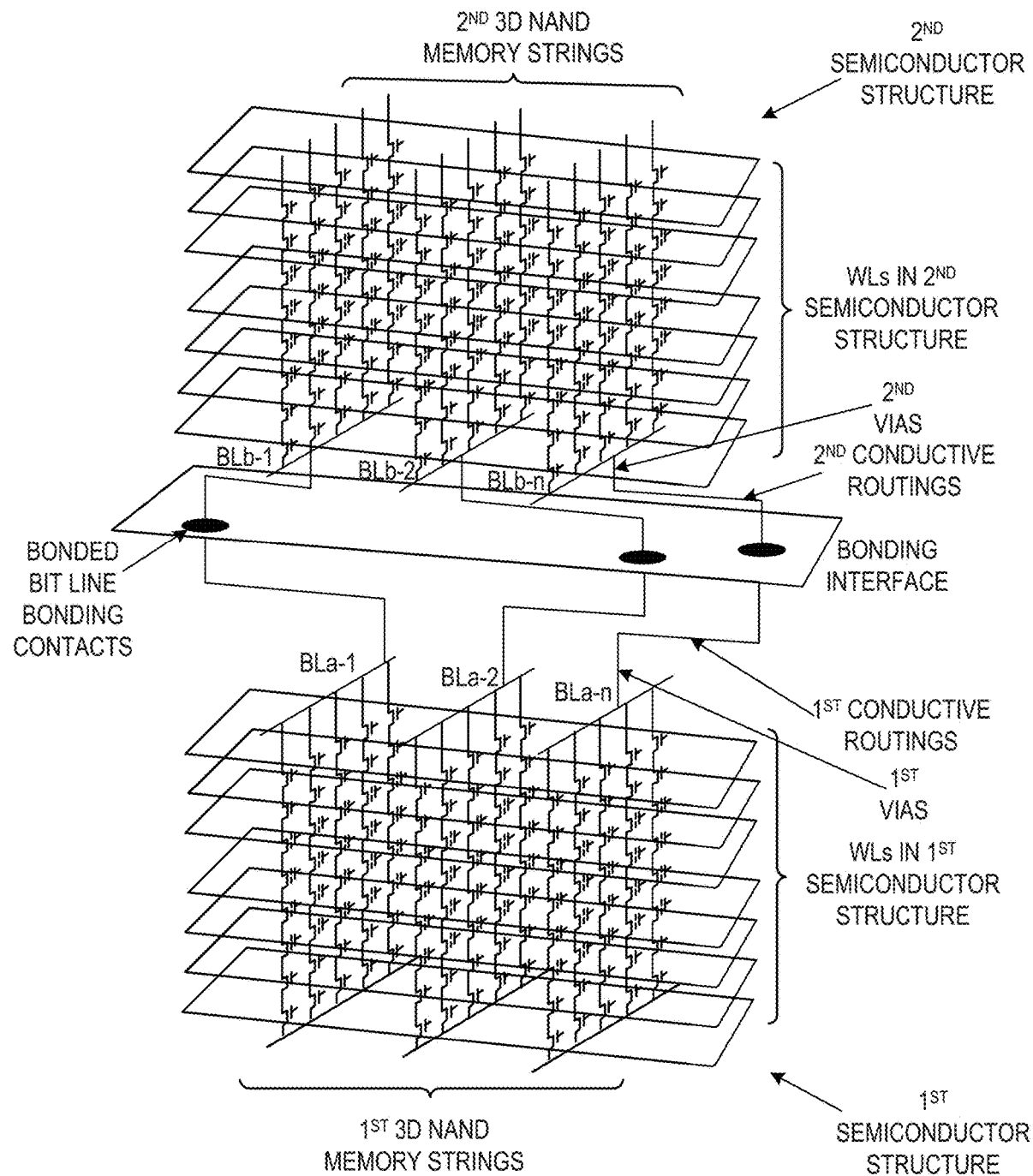
FIG. 15 illustrates a schematic view of an exemplary pair of bonded semiconductor structures having BLs routed and conductively connected, according to some embodiments.

A schematic view of a pair of bonded semiconductor structures is shown in FIG. 15, according to some embodiments. FIG. 15 illustrates the spatial relationship of different components, such as BLs, WLs, bit line bonding contacts, conductive routings, and memory strings, in a pair of bonded semiconductor structures.

As shown in FIG. 15, a second semiconductor structure is bonded with a first semiconductor structure at a bonding interface. The first semiconductor structure may include a plurality of first memory strings (e.g., 516), a plurality of first BLs BLa-1, BLa-1, . . . , BLa-n (e.g., 522-1) conductively connected to the first memory strings, a plurality of first bit line bonding contacts distributed on the bonding interface, and a plurality of first conductive routings (e.g., 520-1) conductively connecting the bit line bonding contacts and the BLs. Similarly, the second semiconductor structure may include a plurality of second memory strings (e.g., 514), a plurality of second BLs BLb-1, BLb-2, . . . , BLb-n (e.g., 522-2) conductively connected to the second memory strings, a plurality of second bit line bonding contacts distributed on the bonding interface, and a plurality of second conductive routings (e.g., 520-2) conductively connecting the second bit line bonding contacts and the second BLs.

In some embodiments, each BL may be conductively connected to the respective conductive routings through suitable vias, which can be a part of the respective interconnect layer (e.g., 508 or 512) of the respective semiconductor structure. As shown in FIG. 15, the first BLs may be conductively connected to the first conductive routings through first vias, and the second BLs may be conductively connected to the second conductive routings through second vias. In some embodiments, one end of a first/second conductive routing is in contact with a respective via, and the other end of the first/second conductive routings is in contact with the respective bonding layer (e.g., the respective bit line bonding contacts in the bonding layer that is laterally away from the respective BLs, not shown). The first and second vias may extend vertically in the respective interconnect layer. The other end of the first and second bit line conductive routings may extend to a desired bonding location (e.g., bit line bonding regions) in the respective bonding layer to route/extend the electrical signals of the first and second BLs to the bonding location. The first and second bit line bonding contacts may be distributed on the bonding layers and bonded together at the bonding interface. Thus, the first and second BLs can be routed and conductively connected at the desired bonding location on the bonding interface.

As shown in FIG. 15, the first and second semiconductor structures may also include first and second conductor layers (e.g., 506-1 and 510-1), functioning as the first and second WLs of the first and second semiconductor structures. The first and second conductor layers may each be a part of a respective memory stack (e.g., 506 and 510). The first and second 3D NAND memory strings may extend vertically through the respective memory stack. Although not shown in the figures, the first and second WLs may also be routed to a desired bonding location (e.g., word line bonding regions) in the respective bonding layer, by suitable interconnects such as word line contacts (e.g., 524-1 and 524-1, and the respective conductive routings). The first and second word line bonding contacts may be distributed on the bonding layers and bonded together at the bonding interface. Thus, the first and second WLs can be routed and conductively connected at the desired bonding location on the bonding interface. In some embodiments, the first and second BLs and the first and second WLs are both routed and conductively connected at respective bonding locations on the bonding interface.

Referring back to FIG. 13, after the bonding of the first and second semiconductor structures, method 1300 proceeds to operation 1306, in which a substrate of one of the first and second semiconductor structures is thinned to form a semiconductor layer. FIGS. 5C, 6B, and 7B illustrate corresponding structures.

As shown in FIGS. 5C, 6B, and 7B, substrate 504 at the top of the pair of bonded semiconductor structures is thinned, so that thinned top substrate 504 can serve as a semiconductor layer 540, for example, a single-crystal silicon layer or a polysilicon layer. The thickness of semiconductor layer 540 can be between about 200 nm and about 5 µm, such as between 200 nm and 5 µm, or between about 150 nm and about 50 µm, such as between 150 nm and 50 µm. Substrate 504 can be thinned by processes including, but not limited to, wafer grinding, dry etch, wet etch, CMP, any other suitable processes, or any combination thereof.

In some embodiments, after semiconductor layer 540 is formed, a bonding layer 546 is formed above semiconductor layer 540. Bonding layer 546 may include a plurality of bonding contacts 544 surrounded by dielectrics. Bonding contacts 544 may be conductively connected to any interconnects in the second semiconductor structure that are to be conductively connected to peripheral circuits (and other logic process-compatible devices). For example, bonding contacts 544 may be conductively connected to interconnects in interconnect layer 512 to be further conductively connected to second conductive routings (e.g., 520-2, 620-2, 720-2, and 730-2). Accordingly, bonding contacts 544 may be conductively connected to any conductively-connected BLs (e.g., 522-1 and 522-2) and/or any conductively-connected WLs (e.g., 506-1 and 510-1).

Bonding layer 546 may be formed by depositing a dielectric layer on semiconductor layer 540. FIG. 5C illustrates a corresponding structure as an example. The dielectric layer can be formed by one or more thin film deposition processes including, but not limited to, CVD, PVD, ALD, or any combination thereof. Bonding contacts 544 can be formed through the dielectric layer and in contact with the interconnects and/or conductive routings in interconnect layer 512 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor. Interconnects, such as TSVs 542, can be formed in the second semiconductor structure and/or first semiconductor structure to conductively connect BLs 522-1 and 522-2 to respective bonding contacts 544. Although not shown in the figures, bonding layer same as or similar to bonding layer 546 may also be formed above semiconductor layer 540 in FIGS. 6C and 7C.

Referring back to FIG. 13, after the substrate is thinned and the bonding layer above the substrate is formed, method 1300 proceeds to operation 1308, in which a third semiconductor structure is bonded to the semiconductor layer. FIGS. 5D and 5E illustrate corresponding structures.

Before bonding the third semiconductor structure, as shown in FIG. 5D, the third semiconductor structure can be formed in a separate fabrication process. The third semiconductor structure may include a substrate 526, a device layer 548 above substrate 526, an interconnect layer 550 above device layer 548, and a bonding layer 552 above or as a part of interconnect layer 550. Substrate 526 may be the same as or similar to substrates 502 and 504. Device layer 548 may include peripheral circuits for memory stacks 506 and 510, and any other logic process-compatible devices. A plurality of transistors may form the entire or a part of the peripheral circuits and any other logic process-compatible devices. Interconnect layer 550 may include any suitable conductive interconnects to conductively connect the peripheral circuits and any other logic process-compatible devices with structures in the first and second semiconductor structures. Bonding layer 552 may include a plurality of bonding contacts 554 for bonding with bonding contacts 544 in bonding layer 546. Bonding contacts 554 may be conductively connected to the interconnects in interconnect layer 550.

In some embodiments, to form the third semiconductor structure, device layer 548 having the peripheral circuits (and any other logic process-compatible devices) is formed on substrate 526, interconnect layer 550 is formed above device layer 548, and bonding layer 552 is formed above or as a part of interconnect layer 550. In some embodiments, to form the peripheral circuits (and any other logic process-compatible devices), a plurality of transistors are formed on substrate 526.

In some embodiments, a plurality of transistors are formed on substrate 526. The transistors can be formed by a plurality of processes including, but not limited to, photolithography, dry/wet etch, thin film deposition, thermal growth, implantation, CMP, and any other suitable processes. In some embodiments, doped regions are formed in substrate 526 by ion implantation and/or thermal diffusion, which function, for example, as source regions and/or drain regions of the transistors. In some embodiments, isolation regions (e.g., STIs) are also formed in substrate 526 by wet/dry etch and thin film deposition. The transistors can form device layer 548 on substrate 526. In some embodiments, other logic process-compatible devices in device layer 548 are formed by similar fabrication processes.

Further, interconnect layer 550 can be formed above device layer 548. Interconnect layer 550 can include interconnects of MEOL and/or BEOL in a plurality of the formation of interconnect layer 550 may be the same as or similar to the formation of interconnect layers 508 and 512, and the detailed description is not repeated herein. The ILD layers and interconnects can be collectively referred to as interconnect layer 550. Bonding layer 552 may be formed above interconnect layer 550. Bonding layer 552 can include a plurality of bonding contacts 554 surrounded by dielectrics. The formation of bonding layer 552 may be the same as or similar to the formation of bonding layers 546, 538, and 536, and the detailed description is not repeated herein.

As shown in FIG. 5E, the third semiconductor layer is flipped upside down and bonded to bonding layer 546. A bonding interface 580 may be formed between the second and third semiconductor structures, e.g., between bonding layers 546 and 550. The third semiconductor layer may be bonded to the first and second semiconductor structures in a face-down manner. In some embodiments, the bonding includes hybrid bonding, similar to the bonding of the first and second semiconductor structures. At bonding interface 580, bonding contacts 554 may be bonded with bonding contacts 554, and the peripheral circuits (and any other logic process-compatible devices) can be conductively connected to corresponding structures (e.g., conductively-connected BLs 522-1 and 522-2 and/or conductively-connected WLs 506-1 and 510-1) in the bonded first and second semiconductor structures.

Referring back to FIG. 13, after the bonding of the third semiconductor structure, method 1300 proceeds to operation 1310, in which a pad-out interconnect layer is formed. FIG. 5F illustrates a corresponding structure.

As shown in FIG. 5F, a pad-out interconnect layer 576, including a contact pad 572 and a plurality of interconnects 574 conductively connected to contact pad 572, may be formed. In some embodiments, before the formation of pad-out interconnect layer 576, substrate 526 is thinned to form a semiconductor layer 560. The formation of semiconductor layer 560 can be similar to the formation of semiconductor layer 540, and the detailed description is not repeated herein.

Pad-out interconnect layer 576 can include interconnects, such as contact pads 572, formed in one or more ILD layers. Interconnects 574 can be in contact with the interconnects in interconnect layer 550 and contact pads 572. Contact pads 572 can be formed by depositing a conductive material such as W over semiconductor layer 560 to conductively connect interconnects 574.

Operations 1306-1310 illustrated in FIGS. 5C-5F may also be performed on the pair of bonded semiconductor structures in FIGS. 6B and 7B to bond the third semiconductor structure to the pair of bonded semiconductor structures. The peripheral circuits and any other logic process-compatible devices in the third semiconductor structure can be conductively connected to the corresponding structures (e.g., the conductively-connected WLs 506-1 and 510-1 and/or conductively-connected BLs 522-1 and 522-2) in the pair of bonded semiconductor structures.

Figure 8A:
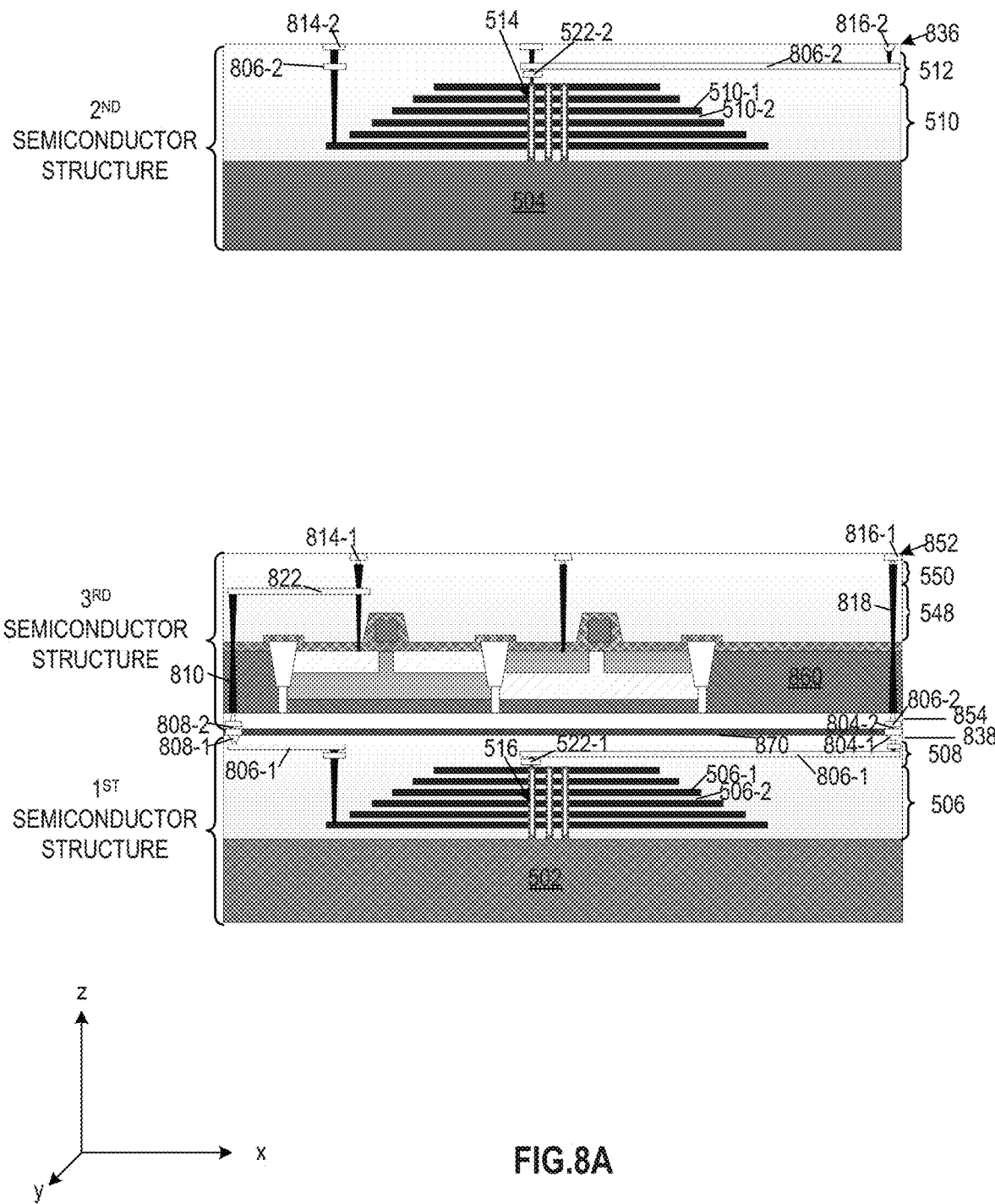
FIGS. 8A and 8B illustrate a part of an exemplary fabrication process to form another bonded 3D memory device having a pair of bonded semiconductor structures with BLs and WLs respectively routed and conductively connected through bonding, according to some embodiments.
Figure 8B:
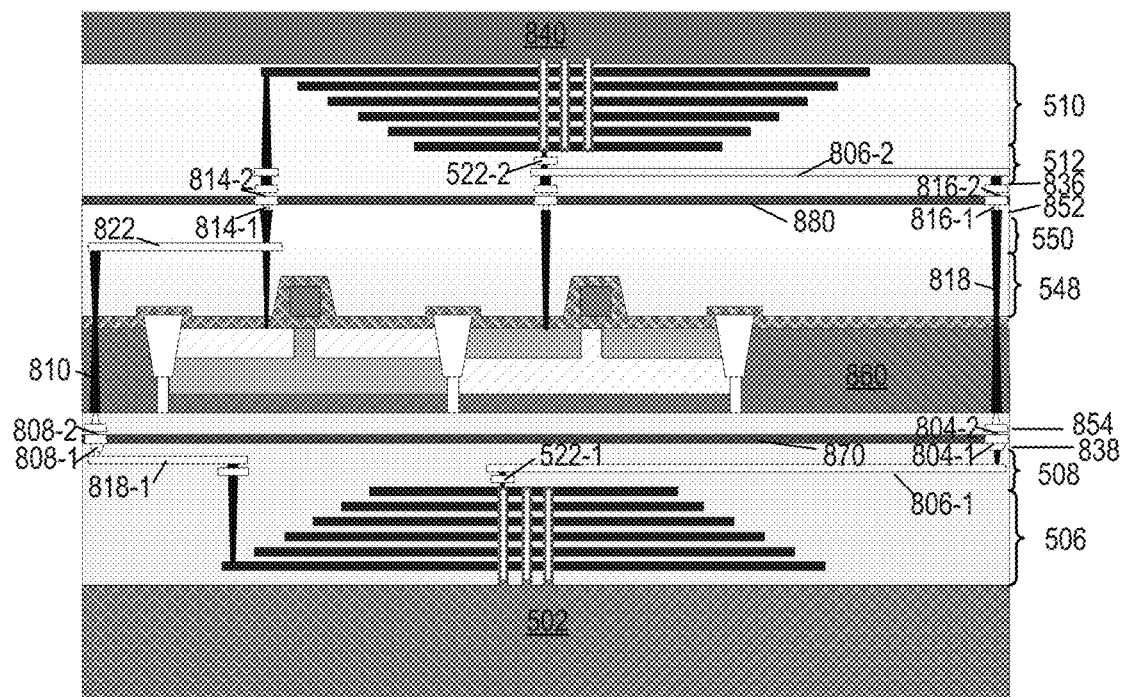

FIGS. 8A and 8B illustrate part of a bonding method to form a bonded 3D memory device with the third semiconductor bonded between the first and second semiconductor structures, according to some embodiments. For ease of illustration, operations similar to or the same as the operations in method 1300 are not depicted or described in detail. In some embodiments, the third semiconductor is bonded in a face-up manner. The bonding method may be employed to form semiconductor structures 1B, 2B, and 3B.

As shown in FIG. 8A, the first, second, and third semiconductor structures may be formed by separate fabrication processes. Interconnect layer 508 of the first semiconductor structure may include a plurality of first conductive routings 806-1 conductively connected to BLs 522-1 and/or WLs 506-1 (or conductor layers 506-1) through any suitable interconnects. First bonding layer 838 above or as a part of interconnect layer 508 may include a plurality of first bit line bonding contacts 804-1 and/or a plurality of first word line bonding contacts 808-1. In some embodiments, first bit line bonding contacts 804-1 and/or first word line bonding contacts 808-1 are conductively connected to respective first conductive routings 806-1, to be conductively connected to BLs 522-1 and/or WLs 506-1. Similarly, interconnect layer 512 of the second semiconductor structure may include a plurality of second conductive routings 806-2 conductively connected to BLs 522-2 and/or WLs 510-1 (or conductor layers 510-1) through any suitable interconnects. Second bonding layer 836 above or as a part of interconnect layer 512 may include a plurality of second bit line bonding contacts 816-2 and/or a plurality of second word line bonding contacts 814-2. In some embodiments, second bit line bonding contacts 816-2 and/or second word line bonding contacts 814-2 are conductively connected to respective second conductive routings 806-2, to be conductively connected to BLs 522-2 and/or WLs 510-1.

Substrate 526 of the third semiconductor structure may be thinned to form a semiconductor layer 860, similar to semiconductor layer 540/560. A bonding layer 854 may be formed on semiconductor layer 860 and a plurality of bonding contacts 804-2 and/or 808-2, conductively connected to interconnect layer 550, may be formed in bonding layer 854. In some embodiments, to form bonding layer 854, the substrate of the third semiconductor structure is thinned to form semiconductor layer 860, and the third semiconductor flipped upside down for dielectrics to be deposited on semiconductor layer 860. Bonding contacts 804-2 can be formed in the dielectrics, forming bonding layer 854. The process to form bonding layer 854 is similar to the process to form bonding layer 546. Interconnect layer 550 of the third semiconductor structure may include a plurality of interconnects, e.g., TSVs 818 and/or 810, conductively connected to bonding contacts 804-2 and/or 808-2. In some embodiments, interconnect layer 550 includes any suitable interconnects (e.g., interconnect 822, 818, and/or 810) that conductively connect bonding contacts 804-2, 816-1, 808-2, and/or 814-1 to the peripheral circuits (and/or other logic process-compatible devices) in device layer 548. Bonding layer 852 of the third semiconductor layer may include a plurality of bonding contacts 816-1 and/or 814-1, conductively connected to bonding contacts 804-2 and 808-2, respectively.

As shown in FIG. 8A, the first and third semiconductor structures may be bonded together. The bonding may include hybrid bonding. In some embodiments, both the first and third semiconductor structures are bonded in a face-up manner A bonding interface 870 is formed between the first and third semiconductor structures (i.e., between first bonding layer 838 and bonding layer 854). In some embodiments, at the bonding interface, first bit line bonding contacts 804-1 are aligned with and bonded to bonding contacts 804-2, and first word line bonding contacts 808-1 are aligned with and bonded to bonding contacts 808-2.

The second semiconductor structure may then be flipped upside down and bonded to the third semiconductor structure. The bonding of the first and third semiconductor structures, and the bonding of the third and second semiconductor structure may each include hybrid bonding. As shown in FIG. 8B, a bonding interface 880 may be formed between the second and third semiconductor layers (i.e., between second bonding layer 836 and bonding layer 852). In some embodiments, at bonding interface 880, second bit line bonding contacts 816-2 are aligned with and bonded to bonding contacts 816-1 and second word line bonding contacts 814-2 are aligned with and bonded to bonding contacts 814-1. First bit line bonding contacts 804-1 may then be conductively connected to second bit line bonding contacts 816-2 through bonding contacts 804-2 and 816-1, and any suitable interconnects such as TSV 818. Also, first word line bonding contacts 808-1 may then be conductively connected to second word line bonding contacts 814-2 through bonding contacts 808-2 and 814-1, and any suitable interconnects such as TSV 810. That is, BLs (e.g., 522-1 and 522-2) and WLs (e.g., 506-1 and 510-1) may respectively be conductively connected in the third semiconductor structure. Conductively-connected BLs 522-1 and 522-2 and the conductively-connected WLs 506-1 and 510-1 may be respectively connected to the peripheral circuits and any other logic process-compatible devices through any suitable interconnects, such as TSVs 808 and 810, and interconnects 822.

In some embodiments, after the second semiconductor structure is bonded with the third semiconductor structure, substrate 504 of the second semiconductor structure is thinned to form a semiconductor layer 840. A pad-out interconnect layer may then be formed above semiconductor layer 840. The bonding, the formation of bonding layers (e.g., 838, 854, 852, and 836), the formation of semiconductor layers 860 and 840, and the formation of pad-out interconnect layer may be referred to the description of method 1300. The detailed description is not repeated herein.

Figure 12A:
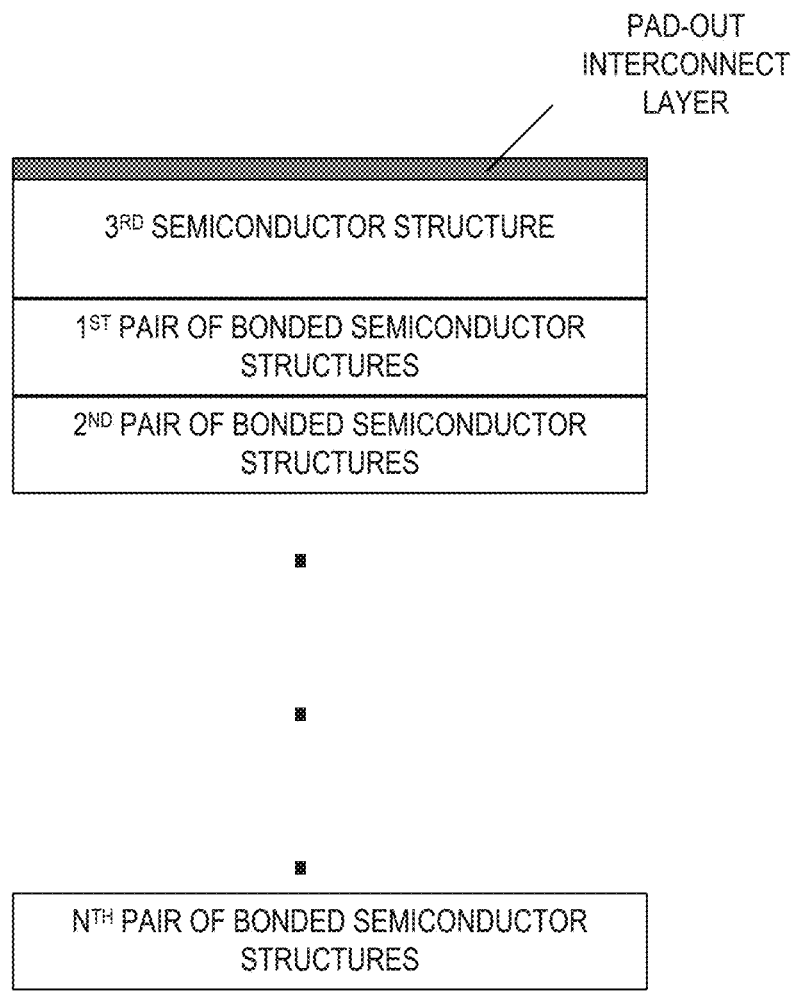
FIGS. 12A and 12B each illustrate a schematic view of an exemplary bonded 3D memory device having a plurality of pairs of bonded semiconductor structures, according to some embodiments.
Figure 12A:
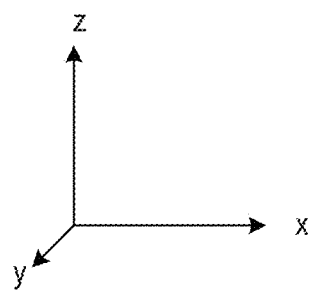
Figure 12B:
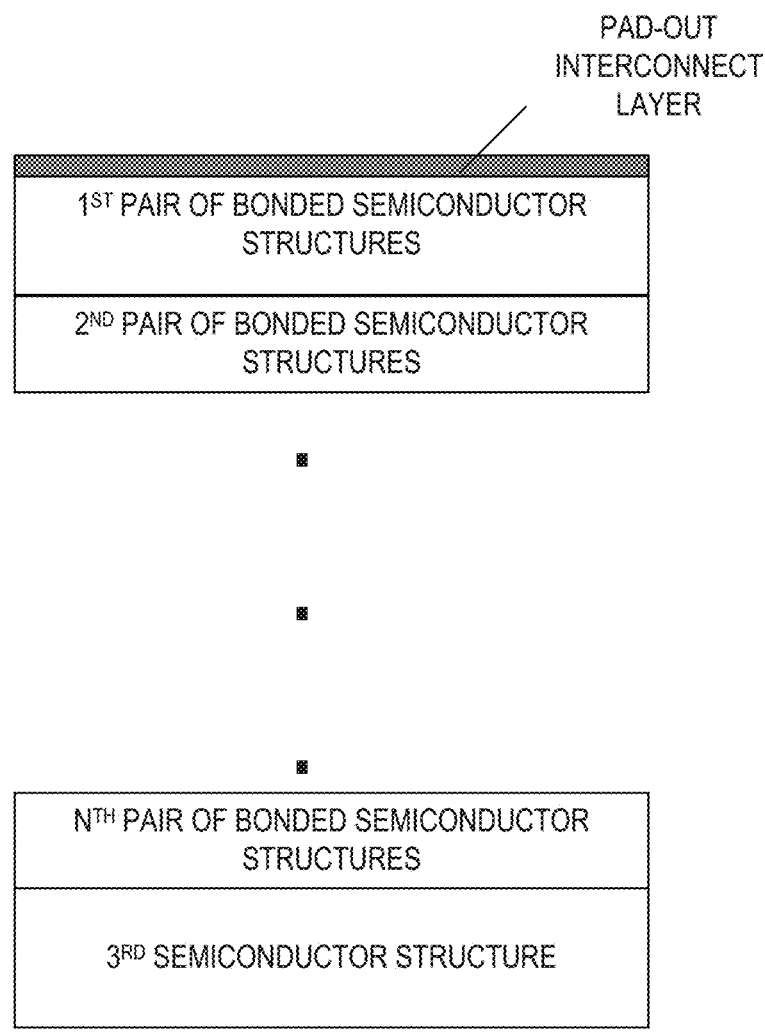

FIGS. 12A and 12B illustrates an exemplary block diagram of stack structures 1200 and 1201 each having N pairs of bonded semiconductor structures, each pair being bonded back-to-back to another pair along the vertical direction, with N being a positive integer. In stack structure 1200, the third semiconductor structure containing the peripheral circuits (and/or any other logic process-compatible devices) of one or more pairs (e.g., N pairs) may be located above the N pair. In stack structure 1201, the third semiconductor structure may be located under the N pair. Stack structures 1200 and 1201 may each include a substrate, located at the bottom of stack structure 1200/1201. Each pair may include a first and a second semiconductor structures bonded in a face-to-face manner. In some embodiments, in each pair, the second semiconductor structure is above the first semiconductor structure. Each of the first and second semiconductor structures also includes a plurality of 3D NAND memory strings, a plurality of BLs, and a plurality of WLs (e.g., conductor layers). In some embodiments, in stack structure 1200, the substrate of the first semiconductor structure of the Nth pair is retained as the substrate of stack structure 1200, and memory stack in the first semiconductor structure in the $N^{th}$ pair is formed above the substrate, and the memory stack in all other first and second semiconductor structure in the N pairs and the third semiconductor structure is formed on a respective semiconductor layer. In some embodiments, a pad-out interconnect layer, including one or more contact pads, may be formed above the semiconductor layer of the third semiconductor structure. In some embodiments, in stack structure 1201, the substrate of the third semiconductor structure is retained as the substrate of stack structure 1201, and the memory stack in each of the first and second semiconductor structures in the N pairs is formed on a respective semiconductor layer. In some embodiments, the pad-out interconnect layer may be formed above the semiconductor layer of the second semiconductor structure in the first pair.

In various embodiments, the corresponding structures bonded in one pair may be the same as or different from another pair. For example, in the first pair, the BLs of the first and second semiconductor structures may be bonded and conductively connected to the third semiconductor structure through the same interconnects, and the WLs of the first and second semiconductor structures may not be bonded and may be conductively connected to the third semiconductor structure through two different interconnects (or two different sets of interconnects). In the second pair, the WLs of the first and second semiconductor structures may be bonded and conductively connected to the third semiconductor structure through the same interconnects, and the BLs of the first and second semiconductor structures may not be bonded and may be conductively connected to the third semiconductor structure through two different interconnects (or two different sets of interconnects). In the third pair, the WLs of the first and second semiconductor structures may be bonded and conductively connected to the third semiconductor structure through the same interconnects, and the BLs of the first and second semiconductor structures may be conductively connected to the third semiconductor structure through the same interconnects. In some embodiments, the bonded structures in all pairs may be the same. For example, BLs in all pairs may be bonded and WLs in all pairs may be separate. The specific structures bonded in each pair, the number of pairs with the same/different bonded structures, and/or the order in which the pairs of particular bonded structures are arranged should not be limited by the embodiments of the present disclosure.

Figure 9:
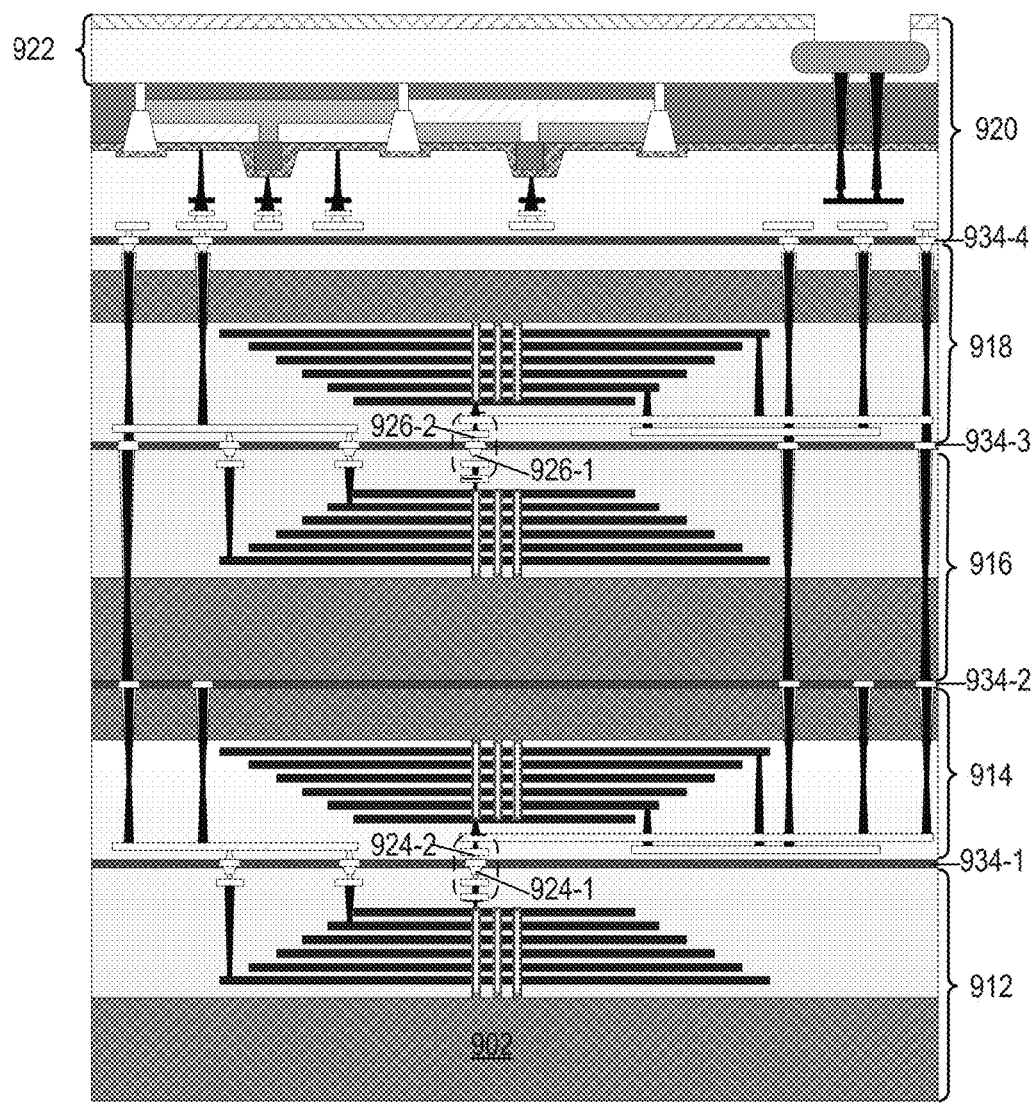
FIGS. 9-11 each illustrates an exemplary bonded 3D memory device having a plurality of pairs of bonded semiconductor structures, according to some embodiments.
Figure 10:
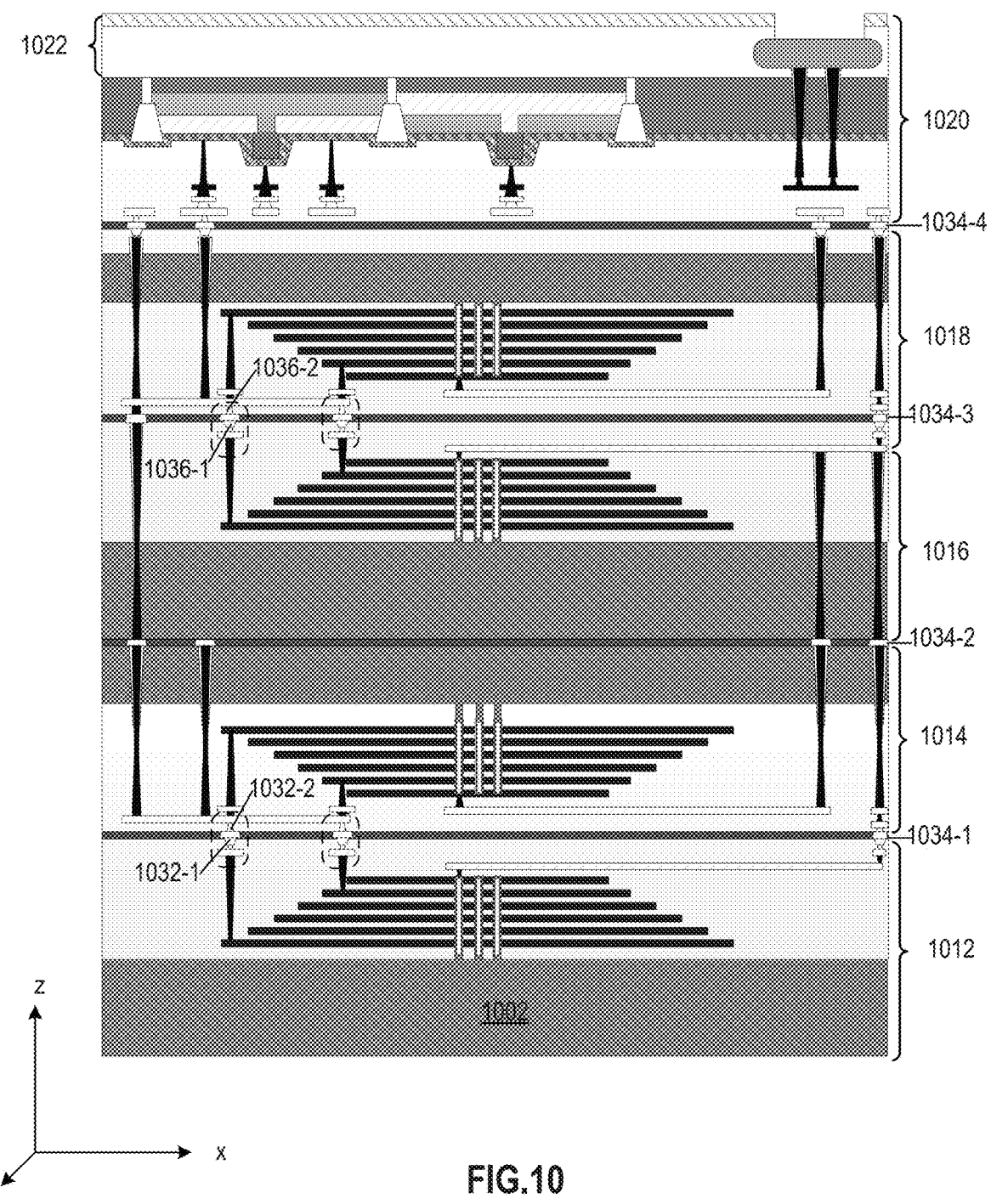
Figure 11:
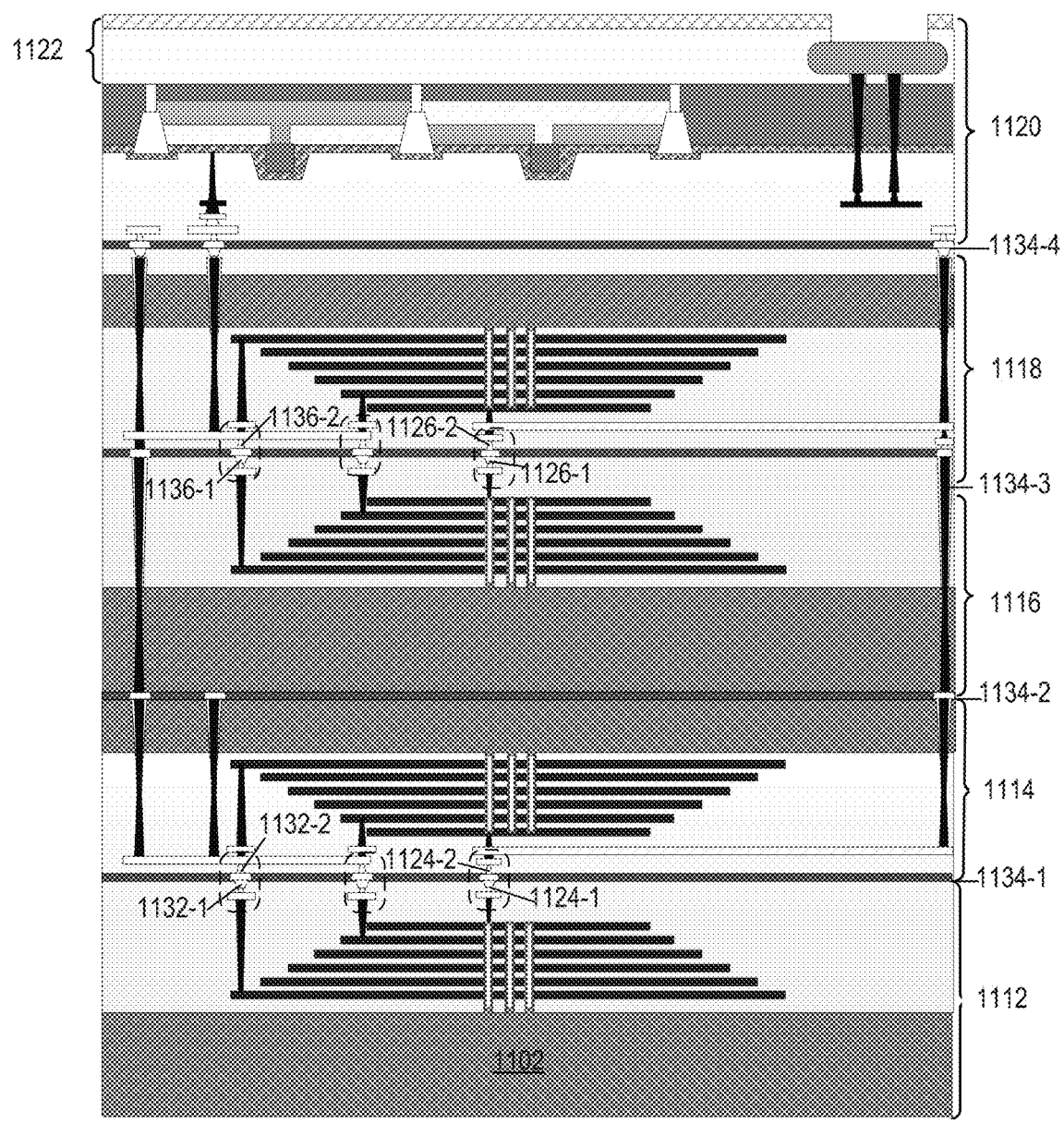

FIGS. 9-11 illustrate stack structures 900, 1000, and 1100, each having a plurality of pairs of bonded semiconductor structures, sharing the same semiconductor structure that has the peripheral circuits for all pairs of bonded semiconductor structures, according to some embodiments. Suitable interconnects, such as TSVs, may be employed to extend through and conductively connect the plurality of pairs. Bonding contacts may be disposed at each bonding interface to conductively connect any suitable interconnects in the adjacent semiconductor structures. Each pair may include a pair of memory stacks, and a plurality of conductively-connected BLs and/or a plurality of conductively-connected WLs. For ease of illustration, each stack structure includes two pairs of bonded semiconductor structures.

Each of stack structures 900, 1000, and 1100 may include a substrate (e.g., 902, 1002, and 1102) at the bottom of the respective stack structure, above which a plurality of pairs of memory stacks are bonded in a face-to-face manner Except for the memory stack at the bottom of the stack structure, each memory stack may be on a semiconductor layer, which can be formed by the thinning of a substrate where the memory stack is formed above. Each semiconductor structure in a pair may include a memory stack, a plurality of 3D NAND memory strings, a plurality of BLs, and a plurality of WLs (e.g., conductive layers). Each semiconductor structure may be bonded with another semiconductor structure through hybrid bonding. Each pair of bonded semiconductor structures may be bonded to another pair through hybrid bonding in a back-to-back manner.

As shown in FIG. 9, stack structure 900 includes two pairs of semiconductor structures, each includes a first semiconductor structure and a second semiconductor structure. In some embodiments, a first pair is bonded with a second pair in a back-to-back manner, at a bonding interface 934-2. The first pair may include a first semiconductor structure 912 bonded with a second semiconductor structure 914 in a face-to-face manner at a bonding interface 934-1. The second pair may include a first semiconductor structure 916 bonded with a second semiconductor structure 918 in a face-to-face manner at a bonding interface 934-3. A third semiconductor structure 920, with a pad-out interconnect layer 922 at the top surface, may be bonded with the second pair in the face-down manner at a bonding interface 934-4. In some embodiments, BLs of the first and second semiconductor structures in each pair are routed and bonded at the respective bonding interface through respective bit line bonding contacts (e.g., 924-1 and 924-2, and 926-1 and 926-2) and are conductively connected to third semiconductor structure 920 through the same interconnects. In some embodiments, WLs (e.g., conductor layers) of the first and second semiconductor structures in each pair are conductively connected to third semiconductor structure 920 separately.

As shown in FIG. 10, stack structure 1000 includes two pairs of semiconductor structures, each includes a first semiconductor structure and a second semiconductor structure. In some embodiments, a first pair is bonded with a second pair in a back-to-back manner, at a bonding interface 1034-2. The first pair may include a first semiconductor structure 1012 bonded with a second semiconductor structure 1014 in a face-to-face manner at a bonding interface 1034-1. The second pair may include a first semiconductor structure 1016 bonded with a second semiconductor structure 1018 in a face-to-face manner at a bonding interface 1034-3. A third semiconductor structure 1020, with a pad-out interconnect layer 1022 at the top surface, may be bonded with the second pair in the face-down manner at a bonding interface 1034-4. In some embodiments, WLs (e.g., conductor layers) of the first and second semiconductor structures in each pair are routed and bonded at the respective bonding interface through respective WL line bonding contacts (e.g., 1032-1 and 1032-2, and 1036-1 and 1036-2) and are conductively connected to third semiconductor structure 1020 through the same interconnects. In some embodiments, BLs of the first and second semiconductor structures in each pair are conductively connected to third semiconductor structure 1020 separately.

As shown in FIG. 11, stack structure 1100 includes two pairs of semiconductor structures, each includes a first semiconductor structure and a second semiconductor structure. In some embodiments, a first pair is bonded with a second pair in a back-to-back manner, at a bonding interface 1134-2. The first pair may include a first semiconductor structure 1112 bonded with a second semiconductor structure 1114 in a face-to-face manner at a bonding interface 1134-1. The second pair may include a first semiconductor structure 1116 bonded with a second semiconductor structure 1118 in a face-to-face manner at a bonding interface 1134-3. A third semiconductor structure 1120, with a pad-out interconnect layer 1122 at the top surface, may be above may be bonded with the second pair in the face-down manner at a bonding interface 1134-4. In some embodiments, at the respective bonding interface, BLs of the first and second semiconductor structures in each pair are routed and bonded through respective bit line bonding contacts (e.g., 1124-1 and 1124-2, and 1126-1 and 1126-2), and WLs (e.g., conductor layers) of the first and second semiconductor structures in each pair are routed and bonded through respective word line bonding contacts (e.g., 1132-1 and 1132-2, and 1136-1 and 1136-2). The conductively-connected BLs in each pair may be conductively connected to third semiconductor structure 1120 through respective same interconnects, and the conductively-connected WLs in each pair may be conductively connected to third semiconductor structure 1120 through respective same interconnects.

Figure 14:
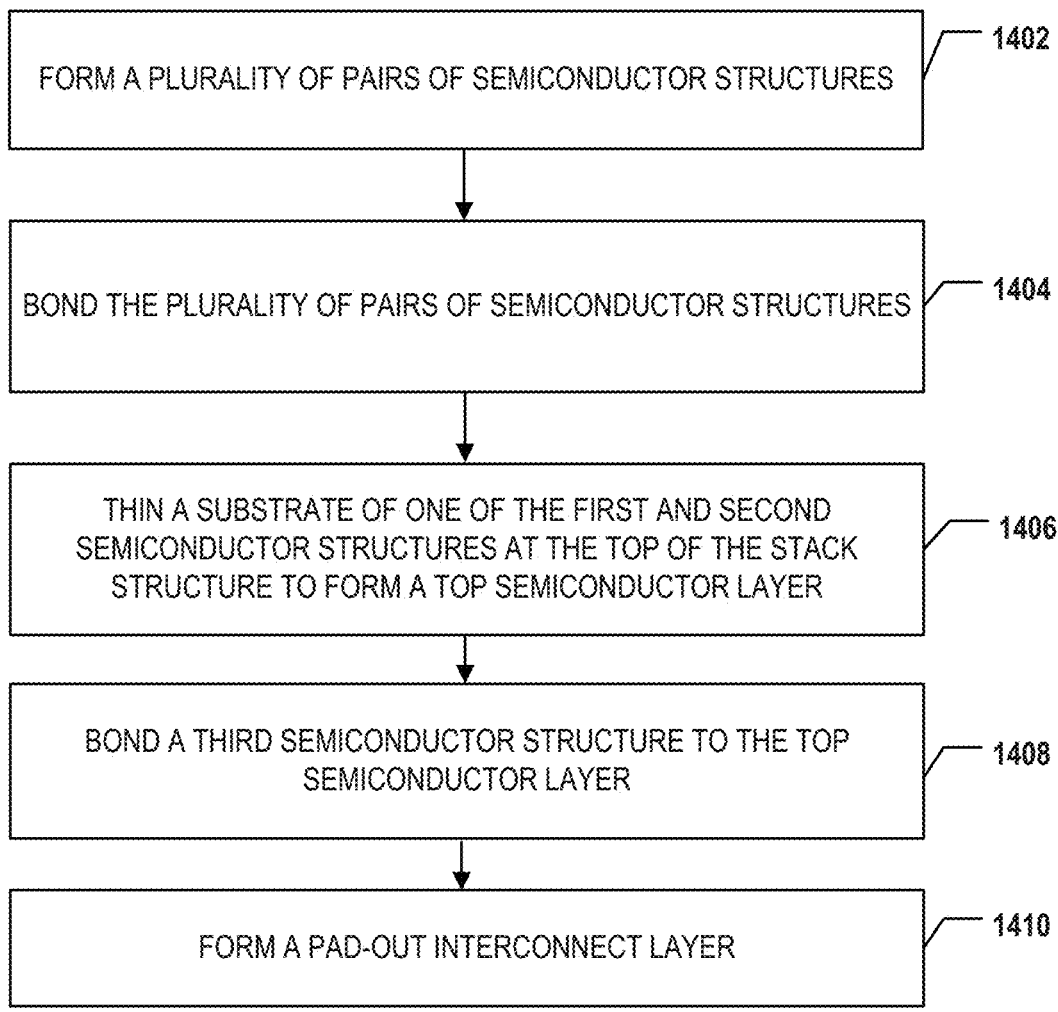
FIG. 14 illustrates a flowchart of an exemplary fabrication process to form a bonded 3D memory device having a plurality of pairs of bonded semiconductor structures, according to some embodiments.

FIG. 14 is a flowchart of an exemplary method 1400 for forming a stack structure 1200, according to some embodiments. It is understood that the operations shown in method 1400 are not exhaustive and that other operations can be performed as well before, after, or between any of the illustrated operations. Further, some of the operations may be performed simultaneously, or in a different order than shown in FIG. 14. For ease of illustration, method 1400 may be described in view of FIG. 5 and FIGS. 9-12.

Method 1400 starts at operation 1402, in which a plurality of pairs of semiconductor structures are formed. Each pair includes a first semiconductor structure and a second semiconductor structure, non-bonded. For example, N pairs of semiconductor structures are formed (e.g., referring to stack structure 1200). Each pair may include a first semiconductor and a second semiconductor structure, formed in separate fabrication processes (e.g., referring to the description of first and second semiconductor structures in FIG. 5A). The first and second semiconductor structures may each include a memory stack above a substrate, a plurality of 3D NAND memory strings extending through the memory stack, a plurality of BLs conductively connected to the 3D NAND memory strings, and a plurality of WLs (or conductor layers) as a part of the memory stack. In each pair, the BLs and/or WLs of the first and second semiconductor structures are routed to the respective bonding region (e.g., referring to the description of FIG. 4) to be subsequently bonded once the first and second semiconductor structures are bonded together as a pair.

In some embodiments, each pair includes a pair of bonding layers subsequently located on opposite sides of the bonding interface. Except for the $N^{th}$ pair, each pair also includes a bonding layer on each of the top and the bottom surfaces, for bonding with other pairs/the third semiconductor structure (e.g., referring to bonded 3D memory devices 900-1100). Each bonding layer may include a plurality of bonding contacts, e.g., bonding contacts conductively connected to the conductively-connected BLs, the conductively-connected WLs of the respective pair, and/or the separate BLs and WLs, for forming conductive contacts with the another pair (e.g., referring to the structure shown in FIGS. 9-12).

After the plurality of pairs of semiconductor structures are formed, method 1400 proceeds to operations 1404 and 1406, in which the pairs of bonded semiconductor structures are bonded, and after N pairs of bonded semiconductor structures are formed, the substrate of the second semiconductor structure at the top of the stack is thinned to form a top semiconductor layer. In some embodiments, the first and second semiconductor structures in one pair are bonded in a face-to-face manner, and the pairs are bonded with one another in a back-to-back manner. For ease of description, the second semiconductor structure is above the first semiconductor structure in each pair.

The first semiconductor structure of the $N^{th}$ pair (e.g., the bottom pair) may be at the bottom of the stack structure. The substrate of the first semiconductor structure in the $N^{th}$ pair may be maintained to function as the substrate for the stack structure. The second semiconductor structure of the $N^{th}$ pair may be flipped upside down to be aligned and bonded with the first semiconductor structure of the $N^{th}$ pair (e.g., referring to the description of FIG. 5B). The substrate of the second semiconductor structure in the $N^{th}$ pair may be thinned to form a semiconductor layer. Optionally, a bonding layer may be formed above the semiconductor layer (e.g., referring to the description of FIG. 5C).

The first semiconductor structure of the $(N-1)^{th}$ pair, with the substrates thinned, may then be bonded the second semiconductor structure of the $N^{th}$ pair in a back-to-back manner so the first semiconductor structure of the $(N-1)^{th}$ pair is above the $N^{th}$ pair, facing up. In some embodiments, the substrate of the first semiconductor structure of the $(N-1)^{th}$ pair is thinned before the $(N-1)^{th}$ pair is bonded to the $N^{th}$ pair. The second semiconductor structure of the $(N-1)^{th}$ pair may then be aligned with and bonded to the first semiconductor structure of the $(N-1)^{th}$ pair. In some embodiments, the substrate of the second semiconductor structure of the $(N-1)^{th}$ pair is thinned after it is bonded to the first semiconductor structure of the $(N-1)^{th}$ pair. In some embodiments, one or more pairs may be stacked above the $N^{th}$ pair, by repeating the bonding and thinning process until a desired number of pairs is formed. In some embodiments, the first semiconductor structures and the second semiconductor structures are alternatingly bonded along the z-axis to form the N pairs of bonded semiconductor structures. In some embodiments, the substrates of each of the one or more pairs may be thinned to form a respective semiconductor layer. The conductive connection between adjacent pairs may be formed by the bonding contacts at each bonding interface and interconnects (e.g., TSVs) between bonding interfaces. In some embodiments, the substrate of the second semiconductor structure in the first pair (e.g., the top pair of the stack structure) is thinned to form a top semiconductor structure (referring to the description of FIGS. 5C and 5D).

After the N pairs are bonded together, method 1400 proceeds to operation 1408, in which a third semiconductor structure is bonded to the top semiconductor layer. The third semiconductor structure may be bonded to the N pairs in a face-down manner (Referring to the description of FIG. 5E, and FIGS. 9-12), by hybrid bonding. A conductive connection between the third semiconductor structure and the N pairs of bonded semiconductor structures may be formed at the bonding interface. In some embodiments, the substrate of the third semiconductor structure is thinned to form another semiconductor layer (referring to the description of FIG. 5E).

After the another semiconductor layer is formed, method 1400 proceeds to operation 1410, in which a pad out interconnect layer is formed above the another semiconductor layer (referring to the description of FIG. 5F and FIGS. 9-12). The bonding and thinning operations in method 1400 may be referred to the description of method 1300 and are not repeated herein.

Although not shown, in some embodiments, the N pairs of bonded semiconductor structures are formed above the third semiconductor structure (e.g., referring to stack structure 1201), and a pad-out interconnect layer is formed above the top semiconductor layer which is formed by thinning of the substrate of the second semiconductor structure of the first pair. In this case, the third semiconductor structure may be at the bottom of the bonded 3D memory device, and the substrate of the third semiconductor structure may be retained as the substrate of the bonded 3D memory device. The substrate of the first bonded 3D memory device of the $N^{th}$ pair may be thinned to form a semiconductor layer before the first bonded 3D memory device is bonded to the third bonded 3D memory device, using hybrid bonding. The second semiconductor structure of the $N^{th}$ pair may then be bonded to the first semiconductor structure in a face-to-face manner, with the second semiconductor structure above the first semiconductor structure. The substrate of the first semiconductor structure of the $N^{th}$ pair may then be the thinned to form another semiconductor layer (e.g., referring to the description of FIGS. 5B and 5C). Repeatedly, the $(N-1)^{th}$ pair may be bonded to the $N^{th}$ pair in a back-to-back manner, and the substrates of the first and second semiconductor structures may both be thinned to form a respective semiconductor layer. In some embodiments, one or more pairs may be stacked above the $N^{th}$ pair, by repeating the bonding and thinning process until a desired number of pairs is formed. In some embodiments, the substrates of each of the one or more pairs may be thinned to form a respective semiconductor layer. The conductive connection between adjacent pairs and between the third semiconductor and the N pairs of bonded semiconductor structures may be formed by the bonding contacts at each bonding interface and interconnects (e.g., TSVs) between bonding interfaces. In some embodiments, the substrate of the second semiconductor structure in the first pair (e.g., the top pair of the stack structure) is thinned to form a top semiconductor structure (referring to the description of FIGS. 5C and 5D), and the pad-out interconnect layer above the top semiconductor layer.

According to the embodiments of the present disclosure, a 3D memory device includes a first semiconductor structure and a second semiconductor structure. The first semiconductor structure includes a plurality of first NAND memory strings and a plurality of first BLs. At least one of the first BLs may be conductively connected to a respective one of the first NAND memory strings. The first semiconductor structure also includes a plurality of first conductor layers, and a first bonding layer having a plurality of first bit line bonding contacts conductively connected to the plurality of first BLs and a plurality of first word line bonding contacts conductively connected to the first conductor layers. A second semiconductor structure includes a plurality of second NAND memory strings and a plurality of second BLs. At least one of the second BLs may be conductively connected to a respective one of the second NAND memory strings. The second semiconductor structure also includes a plurality of second conductor layers, and a second bonding layer having a plurality of second bit line bonding contacts conductively connected to the plurality of second BLs and a plurality of second word line bonding contacts conductively connected to the second conductor layers. The 3D memory device further includes a bonding interface between the first bonding layer and the second bonding layer. The first bit line bonding contacts may be conductively connected to the second bit line bonding contacts and the first word line bonding contacts are conductively connected to the second word line bonding contacts at the bonding interface.

In some embodiments, at least one of the first NAND memory strings is conductively connected to at least one of the second NAND memory strings through bonded first and second bit line bonding contacts, and at least one of the first conductor layers are is conductively connected to at least one of the second conductor layers through bonded first and second word line bonding contacts.

In some embodiments, the first semiconductor structure includes the first bonding layer at the bonding interface, and the first BLs under the first bonding layer. In some embodiments, the second semiconductor structure includes the second BLs at the second memory stack, and the second bonding layer above the second bonding layer.

In some embodiments, the first semiconductor structure further includes a first memory stack under the first bonding layer the plurality of first NAND memory strings extending vertically through the first memory stack. The first memory stack may include interleaved the plurality of first conductor layers and a plurality of first insulating layers. In some embodiments, the second semiconductor structure further includes a second memory stack above the second bonding layer and the plurality of second NAND memory strings extending vertically through the second memory stack. The second memory stack may include interleaved the plurality of second conductor layers and a plurality of second insulating layers.

In some embodiments, the plurality of first and second BLs are routed and conductively connected at a respective bonding region that is laterally away from the first and second BLs; and the plurality of first and second conductor layers are routed and conductively connected at a respective bonding region that is laterally away from the first and second conductor layers.

In some embodiments, the first semiconductor structure includes a first interconnect layer having a plurality of first conductive routings between the plurality of first NAND memory strings and the first bonding layer. In some embodiments, the second semiconductor structure includes a second interconnect layer having a plurality of second conductive routings between the plurality of second NAND memory strings and the second bonding layer. The first BLs and the first conductor layers may be conductively connected to and routed by the first conductive routing to respective bonding regions and the second BLs and the second conductor layers may be conductively connected to and routed by the second conductive routing to the respective bonding regions.

In some embodiments, the plurality of first BLs and second BLs are vertically arranged in a staggered manner; the first memory stack and the second memory stack are vertically arranged in a staggered manner; each of the first and the second BLs is conductively connected to the respective bit line bonding contact through a respective via structure and the respective conductive routings; and each of the first and second conductor layers is conductively connected to the respective conductor bonding contact through another respective via structure and the respective conductive routings.

In some embodiments, the 3D memory device further includes a third semiconductor structure above the second semiconductor structure, the third semiconductor structure having a peripheral circuit of the first and second memory stacks; and a second bonding interface between the second semiconductor structure and a third bonding layer of the third semiconductor structure.

In some embodiments, the second semiconductor structure includes a semiconductor layer above and in contact with the second NAND memory strings; and the first semiconductor structure includes a substrate under and in contact with the first NAND memory strings. In some embodiments, the third semiconductor structure includes a third interconnect layer between the third bonding layer and the peripheral circuit, the peripheral circuit above and in contact with the third interconnect layer, a second semiconductor layer above and in contact with the peripheral circuit, and a pad-out interconnect layer above the second semiconductor layer.

In some embodiments, the 3D memory device further includes a third semiconductor structure under the second semiconductor structure, the third semiconductor structure having a peripheral circuit of the first and second memory stacks; and a second bonding interface between the second semiconductor structure and a third bonding layer of the third semiconductor structure.

In some embodiments, the second semiconductor structure includes a semiconductor layer above and in contact with the second NAND memory strings, and a pad-out interconnect layer above the semiconductor layer and conductively connected to the peripheral circuit. In some embodiments, the first semiconductor structure includes a second semiconductor layer under and in contact with the first NAND memory strings. In some embodiments, the third semiconductor structure includes a third interconnect layer under and in contact with the third bonding layer, the peripheral circuit below and in contact with the third interconnect layer, and a substrate under and in contact with the peripheral circuit.

In some embodiments, the 3D memory device further includes a plurality of via structures extending vertically from the pad-out interconnect layer into the third interconnect layer to be conductively connected to the peripheral circuit.

In some embodiments, the peripheral circuit is conductively connected to the third bonding layer, which is conductively connected to the first and second NAND memory strings and the first and second conductor layers.

According to the embodiments of the present disclosure, a 3D memory device includes a stack structure having a plurality of pairs of bonded semiconductor structures. Each of the pairs includes a first semiconductor structure having a plurality of first NAND memory strings, a plurality of first BLs conductively connected to respective first NAND memory strings, a plurality of first conductor layers, and a first bonding layer having a plurality of first bit line bonding contacts conductively connected to the first BLs and a plurality of first conductor contacts conductively connected to the first conductor layers, respectively. Each of the pairs also includes a second semiconductor structure having a plurality of second NAND memory strings, a plurality of second BLs conductively connected to respective second NAND memory strings, a plurality of second conductor layers, and a second bonding layer having a plurality of second bit line bonding contacts conductively connected to the plurality of second BLs and a plurality of second conductor contacts conductively connected to the second conductor layers, respectively. Each of the pairs also includes a bonding interface between the first bonding layer and the second bonding layer. The first bit line bonding contacts may be in contact with the second bit line bonding contacts and the first word line bonding contacts are in contact with the second word line bonding contacts, respectively. The 3D memory device further includes a third semiconductor structure bonded to and conductively connected to the stack structure. The third semiconductor structure may include a peripheral circuit of at least one pair of bonded semiconductor structures.

In some embodiments, at least one of the first NAND memory strings is conductively connected to at least one of the second NAND memory strings through the bonded first and second bit line bonding contacts; and at least one of the first conductor layers is conductively connected to at least one of the second conductor layers through the bonded first and second word line bonding contacts.

In some embodiments, the first semiconductor structure includes the first bonding layer at the bonding interface, and the first BLs under the first bonding layer. In some embodiments, the second semiconductor structure includes the second BLs at the second memory stack, and the second bonding layer above the second bonding layer.

In some embodiments, the first semiconductor structure further includes a first memory stack under the first bonding layer and the plurality of first NAND memory strings extending vertically through the first memory stack. The first memory stack may include interleaved the plurality of first conductor layers and a plurality of first insulating layers. In some embodiments, the second semiconductor structure further includes a second memory stack above the second bonding layer and the plurality of second NAND memory strings extending vertically through the second memory stack. The second memory stack may include interleaved the plurality of second conductor layers and a plurality of second insulating layers.

In some embodiments, the plurality of first and second BLs are routed and conductively connected at a respective bonding region that is laterally away from the first and second BLs; and the plurality of first and second conductor layers are routed and conductively connected at a respective bonding region that is laterally away from the first and second conductor layers.

In some embodiments, the first semiconductor structure includes a first interconnect layer having a plurality of first conductive routings between the plurality of first NAND memory strings and the first bonding layer. In some embodiments, the second semiconductor structure includes a second interconnect layer having a plurality of second conductive routings between the plurality of second NAND memory strings and the second bonding layer. The first BLs and the first conductor layers may be conductively connected to and routed by the first conductive routing to respective bonding regions and the second BLs and the second conductor layers may be conductively connected to and routed by the second conductive routing to the respective bonding regions.

In some embodiments, the first BLs and second BLs are vertically arranged in a staggered manner; the first memory stack and the second memory stack are vertically arranged in a staggered manner; each of the first and the second BLs is conductively connected to the respective bit line bonding contact through a respective via structure and the respective conductive routings; and each of the first and second conductor layers is conductively connected to the respective conductor bonding contact through another respective via structure and the respective conductive routings.

In some embodiments, the stack structure includes a semiconductor layer above and in contact with the second NAND memory strings in a top second semiconductor structure, and a substrate under and in contact with the first NAND memory strings in a bottom first semiconductor structure. In some embodiments, the third semiconductor structure includes a third bonding layer above and in contact with the semiconductor layer, the peripheral circuit above the third bonding layer, a second semiconductor layer above the peripheral circuit, and a pad-out interconnect layer above the second semiconductor layer.

In some embodiments, the stack structure includes a semiconductor layer above and in contact with the second NAND memory strings in a top second semiconductor structure, and a pad-out interconnect layer above the semiconductor layer and in contact with the second NAND memory strings, and a second semiconductor layer under and in contact with the first NAND memory strings in a bottom first semiconductor structure. In some embodiments, the third semiconductor structure includes a third bonding layer under and in contact with the second semiconductor layer, the peripheral circuit under and in contact with the third bonding layer, and a substrate below the peripheral circuit.

In some embodiments, the 3D memory device further includes a plurality of via structures extending vertically from the pad-out interconnect layer to be conductively connected to the peripheral circuit.

In some embodiments, the peripheral circuit are conductively connected to the third bonding layer, which is conductively connected to the first and second NAND memory strings and first and second conductor layers in each pair of semiconductor structures.

In some embodiments, each pair of semiconductor structures is bonded in a back-to-back manner to one another through hybrid bonding.

According to embodiments of the present disclosure, a method for forming a 3D memory device includes the following operations. First, on a first substrate, a plurality of first NAND memory strings, a plurality of first BLs conductively connected to the first NAND memory strings, a plurality of first conductor layers, and a first bonding layer having a plurality of first bit line bonding contacts are formed conductively connected to the first BLs, and a plurality of first word line bonding contacts are formed conductively connected to the first conductor layers, to form a first semiconductor structure. On a second substrate, a plurality of second NAND memory strings, a plurality of second BLs conductively connected to the second NAND memory strings, a plurality of second conductor layers, and a second bonding layer having a plurality of second bit line bonding contacts are formed conductively connected to the second BLs, and a plurality of second word line bonding contacts are formed conductively connected to the second conductor layers, to form a second semiconductor structure. The first semiconductor structure and the second semiconductor structure are bonded in a face-to-face manner, such that (i) the first semiconductor structure is bonded to the second semiconductor structure, (ii) the first BLs are respectively conductively connected to the second BLs through the bonded first and the second bit line bonding contacts at a bonding interface, and (iii) the first conductor layers are conductively connected to the second conductor layers through the bonded first and second bit line bonding contacts at the bonding interface.

In some embodiments, forming the first semiconductor structure includes forming a first memory stack above the first substrate. The first memory stack may include interleaved the plurality of first conductor layers and a plurality of first insulating layers. In some embodiments, forming the first semiconductor structure includes forming a first interconnect layer between the first memory stack and the first bonding layer, the first interconnect layer having a plurality of first conductive routings conductively connecting the first BLs and the first conductor layers with the respective bonding contacts. In some embodiments, forming the second semiconductor structure includes forming a second memory stack above the second substrate, the second memory stack having interleaved the plurality of second conductor layers and a plurality of second insulating layers. In some embodiments, forming the second semiconductor structure includes forming a second interconnect layer between the second memory stack and the second bonding layer, the second interconnect layer having a plurality of second conductive routings conductively connecting the second BLs and the second conductor layers with the respective bonding contacts.

In some embodiments, forming the first semiconductor structure further includes forming the first NAND memory strings extending vertically through the first memory stack; and forming the second semiconductor structure further includes forming the second NAND memory strings extending vertically through the second memory stack.

In some embodiments, the method further includes thinning the second substrate to form a semiconductor layer, bonding a third semiconductor structure to the semiconductor layer, thinning a third substrate of the third semiconductor structure to form a second semiconductor layer, and forming a pad-out interconnect layer above the second semiconductor layer.

In some embodiments, the method further includes thinning the first substrate to form a semiconductor layer, bonding a third semiconductor structure to the semiconductor layer, thinning a second substrate of the second semiconductor structure to form a second semiconductor layer, and forming a pad-out interconnect layer above the second semiconductor layer.

In some embodiments, forming the third semiconductor structure includes forming a peripheral circuit above the third substrate, forming a third interconnect layer above the peripheral circuit, and forming a third bonding layer above the third interconnect layer. In some embodiments, bonding the third semiconductor structure to the semiconductor layer includes bonding the third bonding layer to the semiconductor layer.

In some embodiments, the bonding of the first semiconductor structure and the second semiconductor structure includes hybrid bonding.

According to the embodiments of the present disclosure, a method for forming a 3D memory device includes alternatingly bonding a plurality of first semiconductor structures and a plurality of second semiconductor structures to form a stack structure having a plurality of pairs of bonded semiconductor structures. BL and conductor layers of at least one pair of bonded semiconductor structures may be conductively connected through bonding. Forming the plurality of bonded semiconductor structures may include bonding a second semiconductor structure with a first semiconductor in a face-to-face manner to form a pair of bonded semiconductor structures, the second semiconductor structure being above the first semiconductor structure. Forming the plurality of bonded semiconductor structures may also include bonding another first semiconductor structure with the pair of bonded semiconductor structures, the another first semiconductor structure facing up. Forming the plurality of bonded semiconductor structures may also include bonding another second semiconductor structure with the another first semiconductor structure in a face-to-face manner to form another pair of bonded semiconductor structures, the pair and the another pair being bonded in a back-to-back manner.

In some embodiments, forming the first semiconductor structure includes forming, on a first substrate, a plurality of first NAND memory strings, a plurality of first bit lines (BLs) conductively connected to the first NAND memory strings, a plurality of first conductor layers, and a first bonding layer having a plurality of first bit line bonding contacts conductively connected to the first BLs, and a plurality of first word line bonding contacts conductively connected to the first conductor layers, to form a first semiconductor structure. In some embodiments, forming the second semiconductor structure includes forming, on a second substrate, a plurality of second NAND memory strings, a plurality of second BLs conductively connected to the second NAND memory strings, a plurality of second conductor layers, and a second bonding layer having a plurality of second bit line bonding contacts conductively connected to the second BLs, and a plurality of second word line bonding contacts conductively connected to the second conductor layers, to form a second semiconductor structure.

In some embodiments, forming the another first semiconductor structure includes forming, on another first substrate, a plurality of another first NAND memory strings, a plurality of another first BLs conductively connected to the another first NAND memory strings, a plurality of another first conductor layers, and another first bonding layer having a plurality of another first bit line bonding contacts conductively connected to the another first BLs, and a plurality of another first word line bonding contacts conductively connected to the another first conductor layers, to form another first semiconductor structure. In some embodiments, forming the another second semiconductor structure includes forming, on another second substrate, a plurality of another second NAND memory strings, a plurality of another second BLs conductively connected to the another second NAND memory strings, a plurality of another second conductor layers, and another second bonding layer having a plurality of another second bit line bonding contacts conductively connected to the another second BLs, and a plurality of another second word line bonding contacts conductively connected to the another second conductor layers, to form another second semiconductor structure.

In some embodiments, bonding the first and second semiconductor structures in a face-to-face manner includes aligning and bonding, at a bonding interface, the first and second bit line bonding contacts and the first and second word line contacts, such that (i) the first semiconductor structure is bonded to the second semiconductor structure, (ii) the first BLs are conductively connected to the second BLs through the bonded first and second bit line bonding contacts, (iii) the first conductor layers are conductively connected to the second conductor layers through the bonded first and second word line bonding contacts. In some embodiments, bonding the another first and the second semiconductor structures in a face-to-face manner includes aligning and bonding, at another bonding interface, the another first and second bit line bonding contacts and the another first and second word line bonding contacts such that (i) the another first semiconductor structure is bonded to the another second semiconductor structure, (ii) the another first BLs are conductively connected to the another second BLs through the bonded another first and second bit line bonding contacts, and (iii) the another first conductor layers are conductively connected to the another second conductor layers through the bonded another first and second word line bonding contacts.

In some embodiments, forming the first, the second, the another first, and the another second semiconductor structures each includes forming a respective interconnect layer having a plurality of first conductive routings conductively connecting (i) the respective BLs and the respective bit line bonding contacts, and (ii) the respective conductor layers and the respective word line bonding contacts.

In some embodiments, the method further includes thinning a substrate of the second semiconductor structure, the another first semiconductor structure, and the another second semiconductor structure to form a respective semiconductor layer.

In some embodiments, the method further includes bonding a third semiconductor structure in a face-down manner to the semiconductor layer of the second semiconductor structure; thinning a third substrate of the third semiconductor structure to form a second semiconductor layer; and forming a pad-out interconnect layer above the second semiconductor layer.

In some embodiments, the method further includes thinning the first substrate to form a respective semiconductor layer; bonding a third semiconductor structure in a face-up manner to the semiconductor layer of the first semiconductor structure; and forming a pad-out interconnect layer above the semiconductor layer of the another second semiconductor structure.

In some embodiments, forming the third semiconductor structure includes forming a peripheral circuit above the third substrate, forming a third interconnect layer above the peripheral circuit, and forming a third bonding layer above the third interconnect layer. In some embodiments, bonding the third semiconductor structure to the semiconductor layer includes bonding the third bonding layer to the semiconductor layer.

In some embodiments, the bonding between the semiconductor structures in a pair and between the pairs include hybrid bonding.

According to embodiments of the present disclosure, a 3D memory device includes a first semiconductor structure having a plurality of first NAND memory strings, a plurality of first BLs, at least one of the first BLs being conductively connected to a respective one of the first NAND memory strings, a plurality of first conductor layers, and a first bonding layer having a plurality of first bit line bonding contacts conductively connected to the plurality of first BLs and a plurality of first word line bonding contacts conductively connected to the first conductor layers. The 3D memory device also includes a second semiconductor structure having a plurality of second NAND memory strings, a plurality of second BLs, at least one of the second BLs being conductively connected to a respective one of the second NAND memory strings, a plurality of second conductor layers, and a second bonding layer having a plurality of second bit line bonding contacts conductively connected to the plurality of second BLs, and a plurality of second word line bonding contacts conductively connected to the second conductor layers. The 3D memory device also includes a third semiconductor structure between the first and second bonding layers and having a peripheral circuit of the first and second NAND memory strings, the first bit line bonding contacts being conductively connected to the second bit line bonding contacts, and the first word line bonding contacts being conductively connected to the second word line bonding contacts through and to the third semiconductor structure.

In some embodiments, at least one of the first NAND memory strings is conductively connected to at least one of the second NAND memory strings through and to the third semiconductor structure, and at least one of the first conductor layers are is conductively connected to at least one of the second conductor layers through and to the third semiconductor structure.

In some embodiments, the first semiconductor structure includes the first bonding layer under the third semiconductor structure, the first BLs under the first bonding layer, a first memory stack under the first bonding layer, and the plurality of first NAND memory strings extending vertically through the first memory stack. The first memory stack may include interleaved the plurality of first conductor layers and a plurality of first insulating layers. In some embodiments, the second semiconductor structure includes the second bonding layer above the third semiconductor structure, the second BLs above the second bonding layer, the second memory stack above the second bonding layer, and the plurality of second NAND memory strings extending vertically through the second memory stack. The second memory stack may include interleaved the plurality of second conductor layers and a plurality of second insulating layers.

In some embodiments, the first semiconductor structure includes a first interconnect layer having a plurality of first conductive routings between the plurality of first NAND memory strings and the first bonding layer. In some embodiments, the second semiconductor structure includes a second interconnect layer having a plurality of second conductive routings between the plurality of second NAND memory strings and the second bonding layer. The first BLs may be conductively connected to and routed by the first conductive routings to a respective bonding region and the second BLs may be conductively connected to and routed by the second conductive routings to the respective bonding region. The bonding region may be laterally away from the first and second BLs. The first conductor layers may be conductively connected to and routed by the first conductive routings to a respective bonding region and the second conductor layers may be conductively connected to and routed by the second conductive routings to the respective bonding region. The bonding region may be laterally away from the first and second conductor layers.

In some embodiments, the plurality of first BLs and second BLs are vertically arranged in a staggered manner; the first memory stack and the second memory stack are vertically arranged in a staggered manner; each of the first and the second BLs is conductively connected to the respective bit line bonding contact through a respective via structure and the respective conductive routings; and each of the first and second conductor layers is conductively connected to the respective conductor bonding contact through another respective via structure and the respective conductive routings.

In some embodiments, the second semiconductor structure includes a semiconductor layer above and in contact with the second NAND memory strings and a pad-out interconnect layer above the semiconductor layer; the first semiconductor structure includes a substrate under and in contact with the first NAND memory strings; and the third semiconductor structure includes an upper bonding layer includes a plurality of upper bonding contacts conductively connected to the second bit line bonding contacts and the second word line bonding contacts. The third semiconductor structure also includes the lower bonding layer includes a plurality of lower bonding contacts conductively connected to the first bit line bonding contacts and the first word line bonding contacts, a third interconnect layer under the upper bonding layer, a peripheral circuit of at least one of the first and second NAND memory strings, under and in contact with the third interconnect layer, and a second semiconductor layer between and in contact with the peripheral circuit and the lower bonding layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a first semiconductor structure comprising:
      a plurality of first NAND memory strings;
      a plurality of first bit lines (BLs), at least one of the first BLs being conductively connected to a respective one of the first NAND memory strings;
      a plurality of first conductor layers, and
      a first bonding layer comprising a plurality of first bit line bonding contacts conductively connected to the plurality of first BLs and a plurality of first word line bonding contacts conductively connected to the first conductor layers;
   a second semiconductor structure comprising:
      a plurality of second NAND memory strings;
      a plurality of second BLs, at least one of the second BLs being conductively connected to a respective one of the second NAND memory strings;
      a plurality of second conductor layers, and
      a second bonding layer comprising a plurality of second bit line bonding contacts conductively connected to the plurality of second BLs and a plurality of second word line bonding contacts conductively connected to the second conductor layers; and a bonding interface between the first bonding layer and the second bonding layer, wherein at the bonding interface, the first bit line bonding contacts are conductively connected to the second bit line bonding contacts and the first word line bonding contacts are conductively connected to the second word line bonding contacts, wherein the plurality of first bit line bonding contacts and the plurality of second bit line bonding contacts are routed to and bonded at a first bonding region that is laterally away from the first and second BLs; and the plurality of first word line bonding contacts and the plurality of second word line bonding contacts are routed to and bonded at a second bonding region that is laterally away from the first and second conductor layers.

2. The 3D memory device of claim 1, wherein at least one of the first NAND memory strings is conductively connected to at least one of the second NAND memory strings through bonded first and second bit line bonding contacts, and at least one of the first conductor layers are conductively connected to at least one of the second conductor layers through bonded first and second word line bonding contacts.

3. The 3D memory device of claim 2, wherein:
the first semiconductor structure comprises:
the first bonding layer at the bonding interface, and
the first BLs under the first bonding layer; and
the second semiconductor structure comprises:
the second bonding layer at the bonding interface, and
the second BLs above the second bonding layer.

4. The 3D memory device of claim 3, wherein
the first semiconductor structure further comprises:
a first memory stack under the first bonding layer, the first memory stack comprising interleaved the plurality of first conductor layers and a plurality of first insulating layers, and
the plurality of first NAND memory strings extending vertically through the first memory stack; and
the second semiconductor structure further comprises:
a second memory stack above the second bonding layer, the second memory stack comprising interleaved the plurality of second conductor layers and a plurality of second insulating layers, and
the plurality of second NAND memory strings extending vertically through the second memory stack.

5. The 3D memory device of claim 1, wherein:
the first semiconductor structure comprises a first interconnect layer comprising a plurality of first conductive routings between the plurality of first NAND memory strings and the first bonding layer;
the second semiconductor structure comprises a second interconnect layer comprising a plurality of second conductive routings between the plurality of second NAND memory strings and the second bonding layer; and
the first BLs and the first conductor layers are conductively connected to and routed by the first conductive routing to the first bit line bonding contacts and the first word line bonding contacts at respective bonding regions, and the second BLs and the second conductor layers are conductively connected to and routed by the second conductive routing to the second bit line bonding contacts and the second word line bonding contacts at the respective bonding regions.

6. The 3D memory device of claim 1, wherein:
the plurality of first BLs and second BLs are vertically arranged in a staggered manner;
the first memory stack and the second memory stack are vertically arranged in a staggered manner;
each of the first and the second BLs is conductively connected to the respective bit line bonding contact through a respective via structure and the respective conductive routings; and
each of the first and second conductor layers is conductively connected to a respective word line bonding contact through another respective via structure and the respective conductive routings.

7. The 3D memory device of claim 6, further comprising:
a third semiconductor structure above the second semiconductor structure, the third semiconductor structure comprising a peripheral circuit of the first and second memory stacks; and
a second bonding interface between the second semiconductor structure and a third bonding layer of the third semiconductor structure.

8. The 3D memory device of claim 7, wherein:
the second semiconductor structure comprises a semiconductor layer above and in contact with the second NAND memory strings;
the first semiconductor structure comprises a substrate under and in contact with the first NAND memory strings; and
the third semiconductor structure comprises
a third interconnect layer between the third bonding layer and the peripheral circuit,
the peripheral circuit above and in contact with the third interconnect layer,
a second semiconductor layer above and in contact with the peripheral circuit, and
a pad-out interconnect layer above the second semiconductor layer.

9. A three-dimensional (3D) memory device, comprising:
a stack structure comprising a plurality of pairs of bonded semiconductor structures, wherein each of the pairs comprises:
a first semiconductor structure comprising a plurality of first NAND memory strings, a plurality of first bit lines (BLs) conductively connected to respective first NAND memory strings, a plurality of first conductor layers, and a first bonding layer comprising a plurality of first bit line bonding contacts conductively connected to the first BLs and a plurality of first word line bonding contacts conductively connected to the first conductor layers, respectively;
a second semiconductor structure comprising a plurality of second NAND memory strings, a plurality of second BLs conductively connected to respective second NAND memory strings, a plurality of second conductor layers, and a second bonding layer comprising a plurality of second bit line bonding contacts conductively connected to the plurality of second BLs and a plurality of second word line bonding contacts conductively connected to the second conductor layers, respectively; and
a bonding interface between the first bonding layer and the second bonding layer, wherein, at the bonding interface, the first bit line bonding contacts are in contact with the second bit line bonding contacts and the first word line bonding contacts are in contact with the second word line bonding contacts, respectively, and a third semiconductor structure bonded to and conductively connected to the stack structure, wherein the third semiconductor structure comprises a peripheral circuit of at least one pair of bonded semiconductor structures, wherein the plurality of first bit line bonding contacts and the plurality of second bit line bonding contacts are routed to and bonded at a first bonding region that is laterally away from the first and second BLs; and the plurality of first word line bonding contacts and the plurality of second word line bonding contacts are routed to and bonded at a second bonding region that is laterally away from the first and second conductor layers.

10. The 3D memory device of claim 9, wherein
at least one of the first NAND memory strings is conductively connected to at least one of the second NAND memory strings through the bonded first and second bit line bonding contacts; and
at least one of the first conductor layers is conductively connected to at least one of the second conductor layers through the bonded first and second word line bonding contacts.

11. The 3D memory device of claim 10, wherein
the first semiconductor structure comprises:
the first bonding layer at the bonding interface,
the first BLs under the first bonding layer,
a first memory stack under the first bonding layer, the first memory stack comprising interleaved the plurality of first conductor layers and a plurality of first insulating layers, and
the plurality of first NAND memory strings extending vertically through the first memory stack; and
the second semiconductor structure comprises:
the second bonding layer at the bonding interface,
the second BLs above the second bonding layer,
a second memory stack above the second bonding layer, the second memory stack comprising interleaved the plurality of second conductor layers and a plurality of second insulating layers, and
the plurality of second NAND memory strings extending vertically through the second memory stack.

12. The 3D memory device of claim 9, wherein:
the first semiconductor structure comprises a first interconnect layer comprising a plurality of first conductive routings between the plurality of first NAND memory strings and the first bonding layer;
the second semiconductor structure comprises a second interconnect layer comprising a plurality of second conductive routings between the plurality of second NAND memory strings and the second bonding layer; and
the first BLs and the first conductor layers are conductively connected to and routed by the first conductive routing to the first bit line bonding contacts and the first word line bonding contacts at respective bonding regions, and the second BLs and the second conductor layers are conductively connected to and routed by the second conductive routing to the second bit line bonding contacts and the second word line bonding contacts at the respective bonding regions.

13. The 3D memory device of claim 9, wherein
the first BLs and second BLs are vertically arranged in a staggered manner;

the first memory stack and the second memory stack are vertically arranged in a staggered manner;

each of the first and the second BLs is conductively connected to the respective bit line bonding contact through a respective via structure and the respective conductive routings; and each of the first and second conductor layers is conductively connected to the respective word line bonding contact through another respective via structure and the respective conductive routings.

14. A three-dimensional (3D) memory device, comprising:
a first semiconductor structure comprising:
a first memory stack comprising a plurality of first conductor layers;
a plurality of first bit lines (BLs), at least one of the first BLs being conductively connected to the first memory stack; and
a first bonding layer comprising a plurality of first bit line bonding contacts conductively connected to the plurality of first BLs and a plurality of first word line bonding contacts conductively connected to the first conductor layers;
a second semiconductor structure comprising:
a second memory stack comprising a plurality of second conductor layers;
a plurality of second BLs, at least one of the second BLs being conductively connected to the second memory stack; and
a second bonding layer comprising a plurality of second bit line bonding contacts conductively connected to the plurality of second BLs and a plurality of second word line bonding contacts conductively connected to the second conductor layers; and
a bonding interface between the first bonding layer and the second bonding layer, wherein, at the bonding interface, the first bit line bonding contacts are in contact with the second bit line bonding contacts, and the first word line bonding contacts are in contact with the second word line bonding contacts, wherein:
the plurality of first bit line bonding contacts and the plurality of second bit line bonding contacts are routed to and bonded at a first bonding region that is laterally away from the first and second BLs; and
the plurality of first word line bonding contacts and the plurality of second word line bonding contacts are routed to and bonded at a second bonding region that is laterally away from the first and second conductor layers.

15. The 3D memory device of claim 14, wherein
the first memory stack comprises at least one first NAND memory string and the second memory stack comprises at least one second NAND memory string, the at least one first NAND memory string being conductively connected to the at least one of the second NAND memory string through bonded first and second bit line bonding contacts; and
at least one of the first conductor layers is conductively connected to at least one of the second conductor layers through bonded first and second word line bonding contacts.

16. The 3D memory device of claim 15, wherein:
the first semiconductor structure comprises:
the first bonding layer at the bonding interface, and
the first BLs under the first bonding layer; and the second semiconductor structure comprises:
: the second bonding layer at the bonding interface, and
the second BLs above the second bonding layer.

17. The 3D memory device of claim 14, wherein:
the plurality of first BLs and second BLs are vertically arranged in a staggered manner in a vertical direction.

18. The 3D memory device of claim 14, wherein:
the first memory stack and the second memory stack are vertically arranged in a staggered manner.

19. The 3D memory device of claim 14, wherein:
each of the first and the second BLs is conductively connected to the respective bit line bonding contact through a respective via structure and the respective conductive routings; and
each of the first and second conductor layers is conductively connected to a respective word line bonding contact through another respective via structure and the respective conductive routings.

20. The 3D memory device of claim 14, further comprising:
a third semiconductor structure above the second semiconductor structure, the third semiconductor structure comprising a peripheral circuit of the first and second memory stacks; and
a second bonding interface between the second semiconductor structure and a third bonding layer of the third semiconductor structure.

\* \* \* \* \*